(12) United States Patent
Kumagai

(10) Patent No.: US 6,496,957 B1
(45) Date of Patent: Dec. 17, 2002

(54) DESIGN EVALUATING METHOD AND APPARATUS FOR ASSISTING CIRCUIT-BOARD ASSEMBLY

(75) Inventor: Koichi Kumagai, Ikoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/265,565

(22) Filed: Mar. 10, 1999

(30) Foreign Application Priority Data

Mar. 10, 1998 (JP) .......................................... 10-057614

(51) Int. Cl.$^7$ .............................................. G06F 17/50
(52) U.S. Cl. .................................. 716/4; 716/1; 716/15
(58) Field of Search .................................. 716/4, 15, 1

(56) References Cited

U.S. PATENT DOCUMENTS

| | | | |
|---|---|---|---|
| 5,493,507 A | * | 2/1996 | Shinde et al. .................. 703/14 |
| 5,539,652 A | * | 7/1996 | Tegethoff ...................... 703/14 |
| 5,691,913 A | * | 11/1997 | Tsuchida et al. ............... 716/8 |
| 5,745,371 A | * | 4/1998 | Shouen ......................... 716/15 |
| 5,781,447 A | * | 7/1998 | Gerdes ......................... 716/15 |
| 6,161,214 A | * | 12/2000 | Ishihara et al. ................ 716/8 |
| 6,260,178 B1 | * | 7/2001 | Schaffer ........................ 716/2 |
| 6,353,915 B1 | * | 3/2002 | Deal et al. ..................... 716/4 |

FOREIGN PATENT DOCUMENTS

| | | | |
|---|---|---|---|
| EP | 0 942 382 A2 | * 9/1999 | ........... G06F/17/50 |
| JP | 63-177598 | 7/1988 | |
| JP | 04192400 A | 7/1992 | |
| JP | 04359497 A | 12/1992 | |

* cited by examiner

*Primary Examiner*—Vuthe Siek
*Assistant Examiner*—A. M. Thompson
(74) *Attorney, Agent, or Firm*—Wenderoth, Lind & Ponack, L.L.P.

(57) ABSTRACT

The invention provides a design evaluating method for assisting circuit-board-assembly, as well as an evaluation apparatus, for realizing high-quality, low-cost assembly by numerically evaluating any difference between targeted circuit design and actually performed circuit design, and further provides a recording medium having recorded thereon programs for executing the design evaluating method for assisting circuit-board-assembly. Concretely, an evaluation executing unit is provided and, after reading design evaluation programs from recording media on which the design evaluating programs have been recorded and prior to engineering-trial manufacture of a component-mounted-circuit board mounted components on the circuit board, at least one of a first design evaluation and a second design evaluation is executed. Accordingly, it is enabled to evaluate the appropriateness of a present circuit design before the engineering-trial manufacture, and thus high-quality, low-cost assembly can be realized.

52 Claims, 86 Drawing Sheets

Fig.12

| | | |
|---|---|---|
| PCB ASSEMBLY COST | BOARD SIZE X (mm) | |
| | Y (mm) | |
| | t (mm) | |
| | NUMBER OF HOLES ɸ0.5 (mm) | |
| | NUMBER OF HOLES ɸ0.7 (mm) | |
| | PRESENCE/ABSENCE AND NUMBER OF GOLD-PLATED TERMINALS (PCS) | |
| | SHEET SIZE X (mm) | |
| | Y (mm) | |
| | NUMBER OF V-CUTS (PCS/SHEET) | |
| | OVERALL LENGTH OF SLIT (PCS/SHEET) | |
| | CONDUCTOR MIN. WIDTH (mm) | |
| | PRESENCE/ABSENCE AND NUMBER OF SILK SURFACES | |
| | NUMBER OF WIRING LAYERS | |
| | NUMBER OF SOLDER-BONDING SURFACES | |
| | BOARD PERIPHERY MACHINING METHOD | |
| | SOLDER LEVELER | |
| | BOARD ADDITION MACHINING WORK IN MOUNTING PROCESS (CHOICE OF PRESENCE OR ABSENCE) | |
| | PRODUCTION QUANTITY (BOARDS/MONTH) | |
| | RAW BOARD MFR.'S EXPENDITURE RATIO (+ %) | |
| CIRCUIT EVOLVEMENT | PRESENT NUMBER OF COMPONENTS (PCS) | ENTRY UNNECESSARY |
| | CONVENTIONAL NUMBER OF COMPONENTS (PCS) | |
| | NUMBER OF UNNECESSARY CAPACITORS DELETED AFTER DESIGN (PCS) | |
| | NUMBER OF UNNECESSARY CAPACITORS TARGETED FOR DELETION (PCS) | |
| | POWER CONSUMPTION AFTER DESIGN (W) | |
| | CONVENTIONAL POWER CONSUMPTION (W) | |
| | NAME OF COMMON CIRCUIT USED | |
| ASSEMBLY EASINESS | NUMBER OF COMPONENT-MOUNTING SURFACES | |
| | CONVENTIONAL NUMBER OF COMPONENT TYPES (TYPES) | |
| | PRESENT NUMBER OF COMPONENT TYPES (TYPES) | |
| ASSEMBLY EQUIPMENT AND TECHNIQUE | ASSEMBLY BOARD STRUCTURE | ENTRY UNNECESSARY |
| WIRING BOARD DESIGN CRITERIA | CHECK FOR A TO D RANKS | |
| ASSEMBLY KNOW-HOW | CHECK FOR A TO D RANKS | |

Fig.14

| NO | EVALUATION ITEM | EVALUATION METHOD | GRADED RANK | | SCORE | |
|---|---|---|---|---|---|---|
| | | | | INDIVIDUAL EVALUATION OF MAJOR ITEMS | FIRST DESIGN EVALUATION AND SECOND DESIGN EVALUATION | COMPREHENSIVE EVALUATION OF ALL MAJOR ITEMS |
| 1 | NUMBER OF ELECTRONIC COMPONENTS (IN FUNCTIONS) | $\left(\dfrac{\text{TOTAL NUMBER OF ELECTRONIC COMPONENTS AFTER DESIGN}}{\text{CONVENTIONAL TOTAL NUMBER OF ELECTRONIC COMPONENTS}}\right) \times 100\ (\%)$ | I: NOT MORE THAN 85% | 30 | 6 | 3 |
| | | | II: MORE THAN 85%, AND NOT MORE THAN 95% | 20 | 4 | 2 |
| | | | III: MORE THAN 95%, AND NOT MORE THAN 105% | 10 | 2 | 1 |
| | | | IV: MORE THAN 105% | 0 | 0 | 0 |
| 2 | NUMBER OF CAPACITORS | $\left(\dfrac{\text{NUMBER OF UNNECESSARY CAPACITORS DELETED AFTER DESIGN}}{\text{NUMBER OF UNNECESSARY CAPACITORS TARGETED FOR DELETION}}\right) \times 100\ (\%)$ | I: NOT LESS THAN 90% | 20 | 4 | 2 |
| | | | II: NOT LESS THAN 70%, AND LESS THAN 90% | 10 | 2 | 1 |
| | | | III: NOT LESS THAN 50%, AND LESS THAN 70% | 5 | 1 | 0.5 |
| | | | IV: LESS THAN 50% | 0 | 0 | 0 |
| 3 | POWER CONSUMPTION (IN SYSTEM BLOCKS) | $\left(\dfrac{\text{POWER CONSUMPTION CALCULATED VALUE AFTER DESIGN}}{\text{CONVENTIONAL POWER CONSUMPTION ACTUAL VALUE}}\right) \times 100\ (\%)$ | I: NOT MORE THAN 85% | 20 | 4 | 2 |
| | | | II: MORE THAN 85%, AND NOT MORE THAN 95% | 10 | 2 | 1 |
| | | | III: MORE THAN 95%, AND NOT MORE THAN 105% | 5 | 1 | 0.5 |
| | | | IV: MORE THAN 105% | 0 | 0 | 0 |
| 4 | COMMONIZATION/ SHARING OF CIRCUIT BLOCK | $\left(\dfrac{\text{NUMBER OF COMPONENTS IN COMMONIZED/SHARED SECTION}}{\text{TOTAL NUMBER OF COMPONENTS}}\right) \times 100\ (\%)$ | I: NOT LESS THAN 50% | 30 | 6 | 3 |
| | | | II: NOT LESS THAN 30%, AND LESS THAN 50% | 20 | 4 | 2 |
| | | | III: NOT LESS THAN 10%, AND LESS THAN 30% | 10 | 2 | 1 |
| | | | IV: LESS THAN 10% | 0 | 0 | 0 |
| | TOTAL | | I IN ALL RANKS: FULL SCORE IN ALL ITEMS | 100 | 20 | 10 |

Fig.15

| NO | EVALUATION ITEM | EVALUATION RESULT | GRADED RANK | SCORE |
|---|---|---|---|---|
| 1 | NUMBER OF COMPONENTS | $\dfrac{\text{TOTAL NUMBER OF COMPONENTS AFTER DESIGN}}{\text{CONVENTIONAL NUMBER OF COMPONENTS}} \times 100 = \dfrac{491\text{PCS}}{609\text{PCS}} \times 100 = 80.6\ (\%)$ | I | 30/30 |
| 2 | NUMBER OF CAPACITORS | $\dfrac{\text{NUMBER OF UNNECESSARY CAPACITORS DELETED AFTER DESIGN}}{\text{NUMBER OF UNNECESSARY CAPACITORS TARGETED FOR DELETION}} \times 100 = \dfrac{15\text{PCS}}{20\text{PCS}} \times 100 = 75\ (\%)$ | II | 10/20 |
| 3 | POWER CONSUMPTION | $\dfrac{\text{POWER CONSUMPTION CALCULATED VALUE AFTER DESIGN}}{\text{CONVENTIONAL POWER CONSUMPTION ACTUAL VALUE}} \times 100 = \dfrac{25\text{W}}{23\text{W}} \times 100 = 108.7\ (\%)$ | IV | 0/20 |
| 4 | COMMONIZATION /SHARING OF CIRCUIT BLOCK | $\dfrac{\text{NUMBER OF COMPONENTS IN COMMONIZED/SHARED SECTION}}{\text{TOTAL NUMBER OF COMPONENTS}} \times 100 = \dfrac{103\text{PCS}}{491\text{PCS}} \times 100 = 21.0\ (\%)$ | III | 10/30 |
| | TOTAL SCORE / FULL SCORE | | | 50/100 |

Fig. 18

| NO | EVALUATION ITEM | EVALUATION METHOD | GRADED RANK | SCORE | | |
|---|---|---|---|---|---|---|
| | | | | INDIVIDUAL EVALUATION OF MAJOR ITEMS | FIRST DESIGN EVALUATION AND SECOND DESIGN EVALUATION | COMPREHENSIVE EVALUATION OF ALL MAJOR ITEMS |
| 1 | RATE OF COMPLIANCE WITH CRITERIA CORPUS PART I | NUMBER OF ITEMS FALLING UPON RANKS C, D WITHOUT COMPLIANCE WITH DESIGN CRITERIA | I: 0 ITEMS | 20 | | |
| | | | II: MORE THAN 0 ITEMS, AND NOT MORE THAN 3 ITEMS | DECREASE IN STEPS OF 2 POINTS FOR EACH 1 ITEM, STARTING WITH 20 POINTS | DECREASE IN STEPS OF 1 POINT FOR EACH 1 ITEM, STARTING WITH 10 POINTS | DECREASE IN STEPS OF 0.5 POINT FOR EACH 1 ITEM, STARTING WITH 5 POINTS |
| | | | III: MORE THAN 3 ITEMS, AND NOT MORE THAN 6 ITEMS | DECREASE IN STEPS OF 3 POINTS FOR EACH 1 ITEM, STARTING WITH 14 POINTS | | |
| | | | IV: MORE THAN 6 ITEM | 0 CONSTANT | 0 CONSTANT | 0 CONSTANT |
| | TOTAL | | FULL SCORE | 20 | 10 | 5 |

Fig. 19

| EVALUATION ITEM | EVALUATION RESULT | | GRADED RANK | |
|---|---|---|---|---|
| | EVALUATION RANK | NUMBER OF ITEMS | | |
| RATE OF COMPLIANCE WITH CRITERIA CORPUS PART I | A | 2 | I | 19/20 |
| | B | 6 | | |
| | C | 1 | | |
| | D | 0 | | |
| | TOTAL | 9 | | |
| | TOTAL NUMBER OF ITEMS RESULTING IN RANKS C, D: 1 | | | |
| RATE OF COMPLIANCE WITH CRITERIA CORPUS PART II | A | 15 | III | 52/80 |
| | B | 25 | | |
| | C | 10 | | |
| | D | 6 | | |
| | TOTAL | 56 | | |
| | TOTAL NUMBER OF ITEMS RESULTING IN RANKS C, D: 16 | | | |
| TOTAL | A | 17 | | 71/100 |
| | B | 31 | | |
| | C | 11 | | |
| | D | 6 | | |
| | TOTAL | 65 | | |

Fig.21

| NO | EVALUATION ITEM | EVALUATION METHOD | GRADED RANK | SCORE | | |
|---|---|---|---|---|---|---|
| | | | | INDIVIDUAL EVALUATION OF MAJOR ITEMS | FIRST DESIGN EVALUATION AND SECOND DESIGN EVALUATION | COMPREHENSIVE EVALUATION OF ALL MAJOR ITEMS |
| 1 | KNOW-HOW COMPLIANCE RATE PART I | NUMBER OF ITEMS FALLING UPON RANKS C, D WITHOUT COMPLIANCE WITH ASSEMBLY KNOW-HOW | I: 0 ITEMS | 50 | DECREASE IN STEPS OF 4 POINTS FOR EACH 1 ITEM, STARTING WITH 20 POINTS | DECREASE IN STEPS OF 2 POINTS FOR EACH 1 ITEM, STARTING WITH 10 POINTS |
| | | | II: MORE THAN 0 ITEMS, AND NOT MORE THAN 3 ITEMS | DECREASE IN STEPS OF 4 POINTS FOR EACH 1 ITEM, STARTING WITH 50 POINTS | | |
| | | | III: MORE THAN 3 ITEMS, AND NOT MORE THAN 6 ITEMS | DECREASE IN STEPS OF 7 POINTS FOR EACH 1 ITEM, STARTING WITH 38 POINTS | | |
| | | | IV: MORE THAN 6 ITEM | 0 CONSTANT | 0 CONSTANT | 0 CONSTANT |
| | TOTAL | | FULL SCORE | 50 | 20 | 10 |

Fig.22

| EVALUATION ITEM | EVALUATION RESULT | | GRADED RANK | |
|---|---|---|---|---|
| | EVALUATION RANK | NUMBER OF ITEMS | | |
| KNOW-HOW COMPLIANCE RATE PART I | A | 1 | II | 38/50 |
| | B | 10 | | |
| | C | 2 | | |
| | D | 1 | | |
| | TOTAL | 14 | | |
| | TOTAL NUMBER OF ITEMS RESULTING IN RANKS C, D: 3 | | | |
| KNOW-HOW COMPLIANCE RATE PART II | A | 2 | II | 42/50 |
| | B | 7 | | |
| | C | 1 | | |
| | D | 1 | | |
| | TOTAL | 11 | | |
| | TOTAL NUMBER OF ITEMS RESULTING IN RANKS C, D: 2 | | | |
| TOTAL | A | 3 | | 80/100 |
| | B | 17 | | |
| | C | 3 | | |
| | D | 2 | | |
| | TOTAL | 25 | | |

Fig.24

| NO | EVALUATION ITEM | EVALUATION METHOD | GRADED RANK | INDIVIDUAL EVALUATION OF MAJOR ITEMS | SCORE FIRST DESIGN EVALUATION AND SECOND DESIGN EVALUATION | COMPRE-HENSIVE EVALUATION OF ALL MAJOR ITEMS |
|---|---|---|---|---|---|---|
| 1 | NUMBER OF ELECTRONIC COMPONENT MOUNTING SURFACES | ONE-SIDE MOUNTING OR DOUBLE-SIDE MOUNTING | I : ONE-SIDE MOUNTING | 5 | 1 | 0.5 |
| | | | II : DOUBLE-SIDE MOUNTING | 3 | 0.5 | 0.25 |
| 2 | NUMBER OF SOLDER-BONDING SURFACES | ONE-SIDE SOLDERING OR DOUBLE-SIDE SOLDERING | I : ONE-SIDE SOLDERING | 5 | 1 | 0.5 |
| | | | II : DOUBLE-SIDE SOLDERING | 3 | 0.5 | 0.25 |
| 3 | TYPE OF SOLDERING TECHNIQUE | (1) DIP SOLDERING OF DISCRETE COMPONENTS<br>(2) DIP SOLDERING OF SURFACE-MOUNTED COMPONENTS<br>(3) REFLOW SOLDERING OF SURFACE-MOUNTED COMPONENTS<br>(4) HAND-SOLDERING OF HAND-INSERTED COMPONENTS | I : (1) OR (3) | 20 | 4 | 2 |
| | | | II : (1)+(2)+(3), (1)+(3)<br>(1)+(4), (3)+(4) | 10 | 2 | 1 |
| | | | III : (1)+(2)+(3)<br>(1)+(2)+(4)<br>(1)+(3)+(4) | 5 | 1 | 0.5 |
| | | | IV : (1)+(2)+(3)+(4) | 0 | 0 | 0 |
| 4 | NUMBER OF ELECTRONIC COMPONENT TYPES | $\left(\dfrac{\text{NUMBER OF COMPONENTS IN TYPES AFTER DESIGN}}{\text{CONVENTIONAL NUMBER OF COMPONENT TYPES}}\right) \times 100 \,(\%)$ | I : NOT MORE THAN 85% | 15 | 3 | 1.5 |
| | | | II : MORE THAN 85%, AND NOT MORE THAN 95% | 8 | 2 | 1 |
| | | | III : MORE THAN 95%, AND NOT MORE THAN 105% | 4 | 1 | 0.5 |
| | | | IV : MORE THAN 105% | 0 | 0 | 0 |

Fig.25

| NO | EVALUATION ITEM | EVALUATION METHOD | GRADED RANK | SCORE INDIVIDUAL EVALUATION OF MAJOR ITEMS | SCORE FIRST DESIGN EVALUATION AND SECOND DESIGN EVALUATION | SCORE COMPRE-HENSIVE EVALUATION OF ALL MAJOR ITEMS |
|---|---|---|---|---|---|---|
| 5 | STYLE OF PACKING OF ELECTRONIC COMPONENTS | (1) TAPING TYPE<br>(2) TRAY TYPE<br>(3) STICK TYPE<br>(4) BULK CASSETTE TYPE<br>(5) LOOSE TYPE | I:(1) ONLY | 20 | 4 | 2 |
|  |  |  | II:(1)+[ONE TYPE OF (2)-(5)] | 10 | 2 | 1 |
|  |  |  | III:(1)+[TWO TYPES OF (2)-(5)] | 5 | 1 | 0.5 |
|  |  |  | IV:(1)+[THREE OR MORE TYPE OF (2)-(5)] | 0 | 0 | 0 |
| 6 | SIMILARITY IN OUTSIDE DIMENSIONS OF ELECTRONIC COMPONENTS | $\left(\dfrac{\text{NUMBER OF MEAN-SIZE COMPONENTS}}{\text{TOTAL NUMBER OF COMPONENTS}}\right) \times 100\,(\%)$<br>WHERE MEAN-SIZE COMPONENTS ARE THOSE SATISFYING THAT $H \leq 3/2\,H_{ave}$, AND THAT $1/2(A+B) \leq 3/4(A+B)_{ave}$, WHERE $H_{ave}=\Sigma[H/n]$ AND $1/2(A+B)_{ave}=\Sigma(A+B)/2n$ | I:NOT LESS THAN 50% | 15 | 3 | 1.5 |
|  |  |  | II:LESS THAN 50%, AND NOT LESS THAN 40% | 8 | 2 | 1 |
|  |  |  | III:LESS THAN 40%, AND NOT LESS THAN 20% | 4 | 1 | 0.5 |
|  |  |  | IV:LESS THAN 20% | 0 | 0 | 0 |
| 7 | TECHNIQUE FOR ELECTRONIC COMPONENT MOUNTING (RATE OF USE OF AUTO-MOUNTED COMPONENTS) | $\left(\dfrac{\text{NUMBER OF AUTO-MOUNTED COMPONENTS}}{\text{(TOTAL NUMBER OF COMPONENTS)}}\right) \times 100\,(\%)$ | I:NOT LESS THAN 90% | 20 | 4 | 2 |
|  |  |  | II:LESS THAN 90%, AND NOT LESS THAN 80% | 10 | 2 | 1 |
|  |  |  | III:LESS THAN 80%, AND NOT LESS THAN 60% | 5 | 1 | 0.5 |
|  |  |  | IV:LESS THAN 60% | 0 | 0 | 0 |
|  | TOTAL |  | I IN ALL RANKS: FULL SCORE IN ALL ITEMS | 100 | 20 | 10 |

Fig.26

| NO | EVALUATION ITEM | EVALUATION RESULT | GRADED RANK | SCORE |
|---|---|---|---|---|
| 1 | NUMBER OF ELECTRONIC-COMPONENT MOUNTING SURFACES | DOUBLE-SIDE MOUNTING | II | 3/5 |
| 2 | NUMBER OF SOLDER-BONDING SURFACES | DOUBLE-SIDE SOLDERING | II | 3/5 |
| 3 | TYPE OF SOLDERING TECHNIQUE | (1) DIP SOLDERING OF DISCRETE COMPONENTS<br>(2) DIP SOLDERING OF SURFACE-MOUNTED COMPONENTS<br>(3) REFLOW SOLDERING OF SURFACE-MOUNTED COMPONENTS | III | 5/20 |
| 4 | NUMBER OF ELECTRONIC-COMPONENT TYPES | NUMBER OF COMPONENT TYPES AFTER DESIGN / CONVENTIONAL NUMBER OF COMPONENT TYPES × 100 = 68TYPES/81TYPES × 100 = 84.0 (%) | I | 15/15 |
| 5 | STYLE OF PACKING OF ELECTRONIC COMPONENTS | (1) TAPING<br>(2) TRAY | II | 19/20 |
| 6 | SIMILARITY IN OUTSIDE DIMENSIONS OF ELECTRONIC COMPONENTS | NUMBER OF MEAN-SIZE COMPONENTS / TOTAL NUMBER OF COMPONENTS × 100 = 299PCS/581PCS × 100 = 51.5 (%) | I | 15/15 |
| 7 | TECHNIQUE FOR ELECTRONIC COMPONENT MOUNTING (RATE OF USE OF AUTO-MOUNTED COMPONENTS) | NUMBER OF AUTO-MOUNTED COMPONENTS / TOTAL NUMBER OF COMPONENTS × 100 = 473PCS/581PCS × 100 = 81.4 (%) | II | 19/20 |
|  | TOTAL SCORE / FULL SCORE |  |  | 61/100 |

Fig.28

| NO | EVALUATION ITEM | EVALUATION METHOD | GRADED RANK | SCORE | | |
|---|---|---|---|---|---|---|
| | | | | INDIVIDUAL EVALUATION OF MAJOR ITEMS | FIRST DESIGN EVALUATION AND SECOND DESIGN EVALUATION | COMPRE-HENSIVE EVALUATION OF ALL MAJOR ITEMS |
| 1 | GOODNESS OF FIT TO STANDARD BOARD STRUCTURE | RANKING ACCORDING TO SEPARATE TABLE, "STANDARD BOARD STRUCTURE AND GRADED RANKS" | RANK I | 40 | 10 | 5 |
| | | | RANK II | 20 | 6 | 3 |
| | | | RANK III | 10 | 2 | 1 |
| | | | RANK IV | 0 | 0 | 0 |
| 2 | GOODNESSES OF FIT TO STANDARD PROCESS | EVALUATE GOODNESS OF FIT OF FLOW, PROCESS AND EQUIPMENT IN SEPARATE TABLE, "STANDARD LINE EQUIPMENT AND PROCESS" | I : CONFORMANCE IN FLOW, AND EQUAL OR SMALLER NUMBER OF PROCESSES | 60 | 20 | 10 |
| | | | II : CONFORMANCE IN FLOW, BUT LARGER NUMBER OF PROCESSES | 40 | 10 | 5 |
| | | | III : CONFORMANCE IN FLOW, BUT WITH CHANGE IN FLOW ON THE WAY OF LINE | 20 | 4 | 2 |
| | | | IV : NONCONFORMANCE IN FLOW | 0 | 0 | 0 |
| | TOTAL | | I IN ALL RANKS : FULL SCORE IN ALL ITEMS | 100 | 30 | 15 |

Fig.31

| HAND-ENTERED INFORMATION ON PCB ASSEMBLY COST | | AUTOMATIC ENTRY FROM COMPONENT DATABASE | | TYPE OF MOUNTING STRUCTURE |
|---|---|---|---|---|
| SOLDER-BONDING SURFACE | MOUNTING SURFACE | PRESENCE OF LEAD-EQUIPPED (DISCRETE) COMPONENTS | PRESENCE OF CHIP (SMT) COMPONENTS | |
| ONE SIDE | ONE SIDE | NO | YES | F |
| | | YES | NO | A |
| | | YES | YES | B |
| | DOUBLE SIDE | YES | YES | C |
| DOUBLE SIDE | ONE SIDE | YES | YES | D |
| | DOUBLE SIDE | NO | YES | E |

Fig.32

| COMBINATION | COMBINATION | | | | | | | | | |
|---|---|---|---|---|---|---|---|---|---|---|
| SOLDER-BONDING SURFACE | ONE | ONE | ONE | ONE | ONE | DOUBLE | DOUBLE | DOUBLE | DOUBLE | DOUBLE |
| MOUNTING SURFACE | ONE | ONE | ONE | DOUBLE | DOUBLE | ONE | ONE | ONE | DOUBLE | DOUBLE |
| PRESENCE OF LEAD-EQUIPPED COMPONENTS | NO | YES | NO | NO | YES | NO | NO | YES | NO | YES |
| PRESENCE OF SMT COMPONENTS | NO | YES | YES | YES | NO | NO | YES | NO | NO | NO |

Fig.33

| NO. | EVALUATION ITEM | MOUNTING INFORMATION BASED ON DESIGN INFORMATION | STANDARD | EVALUATION RESULT | GRADED RANK | GRADED SCORE /FULL SCORE |
|---|---|---|---|---|---|---|
| 1 | GOODNESSES OF FIT TO STANDARD BOARD STRUCTURE | ■CIRCUIT TYPE: POWER SYSTEM<br>■MANUFACTURING LOT SIZE: 100 BOARDS/MONTH<br>■BOARD TYPE: DOUBLE-SIDE WIRING<br>■TOTAL NUMBER OF COMPONENTS: 253 PCS<br><br>MOUNTING METHOD/ITEM \| COMPONENT \| COUNT<br>AUTO INSERTION \| AXIAL \| 110<br>AUTO INSERTION \| RADIAL \| 50<br>AUTO INSERTION \| OTHERS \| 5<br>AUTO MOUNTING \| CHIP \| 53<br>AUTO MOUNTING \| IC \| 4<br>HAND INSERTION \| AUTO-SOLDERING \| 0<br>HAND INSERTION \| HAND-SOLDERING \| 21<br>HAND MOUNTING \| AUTO-SOLDERING \| 0<br>HAND MOUNTING \| HAND-SOLDERING \| 10<br>TOTAL \| \| 253 | PICTURE | PICTURE | I | 40/40 |
| 2 | GOODNESS OF FIT TO STANDARD PROCESS | | ■FLOW (LINE FORMATION) B-1 → C<br>■NUMBER OF PROCESSES: 12 | ■FLOW CONFORMING TO STANDARD<br>■NUMBER OF PROCESSES CONFORMING TO STANDARD<br>■NO PROBLEM OUTSTANDING EASYNESS OF MANUFACTURE | I | 60/60 |
| | TOTAL SCORE / FULL SCORE | | | | | 100/100 |

Fig.34

| STEP | MAJOR ITEM OF EVALUATION | EVALUATION METHOD | SCORE IN MAJOR ITEMS (FULL SCORE) | | |
|---|---|---|---|---|---|
| | | | INDIVIDUAL EVALUATION OF MAJOR ITEMS | FIRST DESIGN EVALUATION AND SECOND DESIGN EVALUATION | COMPREHENSIVE EVALUATION OF ALL MAJOR ITEMS |
| STEP 1 | (1) CIRCUIT PROGRESSION (ESSENTIAL ITEM) | | 100 | 20 | 10 |
| | (2) ASSEMBLY EASINESS (IDEAL CONDITION) | | 100 | 20 | 10 |
| | (3) ASSEMBLY TECHNIQUE AND EQUIPMENT (RESTRICTIVE CONDITION) | | 100 | 30 | 15 |
| | (4) WIRING BOARD DESIGN CRITERIA (IMPORTANT ITEM, PART I) | | 20 | 10 | 5 |
| | (5) ASSEMBLY KNOW-HOW (NECESSARY-TO-CONTROL ITEM, PART I) | | 50 | 20 | 10 |
| | (6) WIRING BOARD DESIGN CRITERIA (IMPORTANT ITEM, PART II) | | 80 | 50 | 25 |
| STEP 2 | (7) ASSEMBLY KNOW-HOW (NECESSARY-TO-CONTROL ITEM, PART II) | | 50 | 30 | 15 |
| | (8) BOARD AND PATTERN DESIGN (FUNDAMENTAL ITEM) | | 100 | 20 | 10 |
| | TOTAL SCORE OF ALL MAJOR ITEMS | | 600 | 200 | 100 |

Fig.35

| NO | EVALUATION ITEM | EVALUATION METHOD | GRADED RANK | SCORE | | |
|---|---|---|---|---|---|---|
| | | | | INDIVIDUAL EVALUATION OF MAJOR ITEMS | FIRST DESIGN EVALUATION AND SECOND DESIGN EVALUATION | COMPREHENSIVE EVALUATION OF ALL MAJOR ITEMS |
| 1 | RATE OF COMPLIANCE WITH CRITERIA CORPUS PART II | NUMBER OF ITEMS FALLING UPON RANKS C, D WITHOUT COMPLIANCE WITH DESIGN CRITERIA | I: NOT MORE THAN 5 ITEMS | DECREASE IN STEPS OF 1 POINT FOR EACH 1 ITEM, STARTING WITH 80 POINTS | DECREASE IN STEPS OF 1 POINT FOR EACH 1 ITEM, STARTING WITH 50 POINTS | DECREASE IN STEPS OF 0.5 POINT FOR EACH 1 ITEM, STARTING WITH 25 POINTS |
| | | | II: MORE THAN 5 ITEMS, AND NOT MORE THAN 15 ITEMS | DECREASE IN STEPS OF 2 POINTS FOR EACH 1 ITEM, STARTING WITH 75 POINTS | | |
| | | | III: MORE THAN 15 ITEMS, AND NOT MORE THAN 30 ITEMS | DECREASE IN STEPS OF 3 POINTS FOR EACH 1 ITEM, STARTING WITH 55 POINTS | | |
| | | | IV: MORE THAN 30 ITEM | 0 CONSTANT | 0 CONSTANT | 0 CONSTANT |
| | TOTAL | | FULL SCORE | 80 | 50 | 25 |

Fig.36

| NO | EVALUATION ITEM | EVALUATION METHOD | GRADED RANK | SCORE | | |
|---|---|---|---|---|---|---|
| | | | | INDIVIDUAL EVALUATION OF MAJOR ITEMS | FIRST DESIGN EVALUATION AND SECOND DESIGN EVALUATION | COMPREHENSIVE EVALUATION OF ALL MAJOR ITEMS |
| 1 | KNOW-HOW COMPLIANCE RATE PART II | NUMBER OF ITEMS FALLING UPON RANKS C, D WITHOUT COMPLIANCE WITH ASSEMBLY KNOW-HOW | I : 0 ITEMS | 50 | | |
| | | | II : MORE THAN 0 ITEMS, AND NOT MORE THAN 3 ITEMS | DECREASE IN STEPS OF 4 POINTS FOR EACH 1 ITEM, STARTING WITH 50 POINTS | DECREASE IN STEPS OF 4 POINTS FOR EACH 1 ITEM, STARTING WITH 30 POINTS | DECREASE IN STEPS OF 2 POINTS FOR EACH 1 ITEM, STARTING WITH 15 POINTS |
| | | | III : MORE THAN 3 ITEMS, AND NOT MORE THAN 6 ITEMS | DECREASE IN STEPS OF 7 POINTS FOR EACH 1 ITEM, STARTING WITH 38 POINTS | | |
| | | | IV : MORE THAN 6 ITEM | 0 CONSTANT | 0 CONSTANT | 0 CONSTANT |
| | TOTAL | | FULL SCORE | 50 | 30 | 15 |

Fig. 37

| NO | EVALUATION ITEM | EVALUATION METHOD | GRADED RANK | SCORE | | |
|----|----|----|----|----|----|----|
| | | | | INDIVIDUAL EVALUATION OF MAJOR ITEMS | FIRST DESIGN EVALUATION AND SECOND DESIGN EVALUATION | COMPREHENSIVE EVALUATION OF ALL MAJOR ITEMS |
| 1 | TOTAL WIRING LENGTH | $L = \frac{\text{(TOTAL WIRING LENGTH)}}{\text{(NUMBER OF COMPONENTS)}}$ LOGIC SYSTEM: $\frac{\text{(TOTAL WIRING LENGTH)}}{\text{(NUMBER OF COMPONENTS)}}$ OF IS-8=K POWER SYSTEM: $\frac{\text{(TOTAL WIRING LENGTH)}}{\text{(NUMBER OF COMPONENTS)}}$ OF HCB2=K | I: L≦0.7K | 20 | 4 | 2 |
| | | | II: 0.7K<L≦1.0K | 10 | 2 | 1 |
| | | | III: 1.0K<L≦1.3K | 5 | 1 | 0.5 |
| | | | IV: 1.3K<L | 0 | 0 | 0 |
| 2 | NUMBER OF WIRING LAYERS | EVALUATE WITH SCORE VALUE OF SEPARATE TABLE, "NUMBER OF LAYERS VS. MOUNTING DENSITY" | RANK I: SEPARATE TABLE | 10 | 2 | 1 |
| | | | RANK II: SEPARATE TABLE | 5 | 1 | 0.5 |
| | | | RANK III: SEPARATE TABLE | 2 | 0.5 | 0.25 |
| | | | RANK IV: SEPARATE TABLE | 0 | 0 | 0 |
| 3 | NUMBER OF THROUGH HOLES AND VIA HOLES (EXCLUDING ONE-SIDE WIRING BOARDS) | EVALUATE NUMBER H OF HOLES OF TARGET BOARD WITH ASSUMPTION THAT "NUMBER OF VIA HOLES AND THROUGH HOLES PER UNIT AREA" IN SEPARATE TABLE IS K | I: H≦0.7K | 20 | 4 | 2 |
| | | | II: 0.7K<H≦1.0K | 10 | 2 | 1 |
| | | | III: 1.0K<H≦1.3K | 5 | 1 | 0.5 |
| | | | IV: 1.3K<H | 0 | 0 | 0 |
| 4 | NUMBER OF PATTERN BRANCHES AND BRANCH LENGTH | UNDER THE CONDITIONS OF 3 POINTS FOR EACH 1 BRANCH AND 1 POINT FOR EACH BRANCH LENGTH 5mm, EVALUATE WITH THEIR TOTAL POINTS (EVALUATION IS OMITTED IN CASE OF MANUFACTURING PROBLEMS IN TERMS OF CIRCUIT CHARACTERISTICS; APPLIED TO SIGNAL LINES ONLY) | I: NOT MORE THAN 5 POINTS | 10 | 2 | 1 |
| | | | II: MORE THAN 5 POINTS, AND NOT MORE THAN 10 POINTS | 5 | 1 | 0.5 |
| | | | III: MORE THAN 10 POINTS, AND NOT MORE THAN 20 POINTS | 2 | 0.5 | 0.25 |
| | | | IV: MORE THAN 20 POINTS | 0 | 0 | 0 |

Fig.38

| NO | EVALUATION ITEM | EVALUATION METHOD | GRADED RANK | SCORE | | |
|---|---|---|---|---|---|---|
| | | | | INDIVIDUAL EVALUATION OF MAJOR ITEMS | FIRST DESIGN EVALUATION AND SECOND DESIGN EVALUATION | COMPREHENSIVE EVALUATION OF ALL MAJOR ITEMS |
| 5 | COMPONENT PROJECTING AREA + PATTERN PORTION AREA OCCUPYING IN CIRCUIT BOARD | $\frac{\text{(COMPONENT PROJECTING AREA + PATTERN PORTION AREA*1)}}{\text{(BOARD AREA (XY)} \times \text{NUMBER OF SURFACE WIRING LAYERS*2)}} \times 100 (\%)$  *1) OVERLAPS SHOULD BE OMITTED. *2) COUNTED AS 1 FOR ONE-SIDE BOARDS, AND AS 2 FOR DOUBLE-SIDE OR MULTI-LAYER BOARDS. | I: NOT LESS THAN 80% | 20 | 4 | 2 |
| | | | II: NOT LESS THAN 60%, AND LESS THAN 80% | 10 | 2 | 1 |
| | | | III: NOT LESS THAN 40%, AND LESS THAN 60% | 5 | 1 | 0.5 |
| | | | IV: LESS THAN 40% | 0 | 0 | 0 |
| 6 | DEGREE OF DISPERSION OF COMPONENT PLACEMENT | · COUNT THE NUMBER OF COMPONENTS PLACED WITHIN A 10A×20B SIZE AREA, ASSUMING THAT THE MINIMUM COMPONENT SIZE IS A×B. · ASSUMING THAT THE NUMBER OF AREAS IS M AND THAT THE NUMBER OF COMPONENTS IS N, EVALUATE THE NUMBER OF AREAS NOT LESS THAN 0.5 Nave, AND NOT MORE THAN 1.5 Nave. NUMBER. AS WELL AS THE Mmid. NUMBER. · Nave = $\frac{1}{M} \Sigma N$ | I: $0.7 \leq \frac{\text{(NUMBER CONTAINED IN Mmid.)}}{M}$ | 20 | 4 | 2 |
| | | | II: $0.5 \leq \frac{\text{(NUMBER CONTAINED IN Mmid.)}}{M} < 0.7$ | 10 | 2 | 1 |
| | | | III: $0.3 \leq \frac{\text{(NUMBER CONTAINED IN Mmid.)}}{M} < 0.5$ | 5 | 1 | 0.5 |
| | | | IV: $\frac{\text{(NUMBER CONTAINED IN Mmid.)}}{M} < 0.3$ | 0 | 0 | 0 |
| | TOTAL | | I IN ALL RANKS : FULL SCORE IN ALL ITEMS | 100 | 20 | 10 |

Fig. 40

| | | | | | | | |
|---|---|---|---|---|---|---|---|
| BOARD PATTERN DESIGN | TOTAL WIRING LENGTH (mm) | | | | | | |
| | NUMBER OF PATTERN BRANCHES (PCS) | | | | | | |
| | PATTERN BRANCH LENGTH (mm) | | | | | | |
| | NUMBER OF THROUGH HOLES AND VIA HOLES (PCS/BOARD) | | | | | | |
| | COMPONENT PROJECTING AREA (cm$^2$) | | | | | | |
| | PATTERN PROJECTING AREA (cm$^2$) | | | | | | |
| WIRING BOARD DESIGN CRITERIA | CHECK FOR A TO D RANKS | | | | | | |
| ASSEMBLY KNOW-HOW ITEM | CHECK FOR A TO D RANKS | | | | | | |

Fig. 42

| NO | EVALUATION ITEM | EVALUATION RESULT | GRADED RANK | SCORE |
|---|---|---|---|---|
| 1 | TOTAL WIRING LENGTH | $L = \dfrac{\text{TOTAL WIRING LENGTH}}{\text{NUMBER OF COMPONENTS}} = \dfrac{15,338\text{mm}}{491\text{PCS}} = 31.2 \approx 0.9\text{K (IS-8)}$ mm/PC | II | 10/20 |
| 2 | NUMBER OF WIRING LAYERS | $L = \dfrac{\text{TOTAL WIRING LENGTH}}{\text{NUMBER OF COMPONENTS}} = \dfrac{15,338\text{mm}}{491\text{PCS}} \approx 31.2 \Rightarrow$ mm/PC $\begin{bmatrix}\text{STANDARD NUMBER OF LAYERS: 4 LAYERS}\\\text{DESIGNED NUMBER OF LAYERS: 6 LAYERS}\end{bmatrix}$ | III | 2/10 |
| 3 | NUMBER OF THROUGH HOLES AND VIA HOLES | ■DESIGNED NUMBER OF HOLES OF TARGET BOARD: H=3,421 HOLES<br>■STANDARD NUMBER OF HOLES: K=4,003 HOLES<br>■H≈0.85K | II | 10/20 |
| 4 | NUMBER OF PATTERN BRANCHES AND BRANCH LENGTH | ■NUMBER OF BRANCHES: 5 POINTS<br>■BRANCH LENGTH: 18mm (3 POINTS EQUIVALENT) | II | 5/10 |
| 5 | COMPONENT PROJECTING AREA÷ PATTERN PORTION AREA OCCUPYING | $\dfrac{\text{(COMPONENT PROJECTING AREA)} \div \text{(PATTERN PORTION AREA)}}{\text{(BOARD AREA)} \cdot \text{(NUMBER OF SURFACE WIRING LAYERS)}} = \dfrac{152\text{cm}^2}{300 \times 2 \text{ cm}^2 \text{ LAYERS}} \approx 0.25$ | IV | 0/20 |
| 6 | DEGREE OF DISPERSION OF COMPONENT PLACEMENT | ■MINIMUM COMPONENT SIZE: 2 × 1.25mm<br>■NUMBER OF MESHES: 10 × 6 = 60 MESHES<br>■Mmid = 37 MESHES | II | 10/20 |
| | | TOTAL SCORE / FULL SCORE | | 37/100 |

Fig. 43

| MAJOR ITEMS OF EVALUATION | SCORE |
|---|---|
| (1) CIRCUIT PROGRESSION (ESSENTIAL ITEM) | 10/20 |
| (2) ASSEMBLY EASINESS (IDEAL CONDITION) | 12/20 |
| (3) ASSEMBLY TECHNIQUE AND EQUIPMENT (RESTRICTIVE CONDITION) | 30/30 |
| (4) WIRING BOARD DESIGN CRITERIA (IMPORTANT ITEM, PART I) | 7/10 |
| (5) ASSEMBLY KNOW-HOW ITEM (NECESSARY-TO-CONTROL ITEM, PART I) | 16/20 |
| TOTAL SCORE | 75/100 |

Fig. 45

| MAJOR ITEMS OF EVALUATION | SCORE |
|---|---|
| (6) WIRING BOARD DESIGN CRITERIA (IMPORTANT ITEM, PART II) | 32/50 |
| (7) ASSEMBLY KNOW-HOW (NECESSARY-TO-CONTROL ITEM, PART II) | 24/30 |
| (8) BOARD AND PATTERN DESIGN (FUNDAMENTAL ITEM) | 7/20 |
| TOTAL SCORE | 63/100 |

Fig.47

| MAJOR ITEMS OF EVALUATION | SCORE |
|---|---|
| (1) CIRCUIT PROGRESSION (ESSENTIAL ITEM) | 5/10 |
| (2) ASSEMBLY EASINESS (IDEAL CONDITION) | 6/10 |
| (3) ASSEMBLY TECHNIQUE AND EQUIPMENT (RESTRICTIVE CONDITION) | 15/15 |
| (4) (6) WIRING BOARD DESIGN CRITERIA (IMPORTANT ITEM) | 18/30 |
| (5) (7) ASSEMBLY KNOW-HOW (NECESSARY-TO-CONTROL ITEM) | 20/25 |
| (8) BOARD AND PATTERN DESIGN (FUNDAMENTAL ITEM) | 3.5/10 |
| TOTAL SCORE | 67.5/100 |

Fig.49

| CIRCUIT | STANDARD SPECIFICATIONS LOT SIZE | NO. | BOARD STRUC-TURE | FLOW |
|---|---|---|---|---|
| LOGIC SYSTEM | SMALL: LESS THAN 20s/M | 1 | TYPE C | A B1 B2 |
| LOGIC SYSTEM | LARGE: 20s/M OR MORE | 2 | E | A A |
| POWER SYSTEM | SMALL: LESS THAN 20s/M | 3 | A | B1 B2 |
| POWER SYSTEM | LARGE: 20s/M OR MORE | 4 | B | B1 C |
| INTERFACE LOGIC SYSTEM AND POWER SYSTEM | SMALL: LESS THAN 20s/M | 5 | A | B1 B2 |
| INTERFACE LOGIC SYSTEM AND POWER SYSTEM | LARGE: 20s/M OR MORE | 6 | B | B1 C |

| EQUIPMENT AND PROCESS FLOW | NUMBER OF PROCESSES |
|---|---|
| SUPPLY SPp HDp MPA REF UK AV RH HAND INSERTION DIP HAND SOLDERING STORAGE | 12 |
| SUPPLY SPp HDp MPA REF INVERSION SPp MPA REF STORAGE | 12 |
| SUPPLY UK AV RH HAND INSERTION DIP HAND SOLDERING STORAGE | 8 |
| SUPPLY UK AV RH STORAGE INVERSION HDp MPA CURING INVERSION DIP STORAGE | 12 |
| SUPPLY UK AV RH HAND INSERTION DIP HAND SOLDERING STORAGE | 8 |
| SUPPLY UK AV RH STORAGE INVERSION HDp MPA CURING INVERSION DIP STORAGE | 12 |

Fig.51

EVALUATION: C, D RANK LIST

| EVALUATION RANK | | CORRESPONDING NO. AND ITEMS |
|---|---|---|
| C | APPROVAL BY RELATED AUTHORITY NECESSARY | : DRILL HOLE DIAMETER<br>: THROUGH HOLE POSITION 1<br>: MOUNTING-INHIBITED AREA<br>: SPACING BETWEEN WIREINGS<br>: ASSY. NO.<br>: IC AND RADIAL<br>: COMPONENTS WITH METALLIC CASE<br>— 11 CASES IN TOTAL, INCLUDING 4 OTHER —<br>THAN THE ABOVE |
| D | REDESIGN | : TEST PAD<br>: CUT LAND<br>: CROSS PATTERN<br>: IC'S<br>: SMD AND AUTO-INSERTED COMPONENTS<br>: IN CASE OF HEAT-GENERATING COMPONENTS ADOPTED<br>— 6 CASES IN TOTAL —<br>AS ABOVE |

Fig.52

EVALUATION: C, D RANK LIST

| EVALUATION RANK | | CORRESPONDING NO. AND ITEMS |
|---|---|---|
| C | APPROVAL BY RELATED AUTHORITY NECESSARY | :LEAD HEIGHT OF TAPED RADIAL COMPONENTS<br>:ATTACHING OF HEAT SINK OR THE LIKE<br>:PRESENCE OR ABSENCE OF COATING<br>—— 3 CASES IN TOTAL ——<br>—— AS ABOVE —— |
| D | REDESIGN | :CHIP PLACEMENT OF DIP SURFACE<br>:CHIP MINI-TR PLACEMENT<br>—— 2 CASES IN TOTAL ——<br>—— AS ABOVE —— |

Fig. 54

| | COMPONENT NUMBER | COMPO-NENT DES-IGNA-TION | MFR. PROD-UCT | SUP-PLIER | UNIT PRICE | MACHINE-MOUNTING MAN-HOURS (min.) | HAND-MOUNTING MAN-HOURS (min.) |
|---|---|---|---|---|---|---|---|
| IS8 | | | | | | | |
| ● | JAA00176ACS004 | A-1 | D-1 | G-1 | 30 | | |
| ● | JAA00176ADW002 | A-2 | D-2 | G-2 | 6.4 | | |
| ● | JAA00176ADW004 | A-3 | D-3 | G-3 | 8.4 | | |
| ● | JAA00177ACG105 | A-4 | D-4 | G-4 | 59 | | |
| ● | JAA00226ACV002 | A-5 | D-5 | G-5 | 10.8 | | |
| ● | JAA00226ADC104 | A-6 | D-6 | G-6 | 5.3 | | |
| ● | JAA00232ACF025 | A-7 | D-7 | G-7 | 6.2 | | |
| ● | JAA00232ACL102 | A-8 | D-8 | G-8 | 0.59 | | |
| ● | JAA00232ACL103 | A-9 | D-9 | G-9 | 0.59 | | |
| ● | JAA00232ACL124 | A-10 | D-10 | G-10 | 0.59 | | |
| ● | JAA00232ACL510 | B-1 | E-1 | H-1 | 0.59 | | |
| ● | JAA00232ACR220 | B-2 | E-2 | H-2 | 5 | | |
| ● | JAA00601ABX001 | B-3 | E-3 | H-3 | 18.4 | | |
| ● | JAA00601ABX002 | B-4 | E-4 | H-4 | 18.3 | | |
| ● | JAA00603AAN001 | B-5 | E-5 | H-5 | 22 | | |
| ● | JAA00605AAR001 | B-6 | E-6 | H-6 | 187 | | |
| ● | JAA00605AAR002 | B-7 | E-7 | H-7 | 173 | | |
| ● | JAA00612ABJ001 | B-8 | E-8 | H-8 | 8 | | |
| ● | JAA00612ABM001 | B-9 | E-9 | H-9 | 17.6 | | |
| ● | JAA00616ADL006 | B-10 | E-10 | H-10 | 14.4 | | |
| ● | JAA00616AGB001 | C-1 | F-1 | J-1 | 320 | | |
| ● | JCA00616AHA001 | C-2 | F-2 | J-2 | 288 | | |
| ● | JAA00616AJE001 | C-3 | F-3 | J-3 | 75.5 | | |
| ● | JAA00621ACJ001 | C-4 | F-4 | J-4 | 32 | | |
| ● | JAA00621ACK001 | C-5 | F-5 | J-5 | 32 | | |
| ● | JAA00629ACD001 | C-6 | F-6 | J-6 | 13.8 | | |

Fig. 55

| MACHINING AND ASSEMBLY MAN-HOURS (min.) | COMPONENT SETUP MAN-HOURS (min.) | BODY OUTER DIMENSIONS | | | RELEVANT EQUIPMENT | | INSERTION A (SIMPLY INSERTED) | INSERTION B (CLINCHED BLOW) | A |
|---|---|---|---|---|---|---|---|---|---|
| | | X | Y | Z | CURRENTLY POSSESSED | WIDELY USED | | | |
| | | 15.85 | 9.14 | 12.32 | H | | ● | | |
| | | 12.5 | 4.4 | 6.5 | RH | | | | |
| | | 17.5 | 4.4 | 6.5 | RH | | | | |
| | | 17.22 | 7.5 | 5.25 | | | ● | | |
| | | 6.3 | 6.3 | 11.2 | RH | | — | — | — |
| | | 3.2 | 1.6 | 0.85 | MPA | | — | — | — |
| | | 12 | 4 | 4 | AV | | — | — | — |
| | | 3.2 | 1.6 | 0.6 | MPA | | — | — | — |
| | | 3.2 | 1.6 | 0.6 | MPA | | — | — | — |
| | | 3.2 | 1.6 | 0.6 | MPA | | — | — | — |
| | | 3.2 | 1.6 | 0.6 | MPA | | — | — | — |
| | | 6.4 | 3.2 | 1.1 | MPA | | — | — | — |
| | | 4.5 | 2.5 | 1.5 | MPA | | | | |
| | | 4.5 | 2.5 | 1.5 | MPA | | | | |
| | | 7.8 | 3.2 | 0.5 | MPA | | | | |
| | | 14.5 | 6 | 10 | | | ● | | |
| | | 14.5 | 6 | 10 | | | ● | | |
| | | 2.9 | 2.8 | 1.1 | MPA | | | | |
| | | 2.9 | 1.5 | 1.1 | MPA | | | | |
| | | 10.8 | 5.3 | 1.9 | MPA | | | | |
| | | 14 | 14 | 2.75 | MPA | | | | |
| | | 35 | 20 | 6 | | | ● | | |
| | | 23.4 | 7.5 | 3.5 | | | ● | | |
| | | 13.4 | 10 | 4.5 | RH | | | | |
| | | 13.4 | 10 | 4.5 | RH | | | | |
| | | 3 | 3 | 5.5 | RH | | | | |

Fig. 56

HAND WORK (PREPARATION, INSERTION, POST-PROCESS)

| FORMING CUT | | | FORMING (HAND PROCESSING) | LEAD CUT ONLY | RIVET | SCREW TIGHTENING | LATER-INSTALLED COMPONENTS A | LATER-INSTALLED COMPONENTS B SPECIAL |
|---|---|---|---|---|---|---|---|---|
| B | C | SPECIAL | | | | | | |
|  |  |  |  |  |  |  |  |  |
|  |  |  |  |  |  |  |  |  |
|  |  |  |  |  |  |  |  |  |
| — | — | — | — |  |  | — | — | — |
| — | — | — | — |  |  | — | — | — |
| — | — | — | — |  |  | — | — | — |
| — | — | — | — |  |  | — | — | — |
| — | — | — | — |  |  | — | — | — |
| — | — | — | — |  |  | — | — | — |
| — | — | — | — |  |  | — | — | — |
| — | — | — | — |  |  | — | — | — |
|  |  |  |  |  |  |  |  |  |
|  |  |  |  |  |  |  |  |  |
|  |  |  |  |  |  |  |  |  |
|  |  |  |  |  |  |  |  |  |
|  | ● |  |  |  |  |  |  |  |
|  |  |  |  |  |  |  |  |  |
|  |  |  |  |  |  |  |  |  |

Fig. 57

| CROSS-SECTIONAL SHAPE | LEAD ||||  CHIP COMPONENT |||  DISCRETE COMPONENT ||
|---|---|---|---|---|---|---|---|---|---|
| | WIRE DIAMETER | LENGTH | DRILL DIAMETER | PITCH | RE-FLOW EXCLUSIVELY | RE-FLOW AND DIP | HAND SOLDERING EXCLUSIVELY | DIPPING ALLOWED | HAND SOLDERING |
| SQUARE | 1.14 | 4.32 | 1.95 | 3.96 | — | — | — | ● | |
| ROUND | 0.64 | 2.8 | 1 | 2.54 | — | — | — | ● | |
| ROUND | 0.64 | 2.8 | 1 | 2.54 | — | — | — | ● | |
| SQUARE | | 2.7 | 0.8 | 2.54 × 7.62 | — | — | — | ● | |
| ROUND | 0.5 | 17 | | 2.5 | — | — | — | ● | — |
| — | — | — | — | — | — | ● | — | — | — |
| CIRCULAR | 0.8 | 60 | 1.4 | 15 | — | — | — | ● | ● |
| — | — | — | — | — | — | ● | — | — | — |
| — | — | — | — | — | — | ● | — | — | — |
| — | — | — | — | — | — | ● | — | — | — |
| — | — | — | — | — | — | ● | — | — | — |
| — | — | — | — | — | — | ● | — | — | — |
| NONE | | | | | | ● | | | |
| NONE | | | | | | ● | | | |
| SQUARE | | | | | | ● | | | |
| SQUARE | 0.8 | 3 | 1.4 | 2.54 | | | | ● | |
| SQUARE | 0.8 | 3 | 1.4 | 2.54 | | | | ● | |
| NONE | | | | | | ● | | | |
| NONE | | | | | | ● | | | |
| NONE | | | | | ● | | | | |
| NONE | | | | | | ● | | | |
| SQUARE | 0.8 | 5 | 1.4 | 2.54 | | | | ● | |
| SQUARE | 0.27 x0.5 | | | | | | | ● | |
| SQUARE | 0.5x 0.5 | 13.3 | | 2.5 | | | | ● | |
| SQUARE | 0.5x 0.5 | 13.3 | | 2.5 | | | | ● | |
| SQUARE | | 29.1 | | | | | | ● | |

Fig. 58

| STYLE OF PACKING OF SMD COMPONENT ||||||||||
|---|---|---|---|---|---|---|---|---|---|
| PAPER TAPE | EMBOSS |||| STICK | LOOSE | ADHESIVE TAPE | TRAY | SPE-CIAL |
| | 8 | 12 | 16 | 24 | OTHERS | | | | | |
| — | — | — | — | — | — | — | — | — | — | — |
| — | — | — | — | — | — | — | — | — | — | — |
| — | — | — | — | — | — | — | — | — | — | — |
|   |   |   |   |   |   |   |   |   |   |   |
| — | — | — | — | — | — | — | — | — | — | — |
| — | — | — | — | — | — | — | — | — | — | — |
| ● | — | — | — | — | — | — | — | — | — | — |
| — | — | — | — | — | — | — | — | — | — | — |
| ● | — | — | — | — | — | — | — | — | — | — |
| ● | — | — | — | — | — | — | — | — | — | — |
| ● | — | — | — | — | — | — | — | — | — | — |
| ● | — | — | — | — | — | — | — | — | — | — |
| ● | — | ● | — | — | — | — | — | — | — | — |
|   |   | ● |   |   |   |   |   |   |   |   |
|   |   | ● |   |   |   |   |   |   |   |   |
|   |   | ● |   |   |   |   |   |   |   |   |
|   |   |   | ● |   |   |   |   |   |   |   |
|   |   |   |   |   |   |   |   |   |   |   |
|   | ● |   |   |   |   |   |   |   |   |   |
|   | ● |   |   |   |   |   |   |   |   |   |
|   |   |   | ● |   |   |   |   |   |   |   |
|   |   |   |   |   |   |   |   |   | ● |   |

Fig. 59

| STYLE OF PACKING OF DISCRETE COMPONENT | | | | DISCRETE TAPE WIDTH | | | | CHIP TAPE WIDTH | | | |
|---|---|---|---|---|---|---|---|---|---|---|---|
| MEANDER | REEL | LOOSE | SPECIAL REEL | AXIAL | | RADIAL | | | | | |
| | | | | 26mm | 52mm | 5mm | 2.5mm | | | | |
| | | ● | | | | | | | | | |
| ● | | | | | | ● | | | | | |
| ● | | | | | | ● | | | | | |
| | | ● | | | | | | | | | |
| ● | ● | − | − | − | − | − | ● | | | | |
| − | − | − | − | − | − | − | − | | | | |
| ● | − | − | − | − | ● | − | − | | | | |
| − | ● | − | − | − | − | − | − | | | | |
| − | ● | − | − | − | − | − | − | | | | |
| − | ● | − | − | − | − | − | − | | | | |
| − | ● | − | − | − | − | − | − | | | | |
| − | − | − | − | − | − | − | − | | | | |
| | | | | | | ● | | | | | |
| | | ● | | | | | | | | | |
| | | ● | | | | | | | | | |
| | | ● | | | | | | | | | |
| | | ● | | | | | | | | | |
| ● | | | | | | ● | | | | | |
| ● | | | | | | ● | | | | | |
| ● | | | | | | | ● | | | | |

Fig. 60

| TAPING PITCH (mm) | QUANTITY /REEL | MECHANICAL CHUCK | SUCTION NOZZLE | CORRESPONDENCY TO BAR CODES | HEAT RESISTANCE CONTROLLED COMPONENT | PRESENCE OF POLARITY | FUNDAMENTAL CHARACTERISTICS OF COMPONENTS | PRESENCE OF HEAT SINK |
|---|---|---|---|---|---|---|---|---|
|  |  |  |  |  |  | ● | — | — |
|  | 700 |  |  |  |  | ● | — | — |
|  | 700 |  |  |  |  | ● | — | — |
|  |  |  |  |  | ● | ● | — | — |
| 12.7 | 2000 | — | — | ● | — | ● | 50V, 33 μF | — |
| 4 |  | — | — | ● | — | — | 50V, 0.1 μF | — |
| 5 | 1000 | — | — | ● | — | — | AURIC ACID 2W2% | — |
| 4 | 5000 | S | S | ● | — | — | 1K 1/4W | — |
| 4 | 5000 | S | S | ● | — | — | 10K 1/4W | — |
| 4 | 5000 | S | S | ● | — | — | 120K 1/4W | — |
| 4 | 5000 | S | S | ● | — | — | 3216 1/4W 5% | — |
| 4 | 3000 | M | M | ● | — | — | 6432 1W 5% | — |
| 8 | 1000 | S |  |  |  | ● | — |  |
| 8 | 1000 | S |  |  |  | ● | — |  |
|  | 2000 |  |  | ● |  |  |  |  |
|  |  |  |  |  |  | ● | — | — |
|  |  |  |  |  |  | ● | — | — |
| 4 | 3000 | S |  | ● |  | ● | — | — |
| 4 | 3000 | S |  | ● |  | ● |  |  |
| 8 | 2000 | M |  |  |  | ● |  |  |
|  |  |  | ● |  |  |  |  |  |
|  |  |  |  |  |  | ● |  |  |
|  |  |  |  |  |  | ● |  |  |
|  | 1000 |  |  |  |  | ● |  |  |
|  | 1000 |  |  |  |  | ● |  |  |
|  | 2000 |  |  |  | ● | ● |  |  |

Fig. 61  ★ HEAT GENERATION - SOLDER INJECTION

| COUNTERMEASURES FOR FLOATING COMPONENT | | PRESENCE OF DELIVERY SPECIFICATIONS | PRESENCE OF MOUNTING SPECIFICATIONS | PRESENCE OF SILICON APPLICATION | INFORMATION | | | |
|---|---|---|---|---|---|---|---|---|
| SPACER | FORMING | | | | QUALITY | PURCHASE | COST | PERFORMANCE |
| NO | NO | | — | — | | | | |
| — | NO | | — | — | | | | |
| — | NO | | — | — | | | | |
| — | NO | YES | — | — | | SECOND SOURCE EXISTS. | | |
| — | — | — | — | — | | | | |
| — | — | — | — | — | | | | |
| — | — | — | — | — | — | — | — | |
| — | — | — | — | — | — | — | — | |
| — | — | — | — | — | — | — | — | |
| — | — | — | — | — | — | — | — | |
| — | — | — | — | — | — | — | — | |
| — | — | — | — | — | ★ | — | — | |
| NO | NO | | | NO | | | | |
| NO | NO | | | NO | | | | |
| NO | NO | | | NO | | | | |
| NO | NO | YES | | NO | | | | |
| NO | NO | YES | | NO | | | | |
| — | — | | | — | | | | |
| NO | NO | | | NO | | | | |
| NO | NO | | | NO | | | | |
| NO | NO | YES | NO | NO | | | | ● |
| NO | NO | YES | | NO | | | | |
| NO | NO | YES | | NO | | | | |
| NO | NO | YES | | NO | | | | |
| NO | NO | YES | | NO | | | | |
| NO | NO | | | NO | | | | |

Fig. 62

| Fig. 54 | Fig. 55 | Fig. 56 | Fig. 57 | Fig. 58 | Fig. 59 | Fig. 60 | Fig. 61 |

Fig. 63

| | ITEM | NUMBER OF COMPONENTS | NUMBER OF CAPACITORS | NUMBER OF THROUGH HOLES | NUMBER OF VIA HOLES | NUMBER OF PATTERN BRANCHES | BOARD WIRING LENGTH | PATTERN AREA |
|---|---|---|---|---|---|---|---|---|
| POWER SYSTEM | CONVERTER | | | | | | | |
| | INVERTER | | | | | | | |
| | BOARD POWER SUPPLY | | | | | | | |
| | BOARD EXTERNAL POWER SUPPLY | | | | | | | |
| | I/F | | | | | | | |
| | BOOSTING CONVERTER | | | | | | | |
| | CHARGER | | | | | | | |
| | GATE CONTROL | | | | | | | |
| | BRAKE CONTROL | | | | | | | |
| | DETECTOR CIRCUIT | | | | | | | |
| LOGIC SYSTEM | CPU | | | | | | | |
| | MEMORY | | | | | | | |
| | BOARD POWER SUPPLY | | | | | | | |
| | SIO/PIO | | | | | | | |
| | I/F | | | | | | | |
| | RESET CIRCUIT | | | | | | | |
| I/F SYSTEM | I/F | | | | | | | |

Fig. 64

| POWER CONSUMPTION | NUMBER OF BOARD LAYERS | ELECTRONIC-COMPONENT MOUNTING DENSITY | DENSITY OF VIA OR THROUGH HOLES (PCS/BOARD AREA) | NUMBER OF COMPONENT TYPES | COMPONENT + PATTERN PROJECTING AREA OCCUPYING IN BOARD | DEGREE OF DISPERSION OF COMPONENT PLACEMENT |
|---|---|---|---|---|---|---|
| | | | | | | |

Fig. 65

| MACHINE NAME | EQUIPMENT-REQUIRING TIME (CYCLE TIME) | NUMBER OF COMPONENTS TO BE MOUNTED (MAX.) | TARGET COMPONENT FORM | | | | STYLE OF PACKING OF COMPONENT (EQUIPMENT DEPENDENT) | | | |
|---|---|---|---|---|---|---|---|---|---|---|
| | | | SMD | DSC | OTHER | TAPING | TRAY | STICK | PARTS CASSETTE | |
| SPp | 0.167 | | | | | | | | | |
| HDP | 0.017 | | | | | | | | | |
| MPA | 0.015 | | | | | | | | | |
| IMC | 0.015 | | | | | | | | | |
| REF (WITH SOLDER) | 0.000 | | | | | | | | | |
| REF (CURING FURNACE) | 0.000 | | | | | | | | | |
| IPK | 15.000 | | | | | | | | | |
| UK | 0.067 | | | | | | | | | |
| AV | 0.020 | | | | | | | | | |
| BUTTON | 0.033 | | | | | | | | | |
| RH | 0.025 | | | | | | | | | |
| N2 FLOW | ④ | | | | | | | | | |
| IN-CIRCUIT TEST | ⑤ | | | | | | | | | |
| FUNCTION | ⑥ | | | | | | | | | |
| VISUAL | | | | | | | | | | |

Fig. 66

| | SETUP | | | | | | TOTAL |
|---|---|---|---|---|---|---|---|
| PROGRAM CALL | TRIAL STAMPING | CORRECTION | RAIL WIDTH CHANGE | COMPONENT REPLACEMENT | BOARD FEED | BOARD CARRIAGE-OUT | |
| | | | | | | | 10.000 |
| | | | | | | | 4.000 |
| | | | | | | | 23.000 |
| | | | | | | | 5.000 |
| | | | | | | | 0.167 |
| | | | | | | | 0.167 |
| | | | | | | | 8.000 |
| | | | | | | | 19.000 |
| | | | | | | | 16.000 |
| | | | | | | | 3.000 |
| | | | | | | | 11.000 |
| | | | | | | | 1.000 |
| | | | | | | | XIII |
| | | | | | | | XIV |
| | | | | | | | XV |
| | | | | | | | XVI |

Fig. 67

| ITEM | | | ONE-SIDE WIRING | DOUBLE-SIDE |
|---|---|---|---|---|
| (A) BOARD COST (YEN/REGULAR SIZE) | | | | |
| (B) VARIABLE COST | (D) HOLE MACHINING | φ0.7mm (YEN/PC) | $d_1$ | $d_1$ |
| | | φ0.5mm (YEN/PC) | $d_2$ | $d_2$ |
| | (E) OUTSIDE DIMENSIONS MACHINING | PUNCHING (YEN/PC) | $e_1$ | $e_1$ |
| | | ROUTER (YEN/PC) | $e_2$ | $e_2$ |
| | (F) PATTERN FORMING COST | PRINTING (YEN/FRONT AND REAR, REGULAR SIZE) | | |
| | | PHOTOGRAPHING (YEN/FRONT AND REAR, REGULAR SIZE) | | |
| | | HOLE BURYING (YEN/FRONT AND REAR, REGULAR SIZE) | | |
| | (G) RESIST FORMING | PRINTING (YEN/FRONT AND REAR, REGULAR SIZE) | | |
| | | PHOTOGRAPHING (YEN/FRONT AND REAR, REGULAR SIZE) | | |
| | (H) SILK MACHINING COST (YEN/SURFACE, REGULAR SIZE) | | | |
| | (I) SURFACE TREATMENT COST (SOLDER LEVELER) (YEN/TWO SURFACES, REGULAR SIZE) | | | |
| | (J) GOLD-PLATING PROCESSING COST (YEN/PIN, ONE-SIDE) | | $j$ | $j$ |
| | (K) V-CUT PROCESSING COST (YEN/PC) | | $k$ | $k$ |
| | (L) SLIT PROCESSING COST (YEN/cm) | | | |
| | (M) CONDUCTOR MINIMUM | NOT LESS THAN 0.25 mm | $z$ | $z$ |
| | | 0.15~0.25 | | |
| | | 0.12~0.15 | | |
| | | LESS THAN 0.12 mm | | |
| (C) COEFFICIENT | (N) ORDER LOT (m2/MONTH) | 1~5 | | |
| | | 6~9 | | |
| | | 10 | | |
| | | 11~30 | | |
| | | 31~100 | | |
| | | 101~300 | | |
| | | 301~ | | |

Fig. 69

| | CONTENTS OF PROCESSING | NET MAN-HOURS | SETUP MAN-HOURS |
|---|---|---|---|
| a | BOARD DIVIDING (ONE PLACE) V-CUT | 0.08 | |
| b | COATING BRUSH (ONE BOARD) | | |
| c | COATING ROBOT (ONE BOARD) | | |
| d | STAMPING (TWO PLACES) | | 0.17 |
| e | SILICON APPLICATION (ROBOT), ONE BOARD | 0.17 | 0.17 |
| f | SILICON APPLICATION (HAND), ONE BOARD | 0.17 | |
| g | DISTORTION-PREVENTING JIG SET (TWO) | 0.17 | 0.17 |
| h | STOPPER (TWO FOR 1 SHEET) | 0.17 | 0.17 |

Fig. 70

| CONTENTS OF PROCESSING | NET MAN-HOURS | SETUP MAN-HOURS |
|---|---|---|
| HEAT SINK ASSEMBLY, A | | |
| HEAT SINK ASSEMBLY, B | | |
| FORMING AND CUT, A | | 0.17 |
| FORMING AND CUT, B | | |
| FORMING AND CUT, C | | |
| FORMING AND CUT (SPECIAL) | | |
| FORMING (HAND PROCESSING) | 0.07 | |
| LEAD CUT ONLY | | |
| RIVET CAULKING | | |
| SCREW TIGHTENING | | |
| | | |
| INSERTION, A | | |
| INSERTION, B (CLINCH UNDER BOARD) | | |
| | | |
| HAND SOLDERING (ONE PLACE) | | 0.17 |
| LATER-INSTALLED COMPONENT, A | | 0.17 |
| LATER-INSTALLED COMPONENT, B | | |
| | | |
| | | |

Fig.71

| BOARD WIRING | ONE SIDE OR DOUBLE SIDE | | | | DOUBLE SIDE OR MULTI-LAYER | | ONE SIDE |
|---|---|---|---|---|---|---|---|
| COMPONENT PLACING METHOD | LEAD-COMPONENT INSERTION | LEAD-COMPONENT INSERTION AND ONE-SIDE CHIP INSERTION | | LEAD-COMPONENT INSERTION AND DOUBLE-SIDE CHIP MOUNTING | DOUBLE-SIDE CHIP MOUNTING | ONE-SIDE CHIP MOUNTING |
| SOLDERING TECHNIQUE | DIP SOLDERING | DIP SOLDERING | DIP SOLDERING AFTER REFLOW SOLDERING | DOUBLE-SIDE REFLOW | ONE-SIDE REFLOW |
| CIRCUIT TYPE | TYPE A | TYPE B | TYPE C | TYPE D | TYPE E | TYPE F |
| LOGIC SYSTEM — LESS THAN 20s/M | IV | | | | | |
| LOGIC SYSTEM — NOT LESS THAN 20s/M | | III | | | | |
| POWER SYSTEM — LESS THAN 20s/M | I | | III | | | |
| POWER SYSTEM — NOT LESS THAN 20s/M | | | | III | | |
| MIXED MOUNTING OF INTERFACE SYSTEM OR LOGIC SYSTEM AND POWER SYSTEM | | | II | | | IV |

Fig.72

| NUMBER OF WIRING LAYERS \ ELECTRONIC-COMPONENT MOUNTING DENSITY (POINTS/cm²) | NOT LESS THAN 0, AND LESS THAN 2 | NOT LESS THAN 2, AND LESS THAN 4 | NOT LESS THAN 4, AND LESS THAN 6 | NOT LESS THAN 6, AND LESS THAN 8 | NOT LESS THAN 8 |
|---|---|---|---|---|---|
| ONE SIDE | | | | | |
| DOUBLE SIDE | III | | | | |
| 4 LAYERS | | III | | | |
| 6 LAYERS | | | II | | |

Fig.74

A: DESIGN CHANGE UNNECESSARY (PERFECT)
B: DESIGN CHANGE UNNECESSARY (SLIGHTLY DEFECTIVE)
C: APPROVAL BY RELATED DIVISION NECESSARY
D: REDESIGN

| NO. | EVALUATION ITEM | | | DESIGN CRITERIA CORPUS NO. | EVALUATION CRITERIA CORPUS NO. | EVALUATION CATEGORY | | BOARD CATEGORY | | | DATA BASE | REMARKS |
|---|---|---|---|---|---|---|---|---|---|---|---|---|
| | EVALUATION CRITERIA | RANK | SCORE | | | EVALUATION 1 | 2 | POWER SYSTEM | LOGIC SYSTEM | INTER-FACE | | |
| 1 | 1: ALL DIP    X: Y≤490<br>            Y: 223.4 or 260.0<br>SMD MIXED  X: Y≤330<br>            Y: 233.4 or 260.0 | A | | | | ○ | | ○ | ○ | ○ | | OTHERWISE, FURTHER DISCUSSIONS WITH MANUFACTURING DEPARTMENT NO.1, PRINT BOARD DIVISION, ARE NECESSARY. |
| | 2: ALL DIP    X: 163.4≤X≤<br>            Y: 233.4 or 260.0<br>SMD MIXED  X: 163.4≤X≤320<br>            Y: 233.4 or 260.0 | B | | | | | | | | | | |
| | 3: OTHERS | D | | | | | | | | | | |
| 2 | 1: BOARD THICKNESS : 1.6mm | A | | | | ○ | | ○ | ○ | ○ | | |
| | 2: OTHERS | C | | | | | | | | | | |
| 3 | 1: CONFORMING TO FIGURE | A | | | | | ○ | ○ | ○ | ○ | | |
| | 2: NOT CONFORMING TO FIGURE | C | | | | | | | | | | |
| 4 | 1: HOLES FOR MOUNTING PRINTED BOARD SHALL BE WITHIN NOT LESS THAN 3mm FROM BOARD END | A | | | | | ○ | ○ | ○ | ○ | | |
| | 2: OTHERWISE | D | | | | | | | | | | |

Fig. 76

| NO. | EVALUATION CRITERIA | RANK | SCORE | DESIGN CRITERIA CORPUS NO. | EVALUATION CRITERIA CORPUS NO. | EVALUATION 1 | EVALUATION 2 | POWER SYSTEM | LOGIC SYSTEM | INTER-FACE | DATA BASE | RE-MARKS |
|---|---|---|---|---|---|---|---|---|---|---|---|---|
| 5 | 1: A26mm TP:7.5, 10.0 A52mm TP:12.5, 15.0 R5 PITCH TP:5.0 R2.5 PITCH TP:2.5 | A | | | | O | | O | O | O | | |
|   | 2: A52mm TP:15.0<X≦17.5 | B | | | | | | | | | | |
|   | 3: OTHERS | C | | | | | | | | | | |
| 6 | 1: LEAD WIRE DIAMETER: NOT MORE THAN 0.8mm, AND 1.2mm LEAD WIRE DIAMETER: NOT LESS THAN 0.9mm, AND WIRE DIAMETER+0.4mm | A | | | | | | O | | O | O | |
|   | 2: OTHERS | D | | | | | | | | | | |
| 7 | 1: φ+0.3mm | A | | | | | O | O | | | | |
|   | 2: OTHERS | D | | | | | | | | | | |
| 8 | 1: φ+0.5mm | A | | | | | O | O | | O | | |
|   | 2: OTHERS | D | | | | | | | | | | |
| 9 | 1: BEING ON BASIC GRATING WITH INTERVAL OF 10.0, 12.5 OR 15.0mm | A | | | | | O | O | O | O | | |
|   | 2: OTHERS | C | | | | | | | | | | |
| 10 | 1: EVERY THROUGH HOLE HAS A HOLE DIAMETER OF NOT LESS THAN 0.8mm | A | | | | | O | O | O | O | | |
|   | 2: SOME THROUGH HOLES HAVE A HOLE DIAMETER d OF 0.5mm≦d<0.8mm | B | | | | | | | | | | |
|   | 3: OTHERS | D | | | | | | | | | | |
| 11 | 1: NOT ON ADJACENT GRATING | A | | | | | O | O | O | O | | |
|   | 2: ON ADJACENT GRATING | D | | | | | | | | | | |
| 12 | 1: NO THROUGH HOLE IS LOCATED UNDER A COMPONENT (2.54 PITCH) | A | | | | | O | O | O | O | | |
|   | 2: ANY THROUGH HOLE IS LOCATED UNDER A COMPONENT | D | | | | | | | | | | |
| 13 | 1: ALL TEST PADS ARE ON THE DIP SURFACE | A | | | | | O | O | O | O | | |
|   | 2: OTHERS | C | | | | | | | | | | |

Fig. 7 7

| Fig.73 | Fig.74 |
|--------|--------|
| Fig.75 | Fig.76 |

Fig. 79

A: DESIGN CHANGE UNNECESSARY (PERFECT)
B: DESIGN CHANGE UNNECESSARY (SLIGHTLY DEFECTIVE)
C: APPROVAL BY RELATED DIVISION NECESSARY
D: REDESIGN

| NO. | EVALUATION ITEM - EVALUATION CRITERIA | RANK | SCORE | DESIGN CRITERIA CORPUS NO. | EVALUATION CRITERIA CORPUS NO. | EVALUATION CATEGORY - EVALUATION 1 | EVALUATION CATEGORY - EVALUATION 2 | BOARD CATEGORY - POWER SYSTEM | BOARD CATEGORY - LOGIC SYSTEM | BOARD CATEGORY - INTER-FACE | DATA BASE | REMARKS |
|---|---|---|---|---|---|---|---|---|---|---|---|---|
| 1 | 1: V-CUT ZERO OR MULTI-SURFACING V-CUTS ONLY | A | | | ○ | | ○ | ○ | ○ | ○ | | |
| | 2: V-CUT FOR 2+WIDTH ADJUSTMENT ARE PRESENT | B | | | | | | | | | | |
| | 3: OTHERS | C | | | | | | | | | | |
| 2 | 1: NO STANDARD LAND (NEW LAND) | A | | | | | ○ | ○ | ○ | ○ | | |
| | 2: NEW LAND IS USED | C | | | | | | | | | | |
| 3 | 1: PATTERN IS DISPERSED ALL OVER | A | | | ○ | | ○ | | | ○ | | |
| | 2: PATTERN IS UNEVEN, BUT COUNTERMEASURES ARE PROVIDED | B | | | | | | | | | | |
| | 3: PATTERN IS UNEVEN, AND COUNTERMEASURES ARE NOT PROVIDED | C | | | | | | | | | | |
| 4 | 1: H<13mm | A | | | ○ | | ○ | ○ | ○ | ○ | | |
| | 2: H≧13mm | C | | | | | | | | | | |
| 5 | 1: STRAIGHT LEAD IS ADOPTED | A | | | | ○ | | ○ | ○ | ○ | ● | |
| | 2: NO STRAIGHT LEAD IS ADOPTED | C | | | | | | | | | | |
| 6 | 1: 18mm≦L1, AND L2≦38mm | A | | | | ○ | | ○ | ○ | ○ | ● | |
| | 2: L1<18mm, OR 38mm<L2 | D | | | | | | | | | | |
| 7 | 1: CHIP COMPONENT PLACEMENT IS APPROPRIATE | A | | | | ○ | | ○ | ○ | ○ | ● | |
| | 2: CHIP COMPONENT PLACEMENT OF NO GUARANTEE BY MANUFACTURE IS PROVED ON REFLOW DIP SURFACE | D | | | | | | | | | | |

Fig. 80

| Fig.78 | Fig.79 |

Fig. 81

▢ NOT USED AT PRESENT ↓ TO BE USED FOR PREDICTION OF NEXT YEAR

| | | YEAR (1997) (YEN/MIN) | UPDATED ON | LAST YEAR (YEN/MIN) REF. | SIMULATION (YEN/MIN) | REMARKS |
|---|---|---|---|---|---|---|
| WORKERS' LABOR COST | OUR COMPANY | 162 | 96.12.1 | 164 | | |
| | TRADER A | | | | | |
| | TRADER B | | | | | |
| | TRADER C | | | | | |
| | TRADER D | | | | | |
| INDIRECT WORKER | SAME IN ALL | 162 | 96.12.1 | 164 | | |
| EQUIPMENT'S COST | SPp | | | | | |
| | HBP | | | | | |
| | MPA | | | | | |
| | IMC | | | | | |
| | REF | | | | | |
| | IPK | | | | | |
| | UK | | | | | |
| | AV | | | | | |
| | BUTTON | | | | | |
| | RH | | | | | |
| | N₂ FLOW | | | | | |
| | IN-CIRCUIT TEST | | | | | |
| | FUNCTION TEST | | | | | |

Fig. 82

| CONDUCTOR MINIMUM WIDTH | | LESS THAN 0.12 mm | 0.12~0.15mm | 0.15~0.25mm | NOT LESS THAN 0.25 |
|---|---|---|---|---|---|
| PATTERN FORMA | PRINTING | ○ | | | ○ |
| | PHOTOGRAPHING | | ○ | ○ | |
| | HOLE BURYING | | | | ○ |
| RESIST FORMA | PRINTING | ○ | ○ | ○ | |
| | PHOTOGRAPHING | | ○ | ○ | ○ |

Fig. 83

| CIRCUIT BLOCK | ITEM | NUMBER OF WIRING LAYERS | | | |
|---|---|---|---|---|---|
| | | ONE-SIDE WIRING | DOUBLE-SIDE WIRING | 4-LAYER WIRING | 6-LAYER WIRING |
| POWER SYSTEM | MODEL NAME | | E P U | | |
| | WORK SIZE | | 292X875mm | | |
| | NUMBER OF COMPONENTS | | 230 | | |
| | MOUNTING DENSITY | | 5.7 PCS /cm$^2$ | | |
| | TOTAL WIRING | | 794mm | | |
| LOGIC SYSTEM | MODEL NAME | | BBW | | |
| | WORK SIZE | | 104X50mm | | |
| | NUMBER OF COMPONENTS | | 39 | | |
| | MOUNTING DENSITY | | 24 PCS /cm$^2$ | | |
| | TOTAL WIRING | | 451mm | | |
| MIXED MOUNTING OF INTERFACE SYSTEM OR POWER SYSTEM AND LOGIC SYSTEM | MODEL NAME | | BKB | | |
| | WORK SIZE | | 160X72mm | | |
| | NUMBER OF COMPONENTS | | 72 | | |
| | MOUNTING DENSITY | | 5.41 PCS /cm$^2$ | | |
| | TOTAL WIRING | | 2546mm | | |

Fig. 84

| CIRCUIT BLOCK | ITEM | NUMBER OF WIRING LAYERS ||||
| --- | --- | --- | --- | --- | --- |
| | | ONE-SIDE WIRING | DOUBLE-SIDE WIRING | 4-LAYER WIRING | 6-LAYER WIRING |
| POWER SYSTEM | MODEL NAME | | EPU | | |
| | NUMBER OF VIA HOLES | | 44 | | |
| | NUMBER OF THROUGH HOLES | | 711 | | |
| LOGIC SYSTEM | MODEL NAME | | BBW | UHPDS | |
| | NUMBER OF VIA HOLES | | 60 | 945 | |
| | NUMBER OF THROUGH HOLES | | 30 | 871 | |
| MIXED MOUNTING OF INTERFACE SYSTEM OR POWER SYSTEM AND LOGIC SYSTEM | MODEL NAME | | BKB | | |
| | NUMBER OF VIA HOLES | | 51 | | |
| | NUMBER OF THROUGH HOLES | | 298 | | |

Fig.85

| | ITEM | | DETAILS | | COST (YEN) | RATIO |
|---|---|---|---|---|---|---|
| DIRECT MATERIAL COST | (1) COMPONENT MATERIAL COST | | · STANDARD COMPONENTS<br>· NEW COMPONENTS | : 9999 PCS / 88888 YEN<br>: 7777 PCS / 66666 YEN | 111,111 | 80% /<br>DIRECT MATERIAL COST |
| | (2) BOARD MATERIAL COST | | · MATERIAL / NUMBER OF LAYERS<br>· BOARD DIMENSIONS<br>· CONDUCTOR MINIMUM WIDTH<br>· SURFACE TREATMENT<br>· NUMBER OF V-CUTS | : GLASS EPOXY BOARD / 4 LAYERS<br>: 555cm X 444cm X t1.6mm<br>: 0.12~0.5mm<br>: SOLDER LEVELER+GOLD PLATING<br>: 33 PCS | 222,222 | 20% /<br>DIRECT MATERIAL COST |
| | SUB TOTAL (1)+(2) | | | | 000,000 | 40% |
| LABOR COST | (3) MACHINE MOUNTING | | · NUMBER OF MACHINE-MOUNTED<br>· HAND-MOUNTIBG MAN-HOURS | : 9999 PCS<br>: 888 MIN. | 33,333 | 20% / LABOR COST |
| | (4) HAND MOUNTING | | · NUMBER OF HAND-MOUNTED COMPONENTS<br>· HAND-MOUNTIBG MAN-HOURS | : 7777 PCS<br>: 666 MIN. | 44,444 | 40% / LABOR COST |
| | (5) COMPONENT MACHINING AND ASSEMBLY | | · NUMBER OF MACHINING / ASSEMBLING COMPONENTS<br>· COMPONENT MACHINING / ASSEMBLING MAN-HOURS | : 555 MIN.<br>: 444 MIN. | 55,555 | 10% / LABOR COST |
| | (6) COMPONENT SETUP | | · COMPONENT SETUP MAN-HOURS | : 333 MIN. | 66,666 | 10% / LABOR COST |
| | (7) BOARD MACHINING | | · BOARD MACHINING MAN-HOURS | : 222 MIN. | 77,777 | 5% / LABOR COST |
| | (8) BOARD MACHINING SETUP | | · BOARD MACHINING SET MAN-HOURS | : 111 MIN. | 88,888 | 10% / LABOR COST |
| | (9) EQUIPMENT SETUP | | · EQUIPMENT SETUP MAN-HOURS | : 000 MIN. | 99,999 | 5% / LABOR COST |
| | SUB TOTAL (3)~(9) | | | | 000,000 | 60% |
| | TOTAL PCB ASSEMBLY COST | | | | ¥¥¥,¥¥¥ | 100% |

DESIGN EVALUATING METHOD AND APPARATUS FOR ASSISTING CIRCUIT-BOARD ASSEMBLY

BACKGROUND OF THE INVENTION

The present invention relates to a design evaluating method for assisting a circuit-board-assembly, evaluating assemblability of a circuit board on which electronic components are mounted, a computer-readable recording medium having recorded thereon computer-executable evaluation-assisting programs for executing the design evaluating method for assisting the circuit-board-assembly, and a design evaluating apparatus for assisting the circuit-board-assembly for executing the design evaluating method for assisting the circuit-board-assembly.

It is noted that a term "design and assembly operation," herein refers to processes ranging from an operation of circuit design and electronic components selection to a completion of engineering-trial manufacture of a component-mounted-circuit board, which is a printed circuit board (which hereinafter may be referred to also as "PCB") that has electronic components mounted thereon and that fulfills desired functions, on the ground that assembly easiness of electronic components onto the circuit board depends not only on an assembly operation but also, actually, on a process of the circuit design. Therefore, the design evaluation in turn means determining the degree of how design techniques and assembly techniques included in the respective processes ranging from the circuit design to the engineering-trial manufacture of the component-mounted-circuit board as described above are satisfying preset targets of the design techniques and the assembly techniques.

In designing a circuit board that is used in some articles, for example, electronic equipment such as televisions and video cassette recorders and that fulfills desired functions, it has been conventional practice to take such steps as shown in FIG. 86. That is, after system design for the whole electronic equipment as shown in Step (denoted by "S" in the figure) 1, the design of circuits capable of executing functions of the system as well as the selection of electronic components to be provided in the circuits are performed based on a system design corpus at Step 2. Based on circuit diagrams and component lists relating to these circuit design and selected components, circuit board and pattern design is performed at Step 3. Based on the resulting board design drawings and pattern design drawings, at step 4, a prototype of a component-mounted-circuit board in which electronic components are mounted on the circuit board is manufactured. At Step 5, performance evaluation is performed on the prototype component-mounted-circuit board, where if specified performances are satisfied, then the component-mounted-circuit board is trial manufactured. Then, with regard to the prototype, a quality evaluation is performed at Step 7, a manufacturing cost evaluation is performed at Step 8, and a production evaluation is performed at Step 9 as to whether or not the protoptype is producible without trouble by a production line, one after,the other based on experiences and the like. If the evaluations of Steps 7 to 9 are all satisfied, then a regular production of the component-mounted-circuit board is started. In addition, if the specified performances are not satisfied in the evaluations of Step 5 and Steps 7 to 9, then the process flow is fed back to any one of the Steps 12, 13 and 14, where the processing steps are executed again starting with the operation of circuit-board redesign and electronic-component reselection, or the redesigning for circuit board and pattern design, or redoing of trial manufacture of the component-mounted-circuit board. In this case, which step among Steps 12, 13 and 14 the process flow is fed back to is decided based on the results of the performance evaluations.

Like this, in the conventional art, as shown by Step 5, the assemblability evaluation would not be enabled until the completion of circuit board design and pattern design and the manufacture of the prototype of the component-mounted-circuit board, and as to failures found by the evaluation, the circuit design and the electronic components selection and the like would be redone and a prototype of the component-mounted-circuit board would be manufactured once again.

As shown above, in the conventional art, since the circuit board with electronic components mounted thereon could not be evaluated for its design and manufacture until the circuit board is once completed, there have been problems such as a prolonged design-and-development lead time, a low level of design completeness, and a low productivity and flexibility for variations.

Also, in each of the steps from the operation of circuit design and electronic components selection to the manufacture of the prototype of the component-mounted-circuit board, it has conventionally been practiced that design and manufacture are performed based on personal knowledge and judgment of the design operators or manufacture operators. Thus, in the conventional art, there is no evaluation means for objectively and impartially judging whether or not techniques adopted for the respective steps by the design operator or manufacture operator are the best ones for circuit boards of the system. Neither is there evaluation means which allows a technique that the design operator or manufacture operator is planning to adopt for any one of the steps, to be objectively and impartially evaluated at a planning stage for the adoption of the technique.

In addition, a publication of unexamined Japanese Patent application 4-359497 has disclosed a circuit-board productivity design automatic evaluation system in which it is automatically quantitatively evaluated, prior to the making of a prototype of the component-mounted-circuit board, whether or not the structure of a designed circuit board is easy to produce, and in particular, easy to assemble. However, the invention disclosed in the publication is designed to enable quantitative evaluation of assembly easiness of the circuit board in the stage where the designed circuit board has been forwarded to a manufacturing process. That is, in the invention of the publication, for the evaluation of the assembly easiness without requiring any abundance of experiences, assembling operations in the process of assembling the components onto the circuit board are previously classified into basic factors and correction factors, and then the assembling operations with the circuit board to be evaluated or components are represented by combinations of the basic factors and the correction factors, in which arrangement of the assembly easiness of the circuit board is quantitatively evaluated based on the combinations.

Like this, the invention of the above publication indeed enables the design evaluation prior to the trial manufacture, but is so constituted as to enable the evaluation of the assembly easiness, i.e. productivity design, of the circuit board based on factors relating to the assembling operations, i.e., factors relating to manufacture.

Accordingly, in not only the invention of the above publication but in the conventional art, there exists no one that quantitatively evaluates the assemblability of circuit boards comprehensively by taking into consideration factors other than factors relating to the manufacture, that is, factors relating to the design of the circuit board, factors relating to production technology including manufacturing know-how, and factors relating to manufacture with a manufacturing equipment taken into account, in other words, that quantitatively evaluates the assemblability of circuit boards comprehensively on a scale common to the three divisions of design, production technology and manufacturing.

Further, in the invention of the aforementioned publication, whereas it is considered that the classification into the basic factors and the correction factors is performed based on the experiences of those skilled in the art, whether or not the classification is objectively correct is not determinate, so that the evaluation of the assembly easiness lacks objectivity. Therefore, the invention of the publication is not one that enables objective and impartial evaluation.

Furthermore, in the invention of the publication, the assembly easiness of the circuit board is evaluated with the aim of improving the production efficiency of the circuit board. Accordingly, there has conventionally been provided no one that executes the assemblability evaluation for enabling the realization of high-quality assembly simply without involving considerations for improvement in the production efficiency, even with the invention of the above publication taken into account.

SUMMARY OF THE INVENTION

The present invention has been accomplished to solve these and other problems. An object of the present invention is therefore to provide a design evaluating method for assisting circuit-board-assembly, a computer-readable recording medium having recorded thereon computer-executable evaluation-aid programs for executing the design evaluating method, and a design evaluating apparatus for assisting the circuit-board-assembly, executing the design evaluating method, each of which enables high-quality assembly to be realized by taking into consideration factors relating to a design of the circuit board, factors relating to production technology including know-how in manufacture, and factors relating to manufacture with manufacturing equipment, and by objectively and impartially evaluating the assemblability of circuit boards comprehensively on a scale common to these factors.

In a first aspect of the present invention, there is provided a design evaluating method for assisting circuit-board-assembly regarding design and assembly operation which includes designing a circuit that fulfills desired function, designing a pattern on a circuit board to form the circuit, and then performing engineering-trial manufacture of a component-mounted-circuit board mounting components on the circuit board, the method comprising:

at a stage prior to the engineering-trial manufacture of the component-mounted-circuit board, performing a first design evaluation or a second design evaluation with considerations given to both sides of design and assembly processes, the design process side where the circuit design and the pattern design are involved and the assembly process side where electronic components are mounted onto the circuit board, wherein the first design evaluation is design evaluation for, with respect to the circuit design and electronic components selection, evaluating differences between an actually performed circuit design and a target circuit design, and between components selection and target components selection, the target circuit design and the target components selection being targeted for quality improvement in an assembly operation, in the assembly process, of mounting the electronic components onto the circuit board, and the second design evaluation is design evaluation for, with respect to design of the circuit board and the pattern design of the circuit board, evaluating differences between an actually performed circuit board design and a target board design, and between a pattern design and a target pattern design, the target board design and the target pattern design being targeted.

In a second aspect of the present invention, there is provided a design evaluating method for assisting circuit-board-assembly regarding design and assembly operation which includes designing a circuit that fulfills desired function, designing a pattern on a circuit board to form the circuit, and then performing engineering-trial manufacture of a component-mounted-circuit board mounting components on the circuit board, the method comprising:

at a stage prior to the engineering-trial manufacture of the component-mounted-circuit board, performing a first design evaluation and a second design evaluation with considerations given to both sides of design and assembly processes, the design process side where the circuit design and the pattern design are involved and the assembly process side where electronic components are mounted onto the circuit board, wherein the first design evaluation is design evaluation for, with respect to the circuit design and electronic components selection, evaluating differences between an actually performed circuit design and a target circuit design, and between components selection and target components selection, the target circuit design and the target. components selection being targeted for quality improvement in an assembly operation, in the assembly process, of mounting the electronic components onto the circuit board, and the second design evaluation is design evaluation for, with respect to design of the circuit board and the pattern design of the circuit board, evaluating differences between an actually performed circuit board design and a target board design, and between a pattern design and a target pattern design, the target board design and the target pattern design being targeted.

In the design evaluating method for assisting circuit-board-assembly of the first or second aspect, the first design evaluation may comprise at least calculating assembly cost for the assembly operation and, with respect to evaluation of the circuit design and the electronic components selection as well as evaluation of the circuit design and the electronic components selection as viewed from the assembly process side where the electronic components are mounted onto the circuit board, evaluating any difference between the target circuit design and the actually performed circuit design as well as any difference between the target components selection and the actually performed components selection.

Also, the evaluation of the circuit design and the electronic components selection may comprise an evaluation as to whether or not the circuit design and electronic components selection of a circuit to be designed has progressed with respect to a comparison target.

Also, the evaluation of the circuit design and the electronic components selection further may comprise at least an evaluation of compliance with design criteria for quality improvement with respect to the circuit design and electronic components selection, and an evaluation of compliance with know-how items in the assembly process for the quality improvement with respect to the circuit design and electronic components selection.

In a third aspect of the present invention, there is provided a computer-readable recording medium having recorded thereon programs for making the computer execute design evaluating processing for assisting circuit-board-assembly regarding design and assembly operation which processing includes designing a circuit that fulfills desired function, designing a pattern on a circuit board to form the circuit, and then performing engineering-trial manufacture of a component-mounted-circuit board mounting components on the circuit board, at a stage prior to the engineering-trial manufacture of the component-mounted-circuit board, recording design evaluation processing programs for assisting circuit-board-assembly, the programs including instructions for making the computer execute a first design evaluation process or a second design evaluation process with considerations given to both sides of design and assembly, the design side where the circuit design and the pattern design are involved and the assembly side where electronic components are mounted onto the circuit board, where the first design evaluation process is design evaluation process for, with respect to the circuit design and electronic components selection, evaluating differences between an actually performed circuit design and a target circuit design, and between components selection and target components selection, the target circuit design and the target components selection being targeted for quality improvement in an assembly operation, in the assembly process, of mounting the electronic components onto the circuit board, and the second design evaluation process is design evaluation for, with respect to design of the circuit board and a pattern design of the circuit board, evaluating differences between an actually performed circuit board design and a target board design, and between a pattern design and a target pattern design.

In a fourth aspect of the present invention, there is provided a design evaluating apparatus for assisting circuit-board-assembly, the apparatus for executing design evaluation for assisting circuit-board-assembly regarding design and assembly operation which includes designing a circuit that fulfills desired function, designing a pattern on a circuit board to form the circuit, and then performing engineering-trial manufacture of a component-mounted-circuit board mounting components on the circuit board, the apparatus comprising:

a reading unit for reading a program recorded on the recording medium as defined in the thied aspect of the present invention; and an evaluation executing unit for executing a first design evaluation or a second design evaluation with considerations given to both sides of design and assembly processes, the design process side where the circuit design and the pattern design are involved and the assembly process side where electronic components are mounted onto the circuit board, based on the read program at a stage prior to the engineering-trial manufacture of the component-mounted-circuit board.

In a fifth aspect of the present invention, there is provided a design evaluating apparatus for assisting circuit-board-assembly, the apparatus executing design evaluation for assisting circuit-board-assembly regarding design and assembly operation which includes designing a circuit that fulfills desired function, designing a pattern on a circuit board to form the circuit, and then performing engineering-trial manufacture of a component-mounted-circuit board mounting components on the circuit board, the apparatus comprising:

an evaluation executing unit for executing a first design evaluation and a second design evaluation with considerations given to both sides of design and assembly processes, the design process side where the circuit design and the pattern design are involved and the assembly process side where electronic components are mounted onto the circuit board, at a stage prior to the engineering-trial manufacture of the component-mounted-circuit board, where the first design evaluation is design evaluation for, with respect to the circuit design and electronic components selection, evaluating differences between an actually performed circuit design and a target circuit design, and between components selection and target components selection, the target circuit design and the target components selection being targeted for quality improvement in the assembly operation, in the assembly process, of mounting the electronic components onto the circuit board, and the second design evaluation is design evaluation for, with respect to design of the circuit board and pattern design of the circuit board, evaluating differences between an actually performed circuit board design and a target board design, and between a pattern design and a target pattern design.

As described in detail above, according to the design evaluating method for assisting circuit-board-assembly in the first aspect of the present invention, as well as to the design evaluating apparatus for assisting circuit-board-assembly in the fourth aspect of the present invention, the evaluation executing unit is provided and, prior to the engineering-trial manufacture of the component-mounted-circuit board, the first design evaluation or the second design evaluation is executed with considerations given to both sides of design and assembly, the design side where the circuit design and the pattern design are involved and the assembly process side where electronic components are mounted onto the circuit board. Therefore, prior to the engineering-trial manufacture of the component-mounted-circuit board, the evaluation of circuit design and components selection, or the evaluation of the board design and pattern design can be executed, thus enabling the evaluator, for example, the circuit designer to evaluate his or her own design by himself or herself, to grasp problematic points in assembly cost and assembly process, and to discuss the issues of assemblability on a scale common to the three divisions of the circuit design, the production technology and the assembly. More specifically, since failures that would occur during the production of circuits can be grasped in advance, solutions to the failures can be taken in advance, so that the development lead time can be reduced and that the number of times of engineering-trial manufacture can be reduced. Also, the product quality of circuits can be improved, and the cost reduction and the optimization of production efficiency can be achieved.

Further, according to the design evaluating method for assisting circuit-board-assembly in the second aspect of the present invention, as well as to the design evaluating apparatus for assisting circuit-board-assembly in the fifth aspect of the present invention, the evaluation executing unit is provided and, prior to the engineering-trial manufacture of the component-mounted-circuit board, the first design evaluation and the second design evaluation are executed with considerations given to both sides of design and assembly, the design side where the circuit design and the pattern design are involved and the assembly process side where electronic components are mounted onto the circuit board. Therefore, the evaluator, for example, the circuit designer is enabled to evaluate his or her own design by himself or herself. Also, since the evaluation of the present circuit design is enabled at the time when the circuit design and electronic-components selection has been completed, problematic points in assembly cost and assembly process can be grasped prior. to the engineering-trial manufacture. Further, it becomes also possible to perform a relative comparison between the circuit of the present design and a circuit of conventional design, and to discuss issues of assemblability on a scale common to the three divisions of the circuit design, the production technology and the assembly. More specifically, since failures that would occur during the production of the circuit can be grasped in advance, solutions to the failures can be taken in advance, so that the development lead time can be reduced and that the number of times of engineering-trial manufacture can be reduced. Also, product quality of the circuit can be improved, and a cost reduction as well as an optimization of production efficiency can be achieved.

Furthermore, according to the recording medium in the third aspect of the present invention, as well as to the design evaluating apparatus for assisting circuit-board-assembly in the fourth aspect of the present invention, information contained in the recording medium is read by the design evaluating apparatus for assisting circuit-board-assembly, making it possible to execute either the first design evaluation or the second design evaluation or both the first design evaluation and the second design evaluation prior to the engineering-trial manufacture of the component-mounted-circuit board. Therefore, the circuit designer is enabled to evaluate his or her own design by himself or herself with, for example, a personal computer. Also, since the evaluation of the circuit design is enabled at the time point, for example, when the circuit design and electronic-components selection has been completed, problematic points in assembly cost and assembly process can be grasped prior to the engineering-trial manufacture of a circuit board. Further, it becomes possible to perform a relative comparison between the circuit of the present design and a circuit of conventional design, and further to discuss issues of assemblability on a scale common to the three divisions of the circuit design, the production technology and the assembly. More specifically, since failures that would occur during the production of the circuit can be grasped in advance, solutions to the failures can be taken in advance, so that the development lead time can be reduced and that the number of times of engineering-trial manufacture can be reduced. Also, product quality of the circuit can be improved, and a cost reduction as well as an optimization of production efficiency can be achieved.

BRIEF DESCRIPTION OF THE DRAWINGS

These and other objects and features of the present invention will become clear from the following description taken in conjunction with the preferred embodiments thereof with reference to the accompanying drawings, in which:

FIG. 12 is a view showing information to be entered by a designer in the design evaluating method which is the embodiment of the present invention;

FIG. 14 is a view showing a score distribution and a grading method for the circuit progression;

FIG. 15 is a view showing actual evaluation results of the circuit progression;

FIG. 18 is a view showing the score distribution and the grading method for the evaluation of compliance with the design criteria;

FIG. 19 is a view showing actual evaluation results of the evaluation of compliance with the design criteria;

FIG. 21 is a view showing a score distribution and a grading method for the evaluation of compliance with the know-how items;

FIG. 22 is a view showing actual evaluation results of the evaluation of compliance with the know-how items;

FIG. 24 is a view showing a score distribution and a grading method for the evaluation of assembly easiness;

FIG. 25 is a view showing the score distribution and the grading method for the evaluation of assembly easiness;

FIG. 26 is a view showing actual evaluation results of the evaluation of assembly easiness;

FIG. 28 is a view showing a standard structure as well as a score distribution and a grading method for evaluation of a standard process in the first design evaluation in the design evaluating method which is the embodiment of the present invention;

FIG. 31 is a view showing the standard structure as well as conditions constituting the standard structure;

FIG. 32 is a view showing conditions other than the conditions shown in FIG. 31;

FIG. 33 is a view showing actual evaluation results of the standard structure evaluation;

FIG. 34 is a view showing a score distribution in the first design evaluation;

FIG. 35 is a view showing a score distribution and a grading method for evaluation of compliance with design criteria in a second design evaluation in the design evaluating method which is the embodiment of the present invention;

FIG. 36 is a view showing a score distribution and a grading method for evaluation of compliance with know-how items in the second design evaluation in the design evaluating method which is the embodiment of the present invention;

FIG. 37 is a view showing a score distribution and a grading method for evaluation of board design and pattern design in the second design evaluation in the design evaluating method which is the embodiment of the present invention;

FIG. 38 is a view showing a score distribution and a grading method for the evaluation of board design and pattern design in the second design evaluation in the design evaluating method which is the embodiment of the present invention;

FIG. 40 is a view showing information to be entered by a designer in the second design evaluation;

FIG. 42 is a view showing actual evaluation results of the board design and pattern design;

FIG. 43 is a view showing actual evaluation results of the first design evaluation;

FIG. 45 is a view showing actual evaluation results of the second design evaluation;

FIG. 47 is a view showing actual evaluation results of totaling the first design evaluation and the second design evaluation;

FIG. 49 is a view showing the standard process;

FIG. 51 is a view showing examples of contents of items falling under ranks C, D in the evaluation of compliance with design criteria;

FIG. 52 is a view showing examples of contents of items falling under ranks C, D in the evaluation of compliance with know-how items;

FIG. 54 is a view showing a component database included in the standard database;

FIG. 55 is a view showing a component database included in the standard database;

FIG. 56 is a view showing a component database included in the standard database;

FIG. 57 is a view showing a component database included in the standard database;

FIG. 58 is a view showing a component database included in the standard database;

FIG. 59 is a view showing a component database included in the standard database;

FIG. 60 is a view showing a component database included in the standard database;

FIG. 61 is a view showing a component database included in the standard database;

FIG. 62 is a view showing the arrangement of FIGS. 54 to 61;

FIG. 63 is a view showing a circuit block commonization/sharing database included in the standard database;

FIG. 64 is a view showing a circuit block commonization/sharing database included in the standard database;

FIG. 65 is a view showing an equipment/setup/test database included in the standard database;

FIG. 66 is a view showing an equipment/setup/test database included in the standard database;

FIG. 67 is a view showing a board cost database included in the standard database;

FIG. 69 is a view showing a board machining cost database included in the standard database;

FIG. 70 is a view showing a component machining/assembling cost database included in the standard database;

FIG. 71 is a view showing a board structure database included in the standard database;

FIG. 72 is a view showing a number of wiring layers vs. mounting density table included in the standard database;

FIG. 74 is a view showing a design-criteria evaluation database included in the standard database;

FIG. 76 is a view showing a design-criteria evaluation database included in the standard database;

FIG. 77 is a view showing the arrangement of FIGS. 73 to 76;

FIG. 79 is a view showing know-how item evaluation database included in the standard database;

FIG. 80 is a view showing the arrangement of FIGS. 78 and 79;

FIG. 81 is a view showing a working rate database included in the standard database;

FIG. 82 is a view showing relational information of a conductor minimum width and a pattern/resist formation included in the standard database;

FIG. 83 is a view showing a number of wiring layers vs. mounting density database included in the standard database;

FIG. 84 is a view showing a number-of-via-hole and number-of-through-hole database included in the standard database;

FIG. 85 is a view showing calculation results of assembly cost; and

DETAILED DESCRIPTION OF THE PREFERRED EMBODIMENTS

Figure 1:
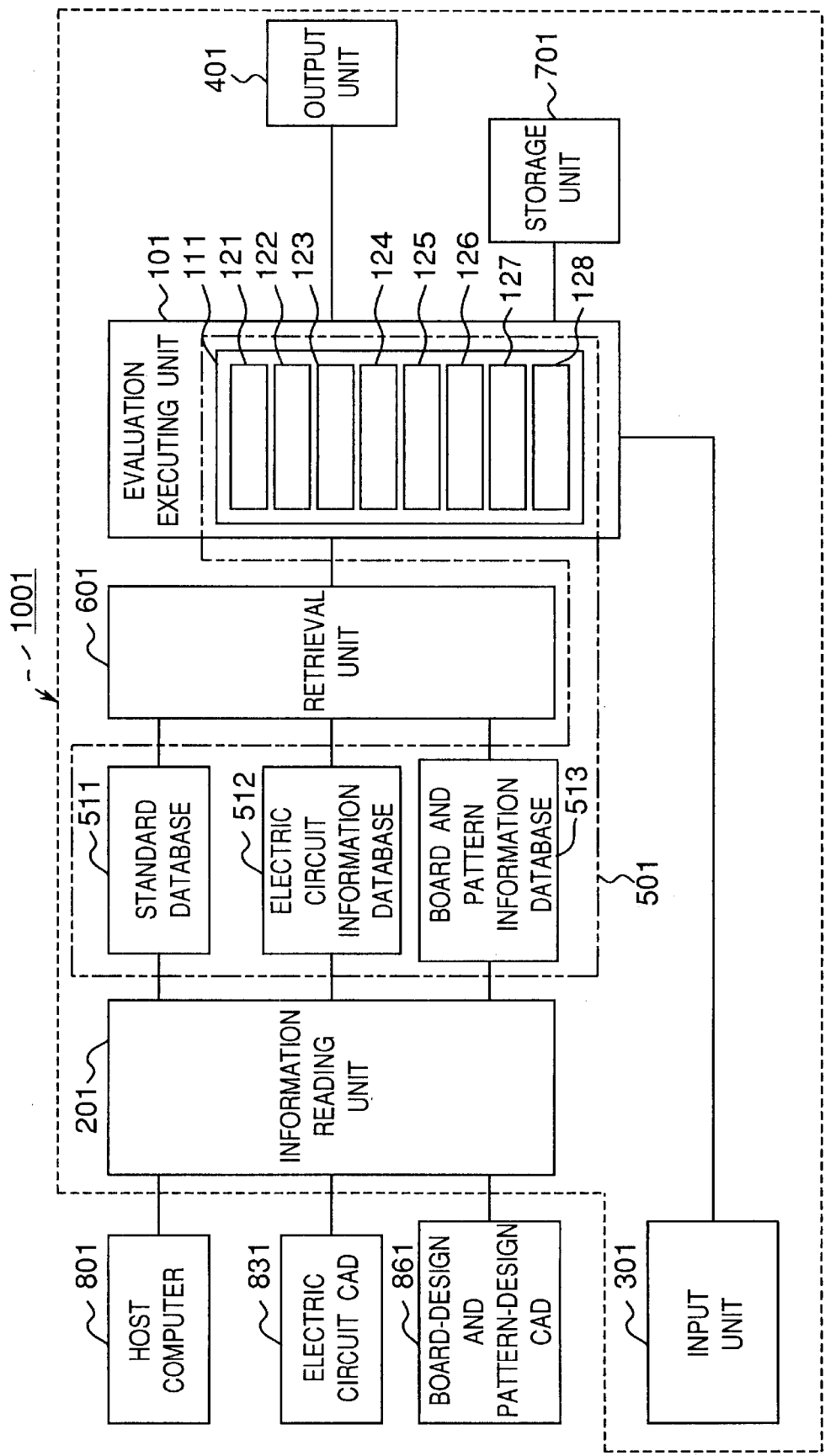
FIG. 1 is a block diagram of a design evaluating apparatus for assisting a circuit-board-assembly, which is an embodiment of the present invention.

Embodiments of the present invention including a design evaluating method for assisting a circuit-board-assembly (hereinafter, may be referred to "circuit-board-assembly assist design evaluating method"), a design evaluating apparatus for assisting the circuit-board-assembly (hereinafter, may be referred to "circuit-board-assembly assist design evaluating apparatus") which executes the design evaluating method, and a computer-readable recording medium having recorded thereon design evaluating programs for assisting the circuit-board-assembly, the programs executing the design evaluating method, are described below with reference to the accompanying drawings. It is noted that like constituent parts are designated by like reference numerals throughout the drawings.

First, the design evaluating apparatus for assisting the circuit-board-assembly is explained.

The design evaluating apparatus for assisting the circuit-board-assembly (hereinafter, referred to simply as "evaluating apparatus") 1001 of this embodiment is an apparatus which, with respect to a designed circuit so as to fulfill at least one desired function of a system based on its system design as well as to selection of electronic components to be used in the circuit, enables a first design evaluation to be done at a stage that circuit diagrams have been prepared prior to an engineering-trial manufacture of a component-mounted-circuit board mounted the electronic components on a circuit board. The first design evaluation being that, for example, a designer himself or herself evaluates an assemblability of the designed circuit. It is noted that the engineering-trial manufacture means to actually make the component-mounted-circuit board without including, for example, simulations on a computer and, more specifically, to manufacture the component-mounted-circuit board so that the engineering-trial manufactured component-mounted-circuit board, if successful as a result of performance evaluation thereof, can be shifted to mass production. Therefore, the engineering-trial manufacture is carried out with the same assembling operations as in assembling the mass-produced circuit boards. The assembling operations, more specifically, include a manufacture of a circuit board based on the circuit-board design drawings, a mounting of electronic components onto the manufactured circuit board, and a junction between electrodes of the mounted electronic components and electrodes formed in the circuit board.

Further, the evaluating apparatus 1001 is the apparatus which enables a second design evaluation to be done at a stage that a board pattern design of the designed circuit has been completed prior to the engineering-trial manufacture of the component-mounted-circuit board, the second design evaluation being that, for example, the designer himself or herself evaluates the assemblability of the circuit with respect to circuit board design and pattern design of the circuit board.

In this embodiment, as will be detailed later, either the first design evaluation or the second design evaluation, or both the first design evaluation and the second design evaluation are executed prior to the engineering-trial manufacture of the component-mounted-circuit board. However, for example when a component-mounted-circuit board of the engineering-trial manufacture has so high a degree of completion thereof as to nearly ensure in advance that its performances satisfy required specifications, there is a possibility that the component-mounted-circuit board is entered into the mass production immediately without performing the engineering-trial manufacture. In such a case, it is also possible to confirmatively execute either the first design evaluation or the second design evaluation, or both the first design evaluation and the second design evaluation, in which case the terms "prior to the engineering-trial manufacture of the component-mounted-circuit board" can be replaced by "prior to the mass production".

In addition, the first design evaluation and the second design evaluation in this embodiment are executed not for the engineering-trial manufacture of the component-mounted-circuit board but for the component-mounted-circuit board to be mass produced.

As described above, in the conventional art, the evaluation of assemblability of a designed circuit would be executed after the trial manufacture of a component-mounted-circuit board. Therefore, it has conventionally been impossible to execute the first design evaluation and the second design evaluation, which are evaluation of assemblability of a designed circuit comprehensively on a scale common to three divisions of a design, a production technology and a manufacture, prior to the engineering-trial manufacture of the component-mounted-circuit board, as is done by the evaluating apparatus 1001.

Figure 5:
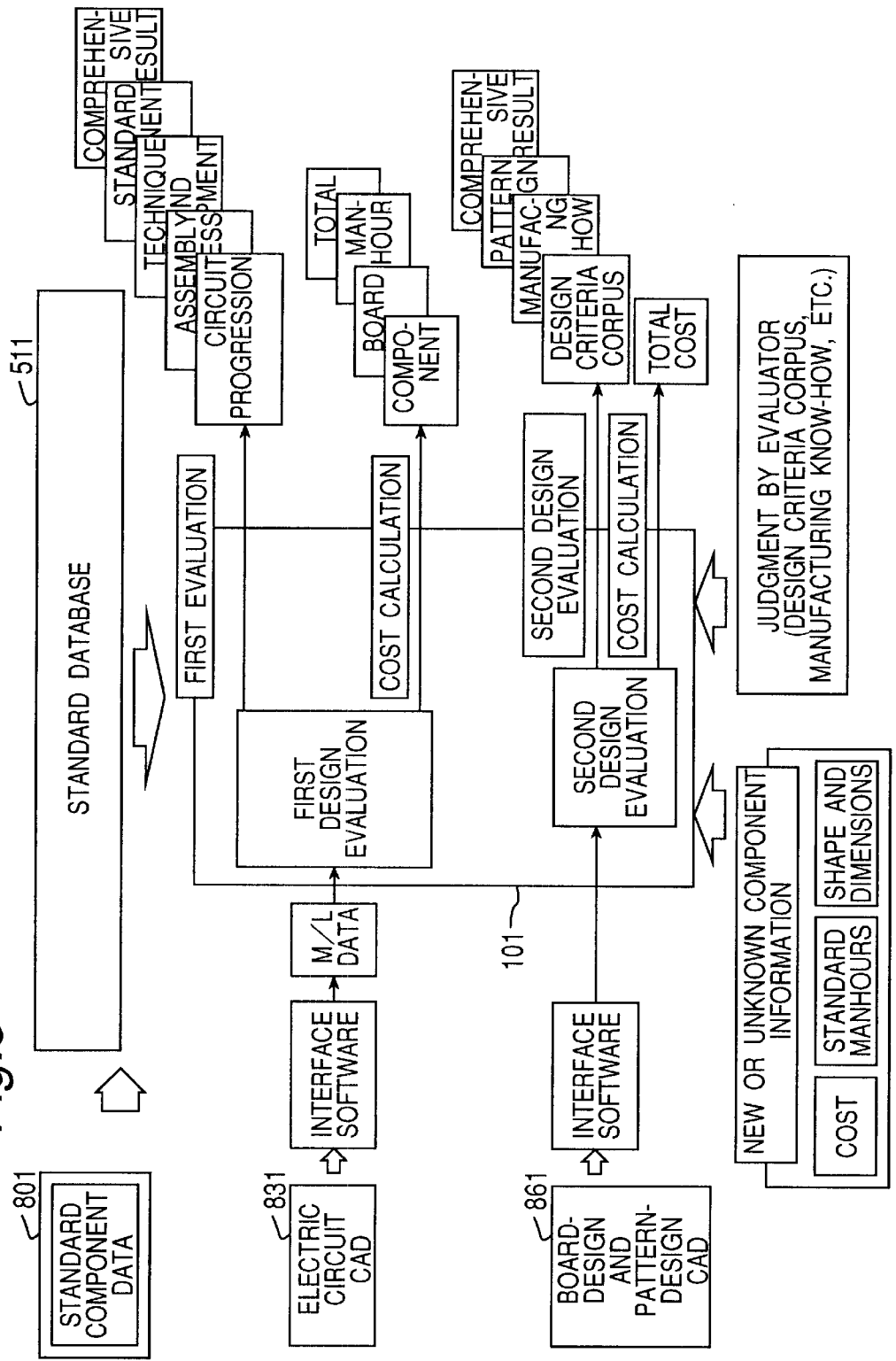
FIG. 5 is a view for explaining the outline of the design evaluating method which is an embodiment of the present invention.

The evaluating apparatus 1001 like this, as shown in FIG. 1, roughly comprises an evaluation executing unit 101, an information reading unit 201 to be connected to the evaluation executing unit 101, an input unit 301 composed of a keyboard, a mouse and the like, an output unit 401 such as a display device or a printer for visibly outputting result information, a design evaluation database 501, a retrieval unit 601 and a storage unit 701. FIG. 5 shows a schematic data flow in the evaluating apparatus 1001. In addition, the evaluating apparatus 1001 in this embodiment is structured by, for example, a laptop personal computer that allows programs usable in this embodiment to be pre-installed or be able to be installed.

Figure 3:
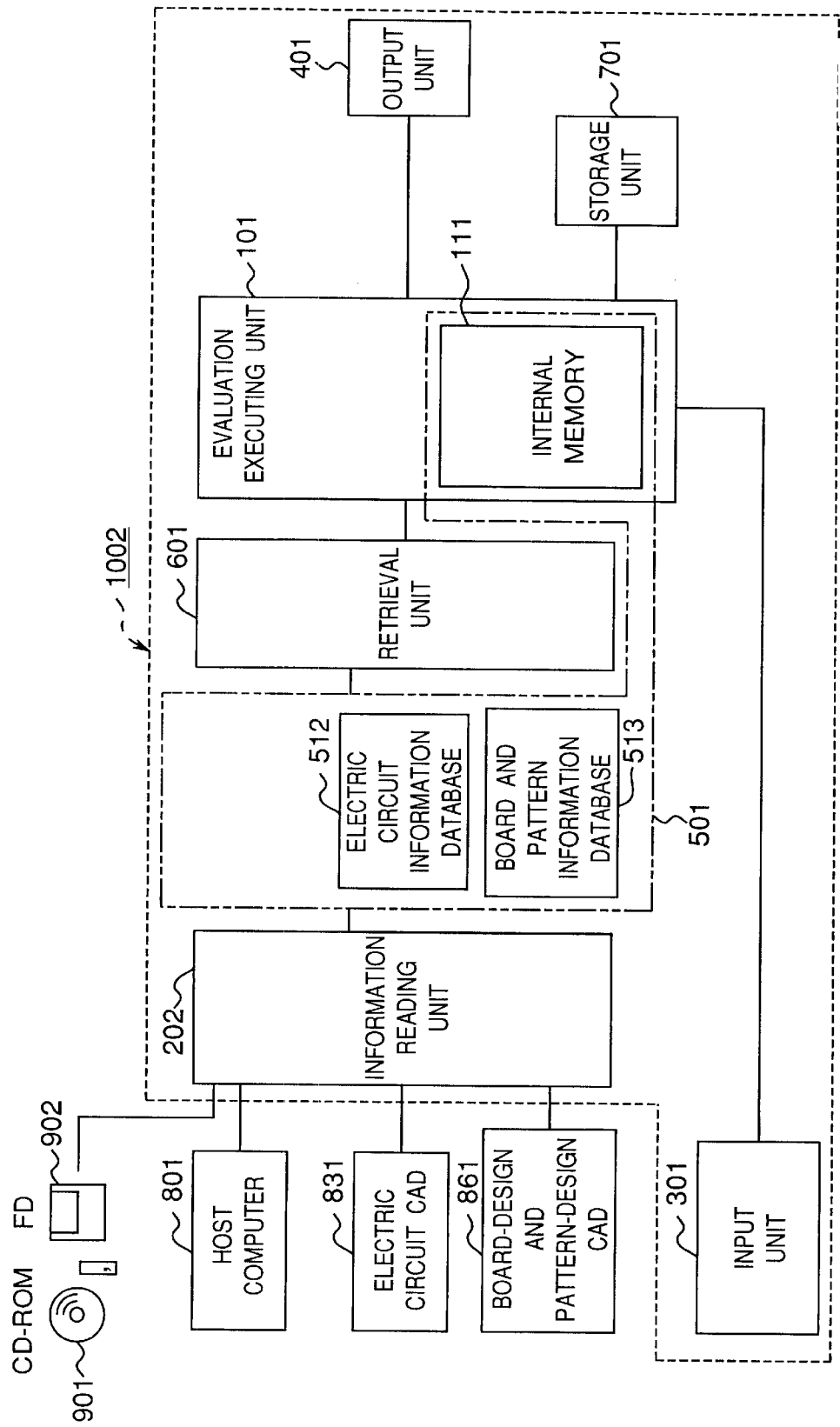
FIG. 3 is a block diagram of a modification of the design evaluating apparatus shown in FIG. 1.

The information reading unit 201 is a device which is connected to a host computer 801, a CAD (Computer Aided Design) 831 for electric circuits, a CAD 861 for board design and pattern design, and the like, and which reads information from these devices. Otherwise, like an information reading unit 202 of evaluating apparatus 1002 as shown in FIG. 3, the information reading unit may be so constructed as to read recorded information from such information recording media as a floppy disk (FD) 902 having recorded thereon information in a standard database, evaluation information and the like as described later, or a read only memory (CD-ROM) 901 implemented by a compact disk.

Operations of the constituent sections as described above are briefly described below.

Information to be read by the information reading unit 201 from the host computer 801 in this embodiment includes unit-price information on presently purchasable electronic components, and electronic component specifying information for specifying electronic components. The electronic component specifying information, in this embodiment, is information as to component number, component name, manufacturer name and manufacturer's product number of the electronic components. The information to be read by the information reading unit 201 from the electric circuit CAD 831 in this embodiment includes information as to the number, name and use-quantity of electronic components used in a designed circuit in addition to general information such as design date. Board pattern information to be read by the information reading unit 201 from the board-design and pattern-design CAD 861 includes information as to a mounting position of each electronic component on the circuit board, information as to outer dimensions of individual piece boards in the case of multi-board yield production, board coordinates representing the positions and dividing positions of the individual piece boards, and information as to a mounting direction of each electronic component on the circuit board in addition to general information such as design date. In addition, although manually entered by an evaluator, such as a designer or an operator, in this embodiment as will be described later, such information as total-wiring-length information of a wiring pattern of the designed circuit, outside-dimension information of the circuit board, number-of-layers information of the circuit board, each information as to the number, diameter and position of through holes formed in the circuit board, each information as to the number, diameter and position of electronic-component insertion holes formed in the circuit board, and each information as to the number, position and branch length of pattern branches may be read by the information reading unit 201 directly from the board-design and pattern-design CAD 861, by way of a modification of the embodiment. It is noted that the terms "number of layers of circuit board" and "number of wiring layers" are herein used in the same meaning.

Also, in this embodiment, as described above, the electric circuit information and the board pattern information are read by the information reading unit 201 from the electric circuit CAD 831 and the board-design and pattern-design CAD 861 directly into the evaluating apparatus 1001 by means of interface software for converting the information into data that can be treated by the evaluating apparatus 1001, respectively. However, without being limited to this, the information may also be supplied as information recorded on a recording medium such as a floppy disk or via a communication line.

These pieces of information read by the information reading unit 201 in this way are stored in the evaluating apparatus 1001 as the design evaluation database 501. The design evaluation database 501 in this embodiment includes the standard database 511 described later, an electric circuit information database 512 for storing information supplied from the electric circuit CAD 831, a board and pattern information database 513 for storing information supplied from the board-design and pattern-design CAD 861, and a database stored in an internal memory 111 provided in the evaluation executing unit 101. In the evaluating apparatus 1001, the internal memory 111 has stored therein a first design evaluation program 121 necessary for executing the first design evaluation, target-circuit-design information and target-components-selection information 122 necessary for target circuit design and target components selection, both of which are targeted for improvement in the quality of design and assembly operation as well as for cost reduction, first evaluation information 123 for numerically evaluating the circuit design and the components selection in actually designed circuit against the target-circuit-design information and target-components-selection information, first-design-evaluation question information 127 which is questionnaire for the evaluator to enter information necessary for the first design evaluation, and further, a second design evaluation program 124 necessary for executing the second design evaluation, target-board-design information and target-pattern-design information 125 necessary for target board design and target pattern design, both of which are targeted for improvement in the quality of design and assembly operation as well as for cost reduction, second evaluation information 126 for numerically evaluating the board design and the pattern design of actually designed circuit against the target-board-design information and the target-pattern-design information, and second-design-evaluation question information 128 which is questionnaire for the evaluator to enter information necessary for the second design evaluation. As will be detailed later, the target-circuit-design information and target-component-selection information 122, and the target-board-design information and target-pattern-design information 125 are, actually, targeted numerical values or score information corresponding to later-described graded ranks, and the first evaluation information 123 and the second evaluation information 126 are, actually, for example, calculation equations, later-described graded ranks or the like for executing numerical evaluation.

Figure 2:
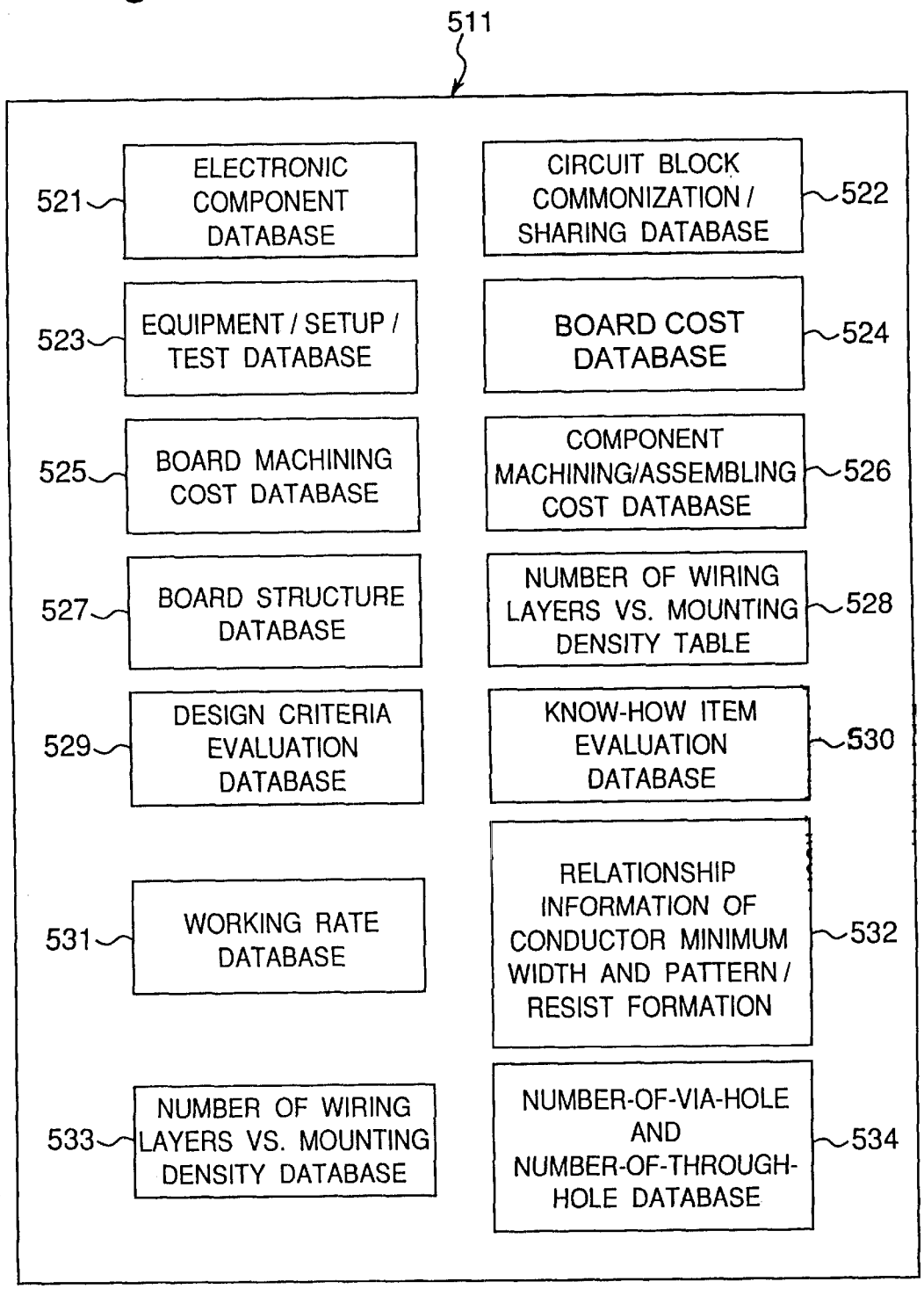
FIG. 2 is a view showing information contained in a standard database shown in FIG. 1.

In the standard database 511, the following information is stored in this embodiment as shown in FIG. 2. That is, the information includes an electronic component database 521, a circuit block commonization/sharing database 522, an equipment/setup/test database 523, a board cost database 524, a board machining cost database 525, a component machining/assembling cost database 526, a board structure database 527, a number of wiring layers vs. mounting density table 528, a design criteria evaluation database 529, a know-how item evaluation database 530, a working rate database 531, a relationship information 532 between a conductor minimum width and pattern/resist formation, a number of wiring layers vs. mounting density database 533, and a number-of-via-hole and number-of-through-hole database 534. These databases are briefly described below.

Figure 68:
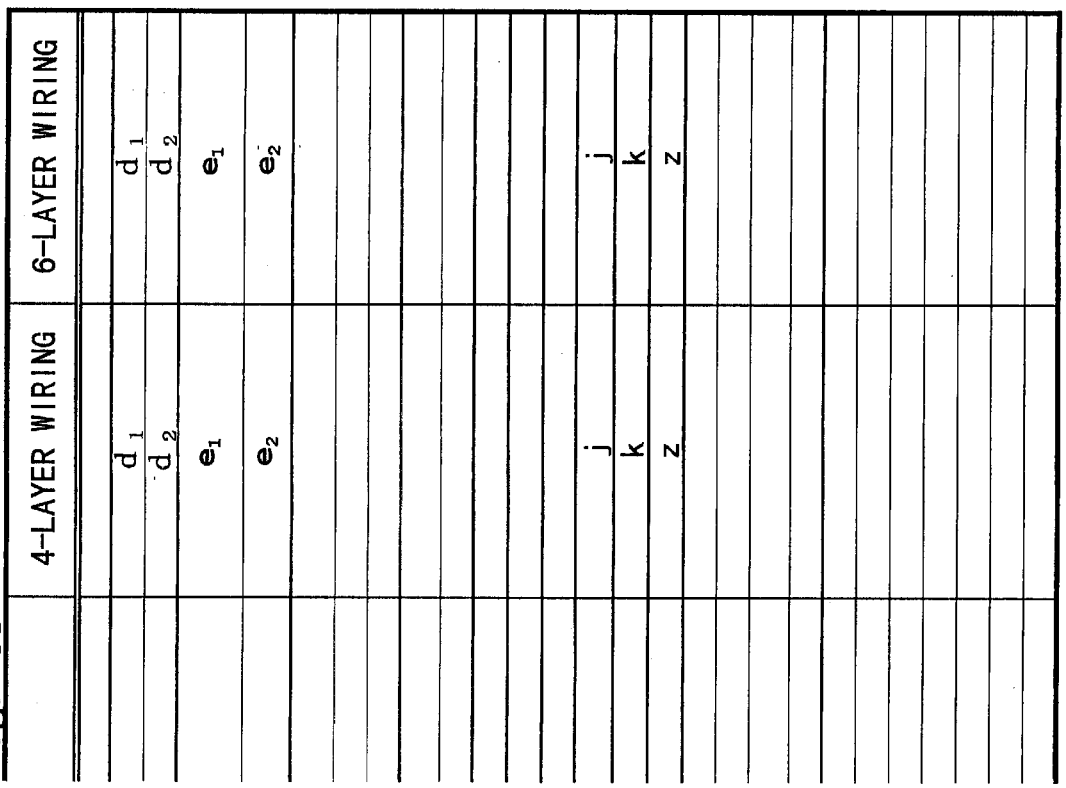
FIG. 68 is a view showing a board cost database included in the standard database.
Figure 73:
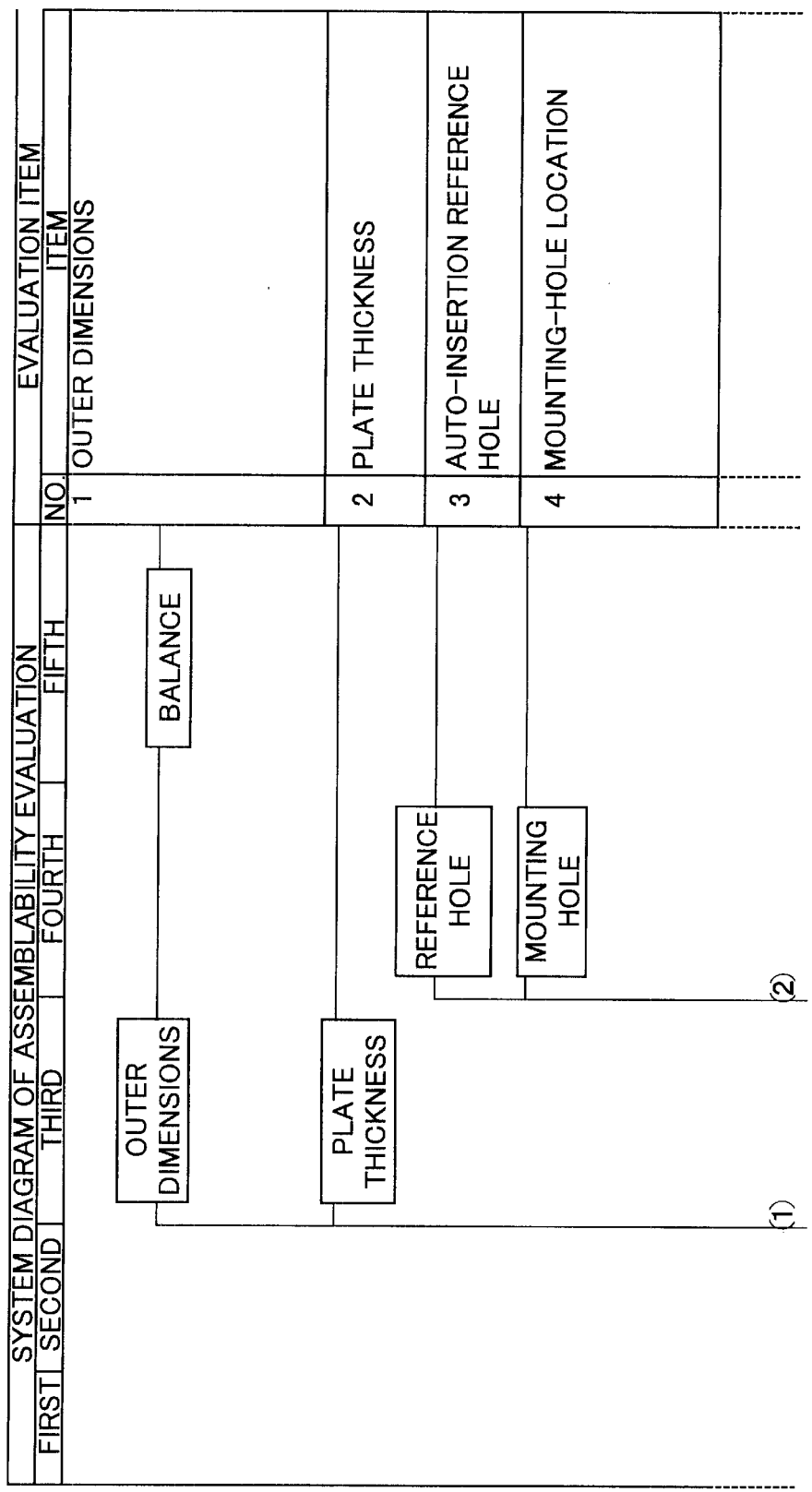
FIG. 73 is a view showing a design-criteria evaluation database included in the standard database.
Figure 75:
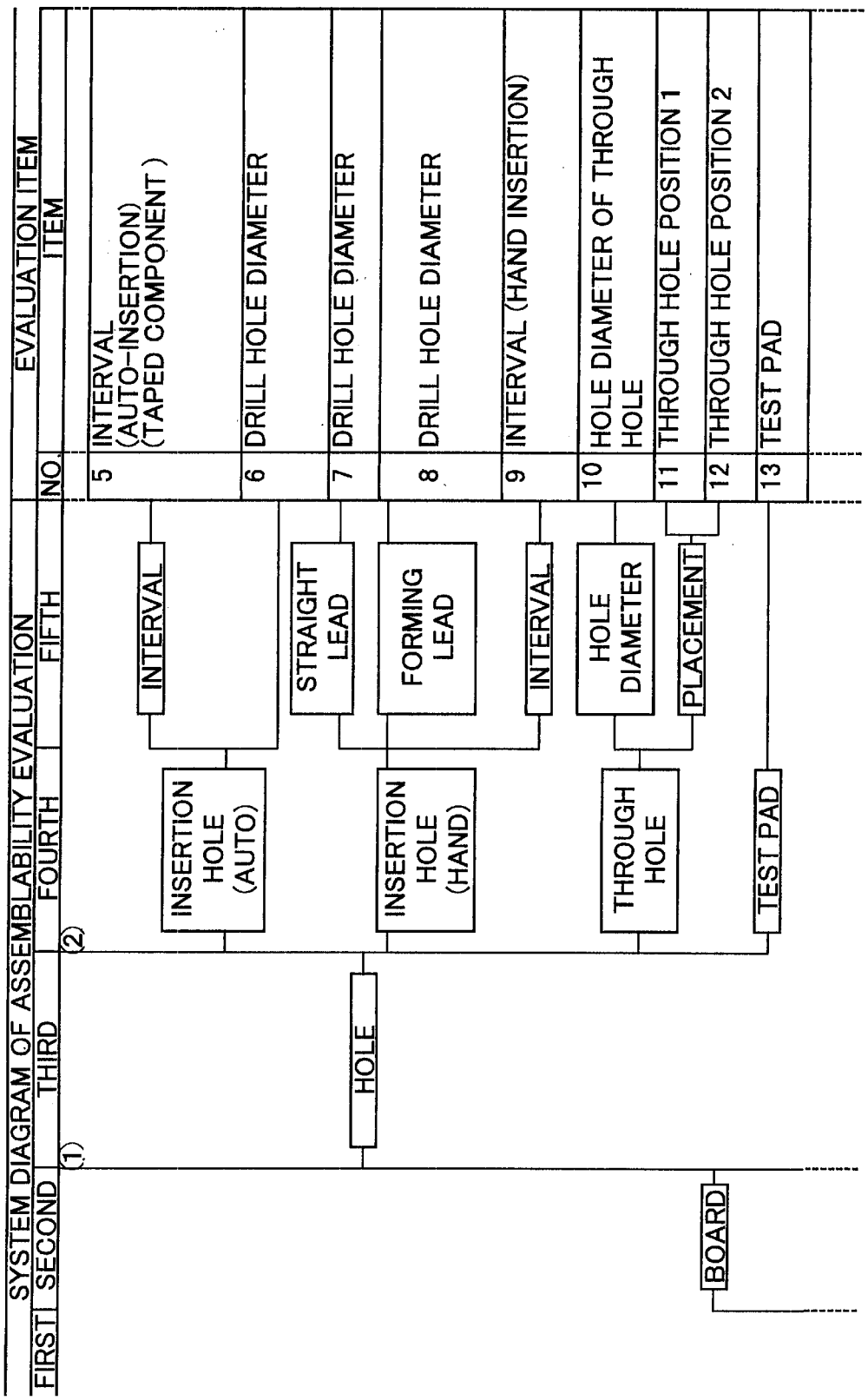
FIG. 75 is a view showing a design-criteria evaluation database included in the standard database.
Figure 78:
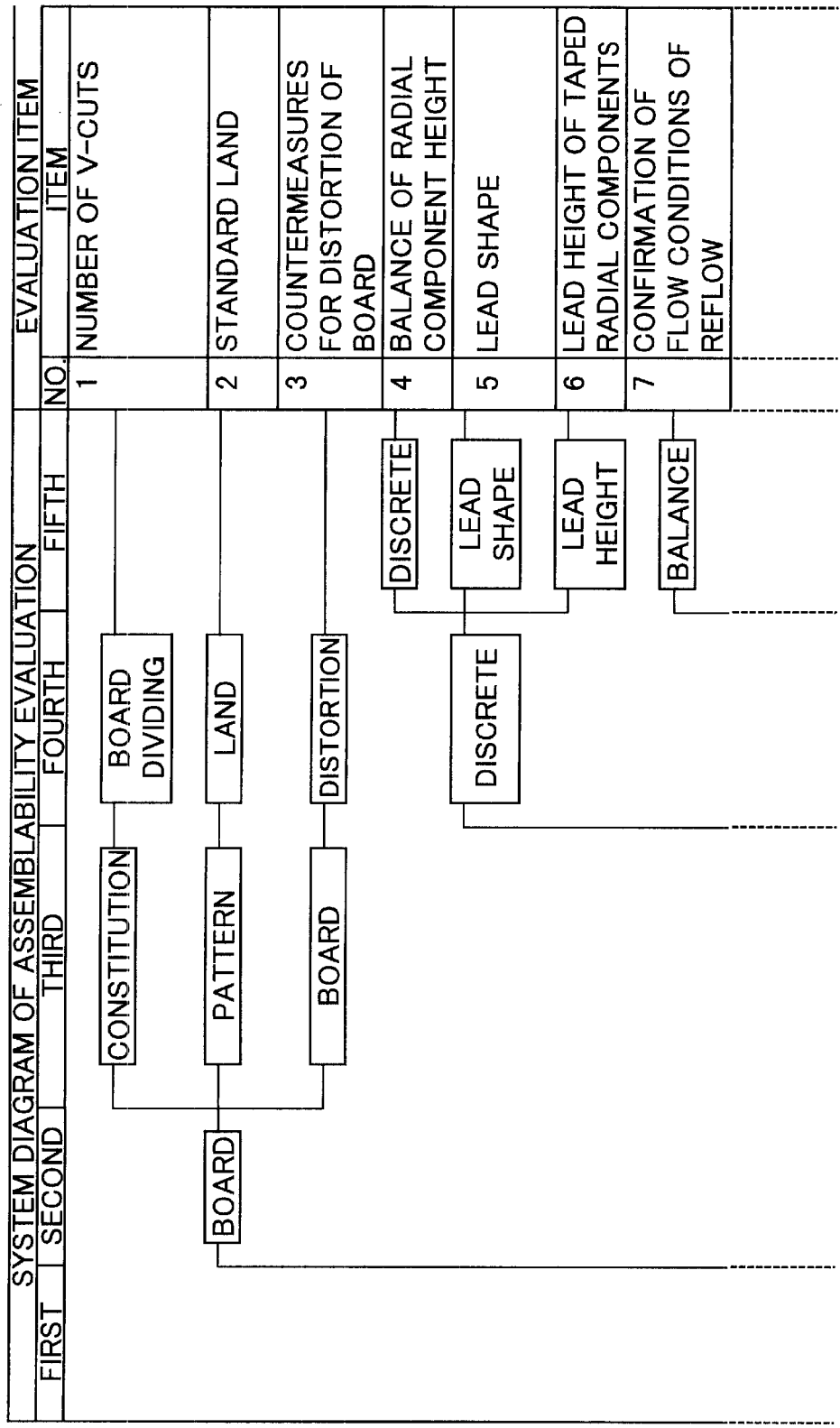
FIG. 78 is a view showing a know-how item evaluation database included in the standard database.

The electronic component database 521 is a database having stored therein information corresponding to each of such items as "supplier", "machine-mounting man-hours (min.)" and "hand-mounting man-hour (min.)", etc. for all the electronic components supplied from the host computer 801 as partly shown in FIGS. 54 to 61. In addition, the machine-mounting man-hour and the hand-mounting man-hour are taken as "component-mounting cost information". It is noted here that FIGS. 54 to 61 could be shown in one drawing but are divided for sheet space' sake, and FIG. 62 shows an arrangement relation of FIGS. 54 to 61. The circuit block commonization/sharing database 522 is a database having stored therein information corresponding to each of such items as "the number of components", "the number of capacitors" and "the number of through holes" for each of circuit blocks such as converter, inverter and CPU, as shown in FIGS. 63 and 64. The equipment/setup/test database 523 is a database having stored therein information corresponding to each of such items as "equipment-requiring time" and "the number of components to be mounted", etc. for each of such machines as a SPP and a HDP, as shown in FIGS. 65 and 66. It is noted that the SPP, the HDP and the like are machine names; for example, the SPP shows a solder cream printing machine, and the HDP shows an adhesive applicator. The board cost database 524 is a database having stored therein cost information corresponding to each wiring layer for each of such items as (A) board cost and (B) variable cost, etc. as shown in FIGS. 67 and 68. The board machining cost database 525 is a database having stored therein man-hour information corresponding to each of machining contents for the circuit board as shown in FIG. 69. The component machining/assembling cost database 526 is a database having stored therein man-hour information corresponding to each of machining contents for the electronic component as shown in FIG. 70. The board structure database 527 is a database having stored therein board-structure graded rank information for each of wiring method in the circuit board, electronic-component mounting method, soldering method and circuit type as shown in FIG. 71. The number of wiring layers vs. mounting density table 528 is a database having stored therein graded rank information corresponding to mounting density of electronic components for each range of the number of wiring layers as shown in FIG. 72. The design criteria evaluation database 529 is a database having stored therein information such as design criteria, etc. for each of the design criteria items as partly shown in FIGS. 73 to 76. It is noted that FIGS. 73 to 76 could be shown in one drawing but are divided for sheet space' sake, and FIG. 77 shows the arrangement relation of FIGS. 73 to 76. The know-how item evaluation database 530 is a database having stored therein information as to an evaluation criteria and the like for each of know-how items related to assembly as partly shown in FIGS. 78 and 79. It is noted that FIGS. 78 and 79 could be shown in one drawing but are divided for sheet space' sake, and FIG. 80 shows the arrangement relation of FIGS. 78 and 79. The working rate database 531 is a database having stored therein worker wage information and equipment rate information as shown in FIG. 81. The conductor minimum width to pattern/resist formation relationship information 532 is a database having stored therein information as to methods adopted for a pattern formation method and a resist formation method in correspondence to a conductor minimum width as shown in FIG. 82. The number of wiring layers vs. mounting density database 533 is a database having stored therein information as to model name and the like to be used according to the number of wiring layers for each circuit block as shown in FIG. 83. The number-of-via-hole and number-of-through-hole database 534 is a database having stored therein information such as the number of via holes and the number of through holes per unit area according to the number of wiring layers for each circuit block as shown in FIG. 84.

It is noted that the information shown in FIGS. 54 to 61, FIGS. 63 to 76, FIG. 78, FIG. 79 and FIGS. 81 to 84 is by way of example, of course.

The retrieval unit 601 extracts information necessary for the first design evaluation and the second design evaluation from the design evaluation database 501, and sends the information to the evaluation executing unit 101. In addition, the information stored in the internal memory 111 is retrieved and read directly by the evaluation executing unit 101.

Based on the information extracted by the retrieval unit 601, the information stored in the internal memory 111 and the information entered from the input unit 301 by the evaluator for the execution of the first design evaluation and the second design evaluation, the evaluation executing unit 101 executes the first design evaluation and the second design evaluation, and further makes evaluation results displayed on the output unit 401, and stores the results in the storage unit 701. In addition, detailed operations of the evaluation executing unit 101 will be described later.

Also, in the execution of the first design evaluation and the second design evaluation, if necessary information is not contained in the standard database 511 or the like, the evaluation executing unit 101 displays at least one question about new or unknown information on the output unit 401, enabling the entry of the new or unknown information by an interactive form with the evaluator via the input unit 301. Besides, the evaluation executing unit 101 enables entry of decision items for the evaluator such as a later-described design criteria specification and manufacturing know-how items, etc., also by an interactive form with the evaluator. It is noted that the information to be entered from the input unit 301 by the evaluator is not limited to the supply by input operation by the evaluator as shown above, but may be supplied by download to the control unit 101 via communication line.

Figure 4:
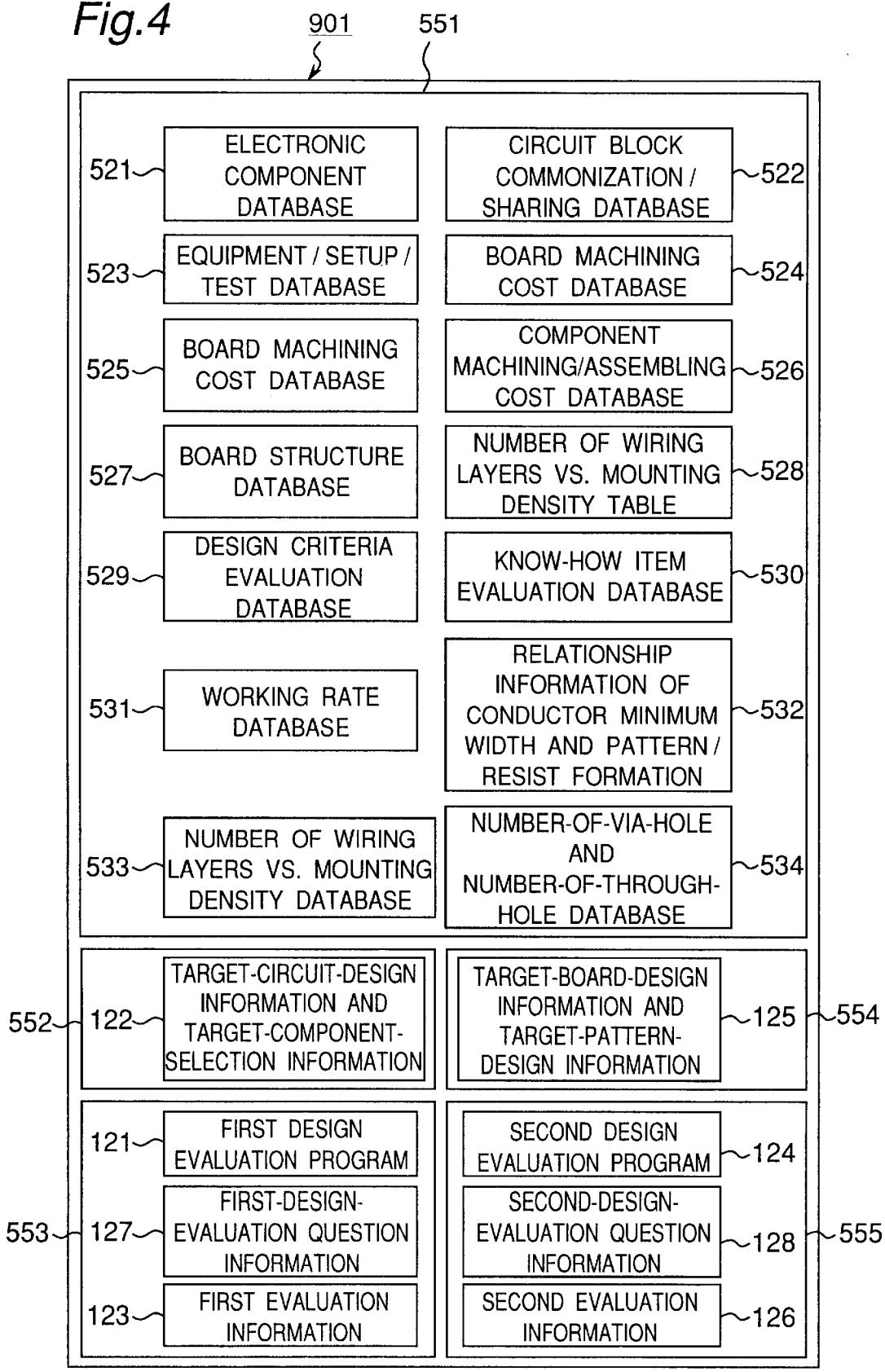
FIG. 4 is a view showing information recorded on a recording medium shown in FIG. 1.
Figure 10:
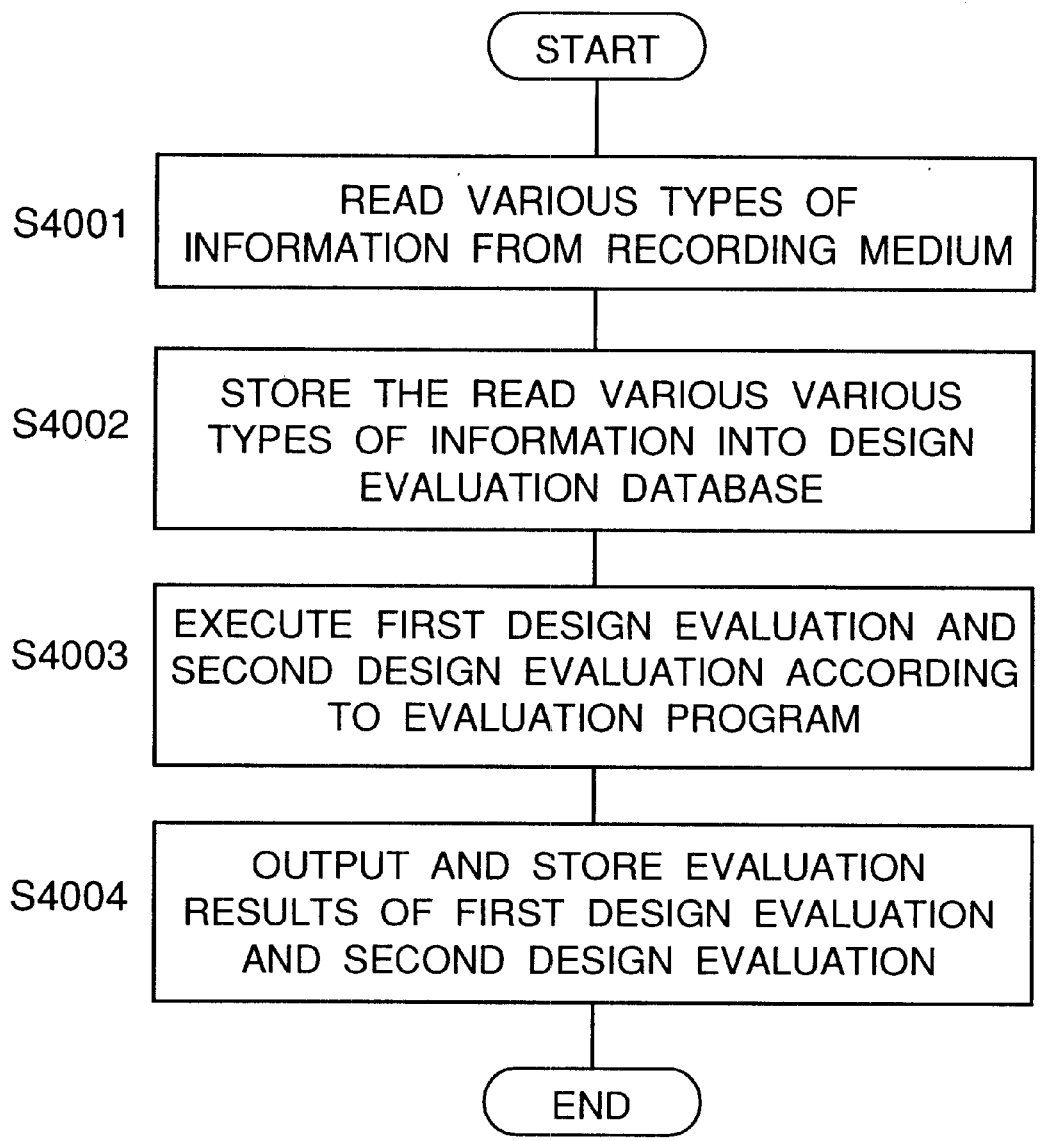
FIG. 10 is a flow chart for a process wherein the design evaluating apparatus shown in FIG. 3 reads a program for circuit-board-assembly aid design evaluation from the recording medium and executes design evaluation.

Meanwhile, in the case of the evaluating apparatus 1002 described above, as shown in FIG. 10, at step 4001, from the standard database 511 as well as from the recording medium, such as the CD-ROM 901 or the FD 902, having recorded thereon the information of the first design evaluation program 121, the target-circuit-design information and target-components selection information 122, the first evaluation information 123, the second design evaluation program 124, the target-board-design information and target-pattern-design information 125, the second evaluation information 126, the first-design-evaluation question information 127, and the second-design-evaluation question information 128, these pieces of information are read. At step 4002, these information are stored in the design evaluation database 501 provided in the evaluating apparatus 1002. Accordingly, the CD-ROM 901 as an example of the recording medium, as shown in FIG. 4, has a standard database region 551 which is a region for the standard database 511, a target-circuit-design information and target-components-selection information region 552 which is a region for the target-circuit-design information and target-components-selection information 122, a first-design-evaluation program region 553 which is a region for the first design evaluation program 121, the first evaluation information 123 and the first-design-evaluation question information 127, a target-board-design information and target-pattern-design information region 554 which is a region for the target-board-design information and target-pattern-design information 125, and a second-design-evaluation program region 555 which is a region for the second design evaluation program 124, the second evaluation information 126 and the second-design-evaluation question information 128. Next, at step 4003, based on the read first design evaluation program 121, first evaluation information 123, second design evaluation program 124 and second evaluation information 126, as well as on information supplied by the evaluator in response to the first-design-evaluation question information 127 and the second-design-evaluation question information 128, the first design evaluation and the second design evaluation are executed. At step 4004, results of the respective evaluations are outputted and stored.

Otherwise, it is possible, with the standard database 511 preparatorily stored in the design evaluation database 501 of the evaluating apparatus 1002, to supply the first design evaluation program 121, the target-circuit-design information and target-components-selection information 122, the first evaluation information 123, the second design evaluation program 124, the target-board-design information and target-pattern-design information 125, the second evaluation information 126, the first-design-evaluation question information 127 and the second-design-evaluation question information 128 from the recording medium to the evaluating apparatus 1002. It is noted that the recording medium in this case has the target-circuit-design information and target-components-selection information region 552, the first-design-evaluation program region 553, the target-board-design information and target-pattern-design information region 554 and the second-design-evaluation program region 555.

Conversely, it is also possible, with the first design evaluation program 121, the target-circuit-design information and target-components-selection information 122, the first evaluation information 123, the second design evaluation program 124, the target-board-design information and target-pattern-design information 125, the second evaluation information 126, the first-design-evaluation question information 127 and the second-design-evaluation question information 128 preparatorily stored in the internal memory 111 of the evaluation executing unit 101, to supply the standard database 511 to the design evaluation database 501 by using the recording medium having stored therein the standard database 511.

It is, of course, possible to supply the information from a plurality of recording media having individually stored therein the above various types of information to the evaluating apparatus 1002.

Furthermore, the information contained in the standard database 511 may also be supplied by so-called download to the evaluating apparatus 1001 or evaluating apparatus 1002 via communication line without being limited to the supply from the recording medium as described above.

With regard to the evaluating apparatus 1001, 1002 constructed as shown above, representatively, operation of the evaluating apparatus 1001, that is, the circuit-board-assembly assist design evaluating method to be executed by the evaluating apparatus 1001 is described below.

The design and manufacture of a circuit board to be used in one system, for example, electronic equipment such as televisions and video cassette recorders to fulfill desired functions is carried out through the steps of system design, circuit design and components selection, the circuit board design and the pattern design, and engineering-trial manufacture of the electronic-component-mounted-circuit board, as described above.

Figure 6:
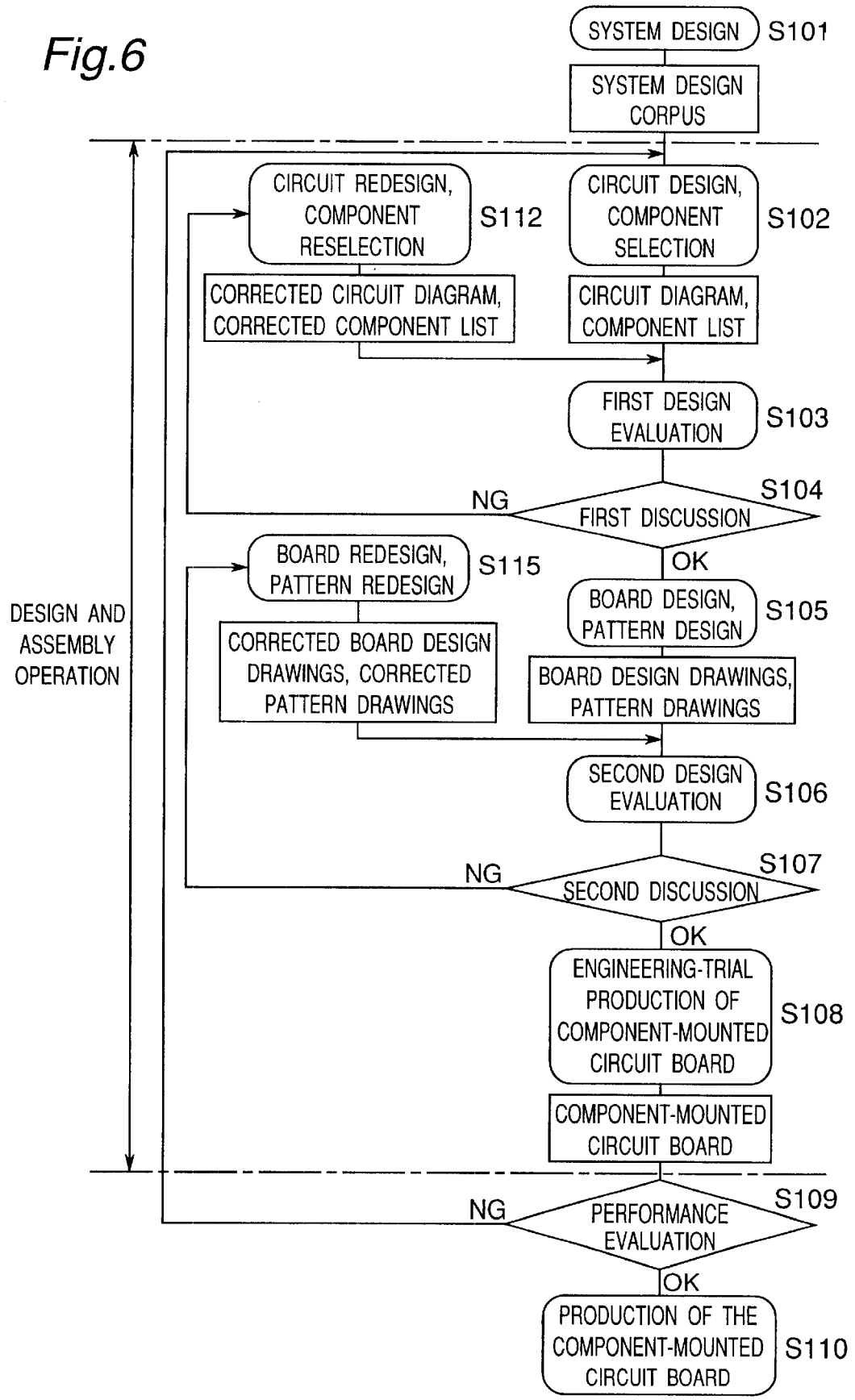
FIG. 6 is a flow chart showing the design evaluating method which is an embodiment of the present invention.

On the other hand, in the circuit-board-assembly assist design evaluating method of this embodiment, generally, the operations of steps 101 to 110, step 112, and step 115 are executed as shown in FIG. 6. More specifically, the system design is executed at step 101, and the circuit design and the components selection are executed based on a system design specification, in the same way as in the conventional art, at step 102 subsequent to step 101. Although both circuit design and electronic-components selection are executed at step 102. in this embodiment, only either one of them may be done. Then, at step 103 where the step 102 has been completed and the circuit diagram and an electronic-component list have been prepared, the first circuit-board-assembly assist design evaluation (hereinafter, referred to simply as "first design evaluation") that could not be executed in the conventional art and that characterizes the present embodiment is executed. In this first design evaluation, differences between an actually performed circuit design and a target circuit design, and between components selection and target components selection, the target circuit design and the target components selection which are targeted for improvement in the quality of the assembly operation of mounting electronic components onto the circuit board as well as for cost reduction, are numerically evaluated. Then, at step 104, discussions are made as to validity of result information of the first design evaluation, where if it is decided to be appropriate, process goes to the succeeding step 105; if it is decided to be inappropriate, the process goes to step 112. At the step 112, once again, the circuit design and the electronic components selection are executed, where the first design evaluation of the step 103 is executed once again based on corrected circuit diagrams and electronic-component list.

At step 105, with respect to the designed circuit, the circuit board design and the pattern design are executed as in the conventional art. At step 106 where the circuit board design and the pattern design have been completed and board design drawings and pattern drawings have been prepared, second circuit-board-assembly assist design evaluation (hereinafter, referred to simply as "second design evaluation") that characterizes this embodiment is executed. In this second design evaluation, differences between the actually performed circuit board design and the target circuit-board design, and between the pattern design and target pattern selection, the target circuit-board design and the target pattern selection which are targeted for improvement in the quality of the assembly operation of mounting electronic components onto the circuit board as well as for cost reduction, are numerically evaluated. Then, at step 107, discussions are made as to validity of result information of the second design evaluation, where if it is decided to be appropriate, the process goes to the succeeding step 108; if it is decided to be inappropriate, the process goes to step 115. At the step 115, once again, the circuit board design and pattern design are executed, where the second design evaluation of the step 106 is executed once again based on corrected circuit board design drawings and pattern drawings.

At step 108, aforementioned engineering-trial manufacture of a component-mounted-circuit board is carried out. At the succeeding step 109, the component-mounted-circuit board manufactured at step 108 is subjected to performance evaluation, where when given performances are obtained, mass production of the component-mounted-circuit board is started at step 110. On the other hand, although extremely rare in this embodiment, if the given performances are not obtained in the performance evaluation of the step 109, then, in this embodiment, the process returns to the step 102 again, where the circuit design and the electronic-components selection are redone. In addition, it is also possible to return to the step 112 or step 115 other than returning to the step 102.

As shown in FIG. 6, the range of the above-described "design and assembly operation" corresponds to the process from the step 102 to the step 108 at which the component-mounted-circuit board is completed, including the step 112 and the step 115.

Figure 86:
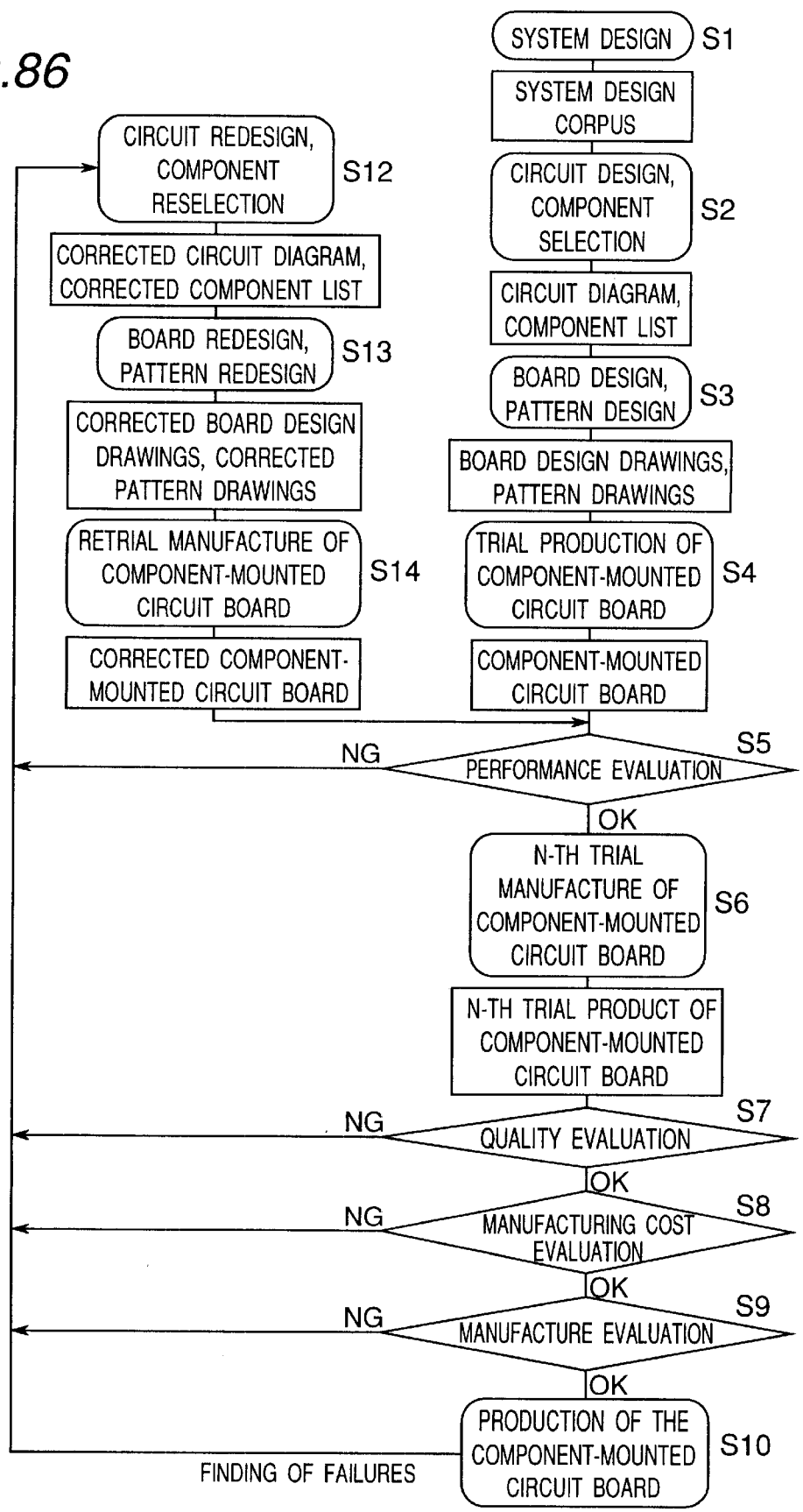
FIG. 86 is a flow chart showing a circuit-board design evaluating method according to the conventional art.

As apparent from a comparison between the above operations and the conventional art operations described with reference to FIG. 86, in the circuit-board-assembly assist design evaluating method of this embodiment, the circuit design and the electronic components selection (hereinafter, may be referred to "the circuit design and electronic components selection") as well as the circuit board design and the pattern design (hereinafter, may be referred to "the circuit board design and the pattern design") are evaluated prior to the engineering-trial manufacture of the component-mounted-circuit board, and then if results of these evaluations are inappropriate, the circuit design and electronic components selection, or the circuit board design and the pattern design are redone. Accordingly, it is extremely rare for the circuit-board-assembly assist design evaluating method of this embodiment that the performance evaluation with the electronic components mounted on the circuit board results in inappropriateness. Therefore, the circuit-board-assembly assist design evaluating method of this embodiment is capable of reducing the design-development lead time, enhancing the degree of design completion and improving the productivity and the satisfaction of various requirements such as delivery preparation for customers and the like, as compared with the conventional art.

Figure 7:
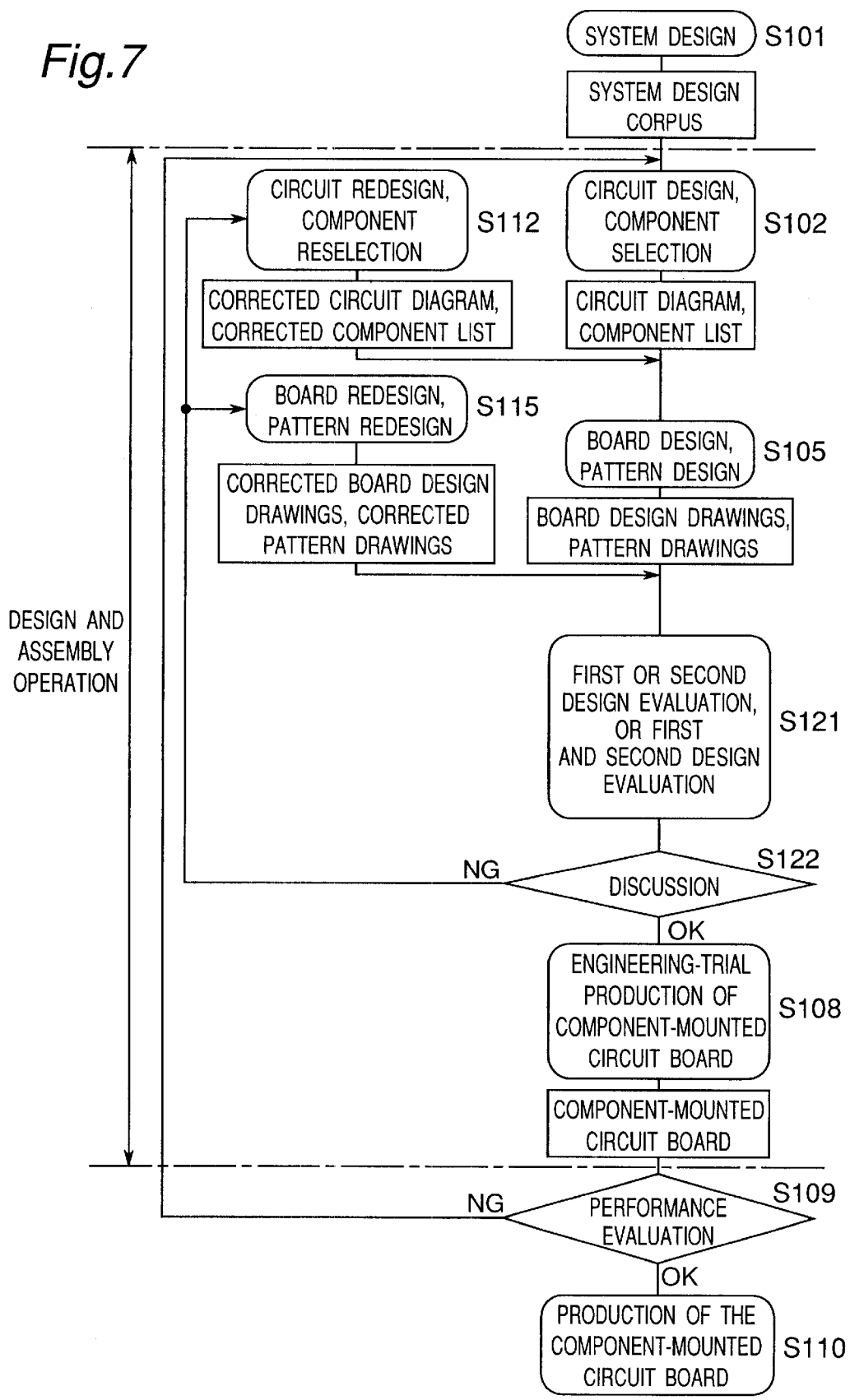
FIG. 7 is a flow chart showing another example of the design evaluating method shown in FIG. 6.

In this embodiment, as described above, the first design evaluation is executed at a point in time when the operations of circuit design and the electronic components selection are completed, and the second design evaluation is executed at a point in time when the circuit board design and the pattern design are completed. However, this is not limitative. That is, as described above, the circuit-board-assembly assist design evaluating method of this embodiment is characterized by performing the evaluation operations for the assemblability of a circuit designed comprehensively on the scale common to the three divisions of the design, the production technology and the manufacture, prior to the engineering-trial manufacture of a component-mounted-circuit board. Therefore, it may be arranged, as shown in FIG. 7, that after the step 105 and before the step 108, i.e., at the step 121 that is a stage where the circuit design and electronic components selection as well as the circuit board design and the pattern design have been completed, preferably both the first design evaluation and the second design evaluation, or either the first design evaluation or the second design evaluation is executed, and these evaluations are discussed at the step 122, which precedes the step 108. Then, if the discussions result in an inappropriateness, the result may be fed back to both the step 112 and the step 115, or either the step 112 or the step 115.

Figure 53:
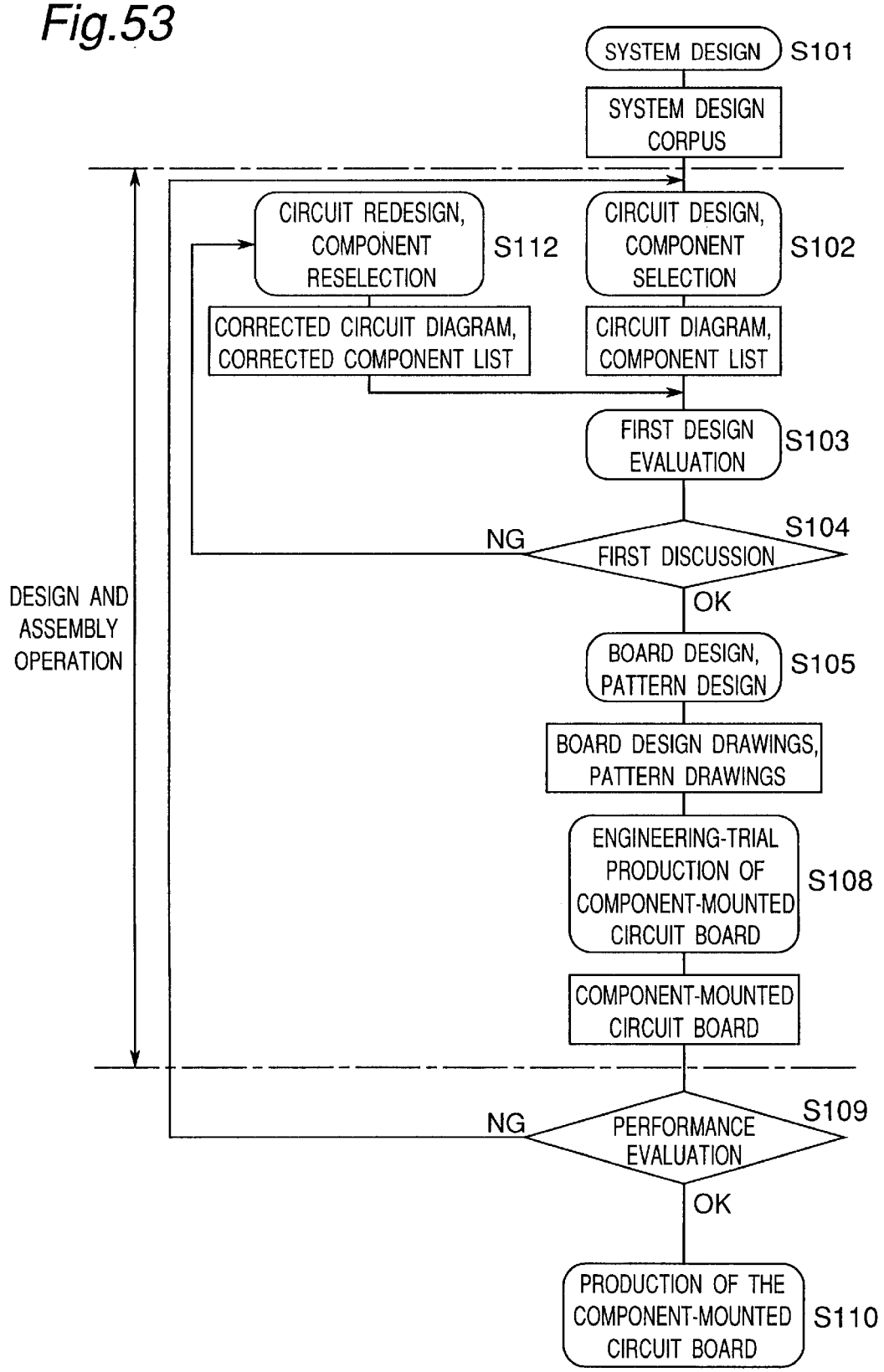
FIG. 53 is a flow chart showing another example of the design evaluating method shown in FIG. 6.

Furthermore, as shown in FIG. 53, it is possible that before the engineering-trial manufacture and after the process of circuit design-and-electronic components selection, only the first design evaluation is executed. In such a case where only the first design evaluation is executed, it is unnecessary to use, for example, the "target-board-design information and target-pattern-design information 125", "second design evaluation program 124", "second-design-evaluation question information 128", "second evaluation information 126", "the number of wiring layers vs. mounting density database 533", "board structure database 527" and "the number of wiring layers vs. mounting density table 528" among the information shown in FIG. 4.

Even if any of these operation flows is adopted, it is extremely rare that the performance evaluation with electronic components mounted on the circuit board results in an inappropriateness, as in the above-described present embodiment. Thus, the circuit-board-assembly assist design evaluating method is capable of reducing the design-development lead time, enhancing the degree of design completion and improving the productivity and the satisfaction of requirements, as compared with the conventional art.

In addition, even in the case where the first design evaluation and the second design evaluation are executed, when the calculation of assembly cost is not executed at the second design evaluation, i.e., when the assembly-cost calculation results obtained by the first design evaluation is adopted as it is, it is also unnecessary to use the "equipment/setup/test database 523", "board cost database 524", "board machining cost database 525", "component machining/assembling cost database 526", "working rate database 531", "conductor minimum width to pattern/resist formation relationship information 532" and "number-of-via-hole and number-of-through-hole database 534" in addition to the aforementioned information unnecessary to use.

Now the first design evaluation at the step 103 and the second design evaluation at the step 106, which are characteristic operations in this embodiment are explained below.

The first design evaluation roughly comprises (I) calculation of cost for the circuit design-and-electronic components selection to the completion of the component-mounted-circuit board through the pattern design (hereinafter, referred to as "assembly cost"), (II) evaluation of the circuit design and the electronic components selection for themselves, and (III) evaluation of the circuit design and electronic components selection as viewed from the assembly process side where the electronic components are actually mounted onto the circuit board.

Figure 8:
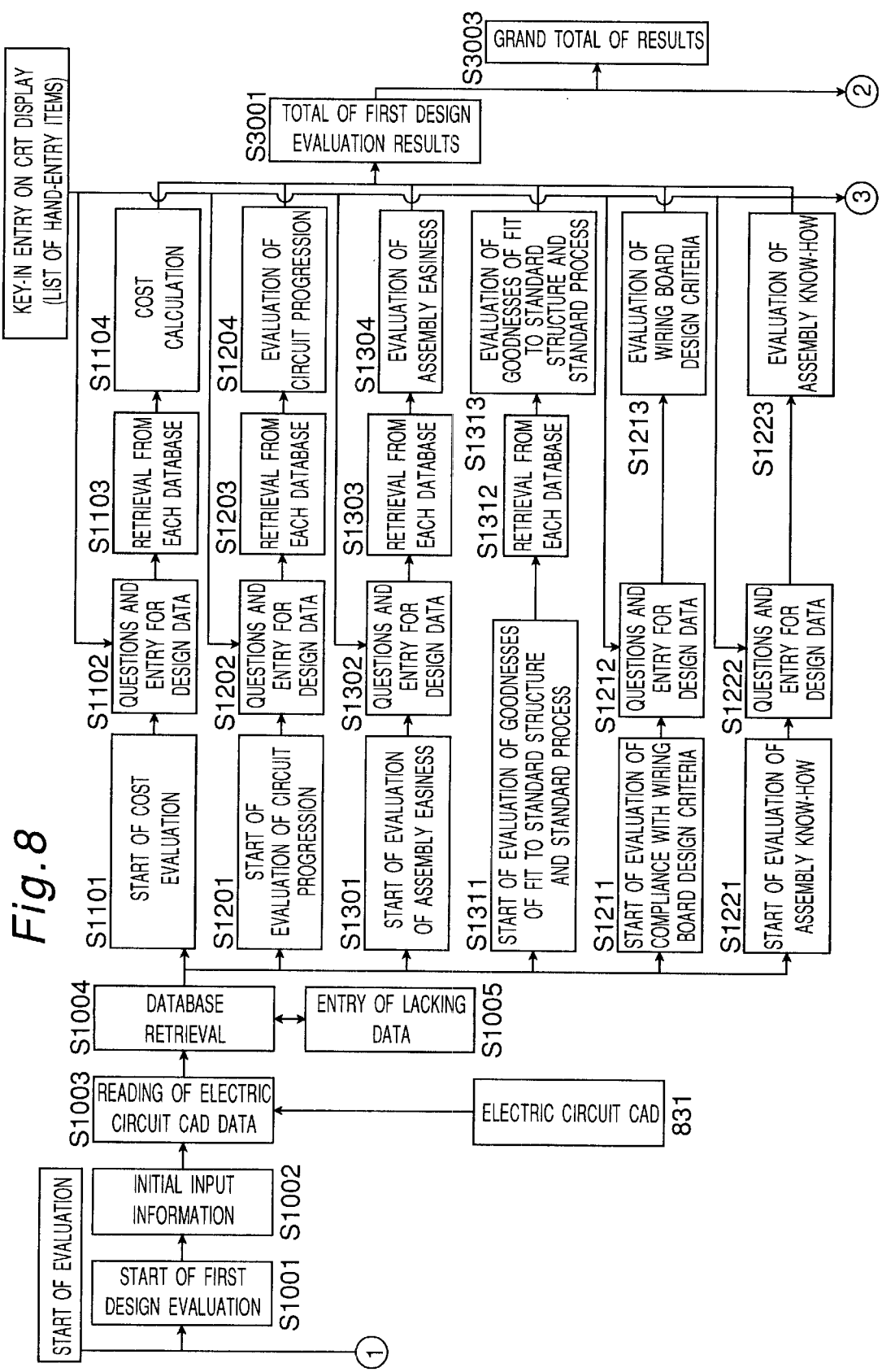
FIG. 8 is a flow chart showing actual operations in the design evaluating method shown in FIG. 6.

As a preceding step for executing the (I) cost calculation, the (II) evaluation of circuit design and the electronic components selection for themselves, and the (III) evaluation of circuit design and electronic components selection as viewed from the assembly process side, as shown in FIG. 8, operations of steps 1001 to 1005 are executed under the control of the evaluation executing unit 101. Although already described in the explanation of the structure of the evaluating apparatus 1001, information as to the unit price, the component number, the component name, the manufacturer name and the manufacturer's product number concerning the electronic components is supplied from the host computer 801 and has previously been stored in the design evaluation database 501. Therefore, for example, in the electronic component database 521 shown in FIGS. 54 to 61, information as to the component name, the manufacturer's product number and the price is listed in correspondence to all the electronic components supplied from the host computer 801 according to the component number supplied from the host computer 801.

At step 1001, the first design evaluation is stated. At step 1002, initial input information is entered to the evaluating apparatus 1001 from the input unit 301 by an evaluator in an interactive form between the evaluating apparatus 1001 and the evaluator. The initial input information in this embodiment includes information as to model number, model name, circuit board name, evaluator name, department name, evaluation date, and circuit type of power system, logic system and the like according to the present design. At the succeeding step 1003, electric circuit information of the circuit is read from the electric circuit CAD 831 into the design evaluation database 501 via the information reading unit 201. It is noted that the electric circuit information, as stated before, includes information as to the model number, design date, number of the circuit, and the component number and component name as well as quantity of electronic components used in the designed circuit. At the succeeding step 1004, the component number among the electric circuit information being taken as a keyword, information as to selected electronic components that are electronic components used in the designed circuit is retrieved from the information contained in the standard database 511. In this process, for electronic components that are not contained in the standard database 511, i.e., that are not extracted by the retrieval operation, information corresponding to the items constituting the electronic component database such as "supplier" and "unit price" as shown in FIG. 54 is entered by the evaluator from the input unit 301 at step 1005.

As shown in FIG. 8, after the operations of the steps 1004 and 1005, the operations for the above (I), (II) (III) are executed. In these operations, the (I) calculation of assembly cost is executed at steps 1101 to 1104 as shown in FIG. 8, the (I) evaluation of circuit design and the electronic components selection for themselves is executed at steps 1201 to 1204, steps 1211 to 1213 and steps 1221 to 1223, and the (III) evaluation of circuit design and electronic components selection as viewed from the assembly process side are executed at steps 1301 to 1304, and steps 1311 to 1313. In addition, the (I), (II), (III) operations may be started with any one of them without limitations on the order in which the operations are carried out.

First, the (I) calculation of assembly cost is explained. The reason for performing the calculation of assembly cost is as follows. Most of the assembly cost is determined largely depending on the circuit design. Whereas the essential task of circuit design is to develop "better circuits", it is critical for the designer to grasp, at an earlier stage, the assembly cost of a component-mounted circuit board designed by the designer himself or herself and attain a cost reduction at the circuit design stage. Also, as is often the case, the designer would indeed regard a direct materials cost, which is a so-called component expense, as a responsibility of his or her own, but is indifferent to labor cost and equipment depreciation costs. It is necessary for the designer to be conscious that his or her components selection is closely related to the labor cost.

Although the assembly cost is calculated in the first design evaluation as well as in the later-described second design evaluation, the assembly cost is just "calculated" and the calculated assembly cost is not "evaluated", in this embodiment. This is because the circuit-board-assembly assist design evaluation in this embodiment is not performed simply from a lower concept of improving productivity and production efficiency of circuit boards, but purposed to objectively and impartially evaluate the assemblability of the circuit boards with a view to enabling high-quality assembly. Accordingly, it is the evaluator that judges whether the calculated assembly cost is high or low. If the evaluator has judged the calculated assembly cost "high", the evaluator would make effort to reduce the cost, which leads to a result that a circuit board reduced in cost is designed.

Figure 11:
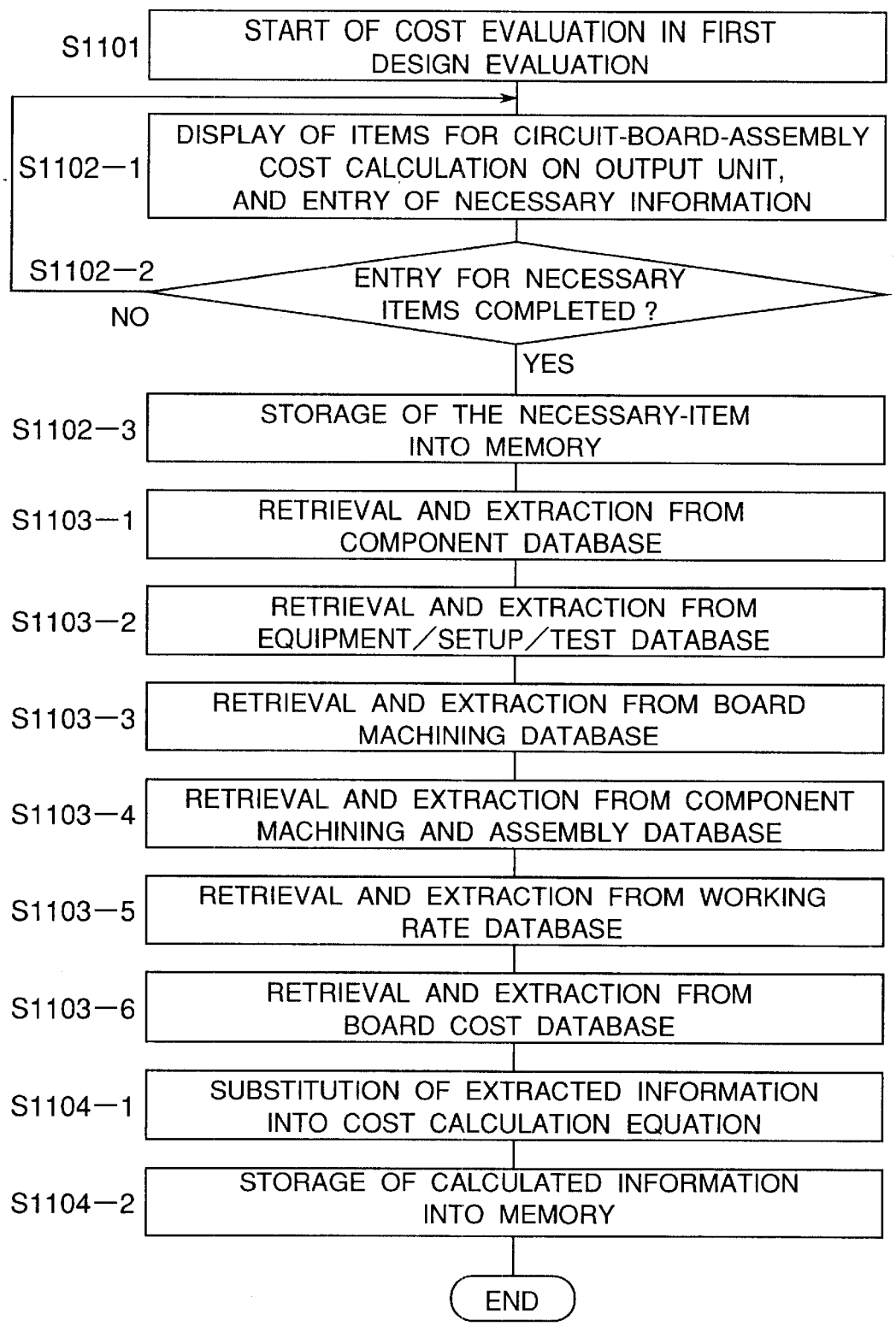
FIG. 11 is a flow chart for a process wherein cost calculation in a first design evaluation is executed in the design evaluating method which is the embodiment of the present invention.

More specifically, at the step 1101, the calculation of assembly cost is started. At step 1102, the evaluation executing unit 101 displays on the output unit 401 at least one question for the calculation of the assembly cost according to the first design evaluation program 121, and in response to this, the evaluator enters information from the input unit 301 to the evaluating apparatus 1001. It is noted that the step 1102 comprises steps 1102-1 to 1102-3 as shown in FIG. 11. Entering information in the interactive form with the evaluator like this is due to the following reason. That is, whereas the design evaluation database 501 of the evaluating apparatus 1001 has stored therein information supplied from the host computer 801 and information in the standard database 511 as described before, it is the case at the present time, i.e. the step 103 in FIG. 6 that only the electric circuit information such as the component numbers and the component names as well as their quantities, etc. of the electronic components of the circuit according to the present design has been supplied to the evaluating apparatus 1001 from the electric circuit CAD 831 as described before. Therefore, at the present time point, since such information as size and the like of the circuit board to be manufactured are absent in the evaluating apparatus 1001, it would be impossible in usual case to execute the operation of calculating the assembly cost at this time point.

However, the evaluator, i.e., the designer has an image about the circuit that the designer himself or herself is designing, and therefore has approximate numerical values obtained empirically or attributed to design targets or the like, about the information such as the size, etc, of the circuit board.

Thus, in this embodiment, information that is necessary for the calculation of assembly cost but unentered at the present time is supplied from the evaluator to the evaluating apparatus 1001 as presumed information in the interactive form of response to the question(s), and further the calculation of assembly cost is enabled at the stage of step 103 based on cost calculation equations created in this embodiment as will be detailed later. In addition, in this embodiment, in the internal memory 111 are stored the question(s) as the first-design-evaluation question information 127 and the cost calculation equations as the first evaluation information 123. Actual contents of the questions are, for example, X-direction size (mm) and Y-direction size (mm), thickness t (mm), the number of 0.5 mm dia. holes, the number of 0.7 mm dia holes, the presence or absence as well as the number of gold-plated terminals, and the like of the circuit board, as shown in the field of "PCB assembly cost" of FIG. 12.

At step 1102-1, at least one question is displayed on the output unit 401, where the evaluator enters numerical values on and on by presumption. It is decided at step 1102-2 whether or not the presumed numerical values have been entered for all the questions necessary for the calculation of assembly cost. At step 1102-3, the entered presumed numerical values are stored into the internal memory 111.

Step 1103 comprises steps 1103-1 to 1103-6 as shown in FIG. 11. At these steps, the evaluation executing unit 101 reads the electric circuit information and retrieves and extracts information necessary for the calculating the assembly cost based on the later-described cost calculation equations via the retrieval unit 601 according to the first design evaluation program 121.

At the steps 1103-1 to 1103-6, the retrieval and extraction of the necessary information is done based on the component numbers of the selected electronic components. In addition, operations of the steps 1103-1 to 1103-6 may be carried out in any order.

More specifically, at the step 1103-1, with respect to the selected electronic component selected at the step 1004, the unit-price information, the machine-mounting man-hour information and the hand-mounting man-hour information are retrieved and extracted from the component database 521. At the step 1103-2, setup/cost information for the selected electronic component is retrieved and extracted from the equipment/setup/test database 523. At the step 1103-3, net man-hour information as the board machining cost as well as setup/man-hour information for the selected electronic component are retrieved and extracted from the board machining cost database 525. At the step 103-4, net man-hour information as the component machining/ assembling cost as well as setup/man-hour information for the selected electronic component are retrieved and extracted from the component machining/assembling cost database 526. At the step 1103-5, working rate information relating to the above man-hour information are retrieved and extracted from the working rate database 531. At the step 1103-6, various types of cost information are retrieved and extracted from the board cost database 524.

Step 1104 comprises steps 1104-1 and 1104-2 as shown in FIG. 11. At the step 1104-1, the evaluation executing unit 101 extracts the later-described cost calculation equations from the first evaluation information 123 according to the first design evaluation program 121, and calculates the assembly cost according to the cost calculation equations based on the various types of information extracted at the aforementioned steps 1103-1 to 1103-6. In this process, the presumed numerical values entered by the evaluator at the step 1102 are taken into consideration. That is, for various values such as the board size information necessary for calculating, for example, "Board materials cost" in the cost calculation equations as well as numerical values necessary for calculation of "C", "A" and the like, which are detailed below, are used the aforementioned presumed numerical values.

At the step 1104-2, the calculated assembly cost is stored in the internal memory 111.

As described above, in this embodiment, information which has not yet been established at the stage before the circuit board design and the pattern design and after the completion of the circuit design and components selection is entered as presumed information presumed to the questions by the evaluator, and information extracted from the standard database 511 as well as the aforementioned presumed information are used according to the cost calculation equations created in this embodiment. This makes it possible to execute the calculation of the assembly cost at the stage where the circuit design and components selection has been completed, as has been impossible conventionally.

Also, the evaluator enters presumed information in response to the questions as described above. This makes it possible to standardize the contents of inputs entered by various evaluators and to have all of necessary information entered.

The cost calculation equations are shown below:

Manufacturing cost: $M = M1 + M2 + M3 + M4$ where
- M1: direct materials cost,
- M2: labor cost (personnel expense),
- M3: equipment depreciation cost, and
- M4: manufacturing expenses.

This is a general calculation equation for manufacturing cost, whereas the following equation as an example may be used depending on business places to be targeted for evaluation:

Manufacturing cost: $M = M1 + M5$ where
- M1: direct materials cost, and
- M5: labor cost including equipment depreciation (excluding inspections).

(1) PCB manufacturing cost (M) = direct materials cost (M1) + labor cost (M5)

(2) Direct materials cost (M1) = $\Sigma$(component unit price) + Board materials cost where the component unit price is determined from the component database 521 and the component information entered at the step 1005.

(3) Board materials cost = $1/(nx \cdot ny) \times 1/(mx \cdot my) \times C \times [A+B]$ where
- nx = integer {sheet width/x},
- ny = integer {sheet length/y}

It is noted that the sheet width (and length) refers to a size of the sheet prior to division into the boards.

where x = board width, y = board length mx = integer{regular width/X}, my = integer{regular length/Y}, where X = sheet width, Y = sheet length, and where regular width×regular length: 280×230 or 310×280 mm for one side or double side; 270×220 or 300×270 mm for four layers or six layers (4) $C = M \times N$ Values of M, N are given by extracting the values of M, N in the board cost database 524

(5) A: value of A itself of the board cost database 524

(6) $B = D + E + F + G + H + I + J + K + L$ where F, G, H and I are given by extracting values of F, G, H and I in the board cost database 524

(7) $D = (p \times d1 + q \times d2) \times (mx \times my)$ where d1 and d2 are given by extracting values of d1, d2 in the board cost database 524 and where, p = the number of 0.7 mm dia. holes/sheet [= the number of holes/board×mx·my] q = the number of 0.7 mm dia. holes/sheet (8) $E = (u \times e1 + v \times e2) \times (mx \times my)$ where e1, e2 are given by extracting values of e1, e2 in the board cost database 524 and where
- u = the number of punches/sheet
- v = the number of routers/sheet (9) $J = j \times r \times (mx \times my)$ where j is given by extracting a value of j in the board cost database 524 and where r is the number of pins/sheet

(10) $K = k \times w \times (mx \times my)$ where k is given by extracting a value of k in the board cost database 524 and where w is the number of V cuts/sheet

(11) $L = l \times z \times (mx \times my)$ where l is given by extracting a value of l in the board cost database 524 and where z is a machining length of a slit/sheets

(12) Labor cost (M5) = $\Sigma$(machine-assembling cost) + $\Sigma$(hand-assembling cost) + $\Sigma$(component machining, assembling cost) + $\Sigma$(component setup cost) + board machining cost + board machining, setup cost + equipment setup cost where the machine-assembling cost and the hand-assembling cost are extracted from the component database 521, the component machining, assembling cost and the component setup cost are extracted from the component machining, assembling cost database 526, the board machining cost and the board machining, setup cost are extracted from the board machining cost database 525, and the equipment setup cost is extracted from the equipment/setup/test database 523.

(13) $\Sigma$(machine-assembling cost) = [machine rate <*1> (yen/min)] × $\Sigma$[machine-assembling cost for each component <*2> (min)] + $\Sigma$(equipment cost D/B: 1̂–6̂)

The machine rate is extracted from the working rate database 531.

(14) Σ(hand-assembling cost)=[worker rate (yen/min)]×Σ [hand-assembling man-hour for each component <*3> (min)]

where the machine rate is extracted from the working rate database 531.

(15) Σ(component machining,assembling cost)=[worker rate (yen/min)]×Σ[component machining, assembling net man-hours <*4> (min)]

(16) Σ(component setup cost)=[worker rate (yen/min)]× 1/production quantity Σ[component setup man-hours <*5> (min)]

<*1>: It is possible that machine rate=worker rate.
<*2>: Extracted from the value of the component database 521.
<*3>: Extracted from the value of the component database 521.
<*4>: Extracted from the value of the component database 521.
<*5>: Extracted from the value of the component database 521.

(17) Board machining cost=[worker rate (yen/min)]×{w× a+1/mx·my[b+c+e+f]+d+g+h where a, b, c, d, e, f, g, h are extracted from the values of the board machining cost database 525.

(18) Board machining,setup cost=[worker rate (yen/min)]×1/production quantity Σ[board machining,setup man-hours <*6> (min)]

where <*6>: extracted from the value of the board machining cost database 525.

(19) Equipment setup cost=[worker rate (yen/min)]×1/production quantity Σ[(I)+(II)+ . . . ]

where (I), (II), . . . : extracted from the values of the equipment/setup/test database 523.

Next, operations of the (II) evaluation of circuit design and components selection design for themselves is explained.

As actual items for the (II) evaluation of circuit design and components selection design for themselves, this embodiment involves (1) evaluation of circuit progression, (2) evaluation of compliance with wing board design criteria, and (3) evaluation of compliance with know-how items in the assembly process. Of course, the actual items are not limited to these, and may be appropriately selected depending on the design-target system, business place and the like.

The (1) evaluation of circuit progression refers to evaluation of achievements of unremitting improvement and development in circuits, with a view to constantly evolving circuits. That is, as organisms are always growing and evolving so as to adapt to their surrounding environments, so electronic and electric circuits, only when grown and progressed together with the development of the targeted system, are enabled to adapt to the whole system and fulfill their functions. Therefore, it seems that progression of assemblability of circuit boards could not be obtained without progression of circuits. As evolving a circuit like this is an essential item in designing the circuit, the progression of a designed circuit is evaluated based on ratios of the designed circuit to comparison objects such as development target values, conventional art values, competitive-companies' values and the like. From a point of view that things absent in the circuit diagram are unnecessary, such actual evaluation items for the circuit progression as shown above are selected. The actual evaluation items for the circuit progression selected in this embodiment are (i) the number of electronic components, (ii) the number of capacitors, (iii) power consumption, and (iv) circuit block commonization/sharing. It is noted that the number of capacitors may be evaluated by targeting only digital circuits, and that when analog circuits are also targeted, oscillation and rectifying parts may be excluded.

The reason that the (i) number of electronic components is selected as an evaluation item is as follows. For example, as LSI packages take a plurality of circuits as one component, it is the best that all the circuits are comprised of one component. So, the number of components is desirably as small as possible. Like this, it is conventionally essential for the circuit design task how the number of electronic components is reduced while equivalent or higher functions are fulfilled, as compared with comparison targets of competitive companies or the like.

The reason that the (ii) number of capacitors is selected as an evaluation item is as follows. A capacitor is not only used as functional elements necessitating such functions as rectification and oscillation but also used for noise reduction by being connected with the ground. This would be a fundamentally unnecessary use if a designer understands circuit characteristics and fully controls them. In the busy circuit design task, it is the capacitor which would be increasingly added if desired circuit characteristics are not obtained. Therefore, it is very important to eliminate the unnecessary capacitor(s) as much as possible in terms of not only circuit operation but circuit assembly as well.

The reason that the (iii) power consumption is selected as an evaluation item is as follows. In view of the last ten years' energy consumption by LCA (Life Cycle Assessment) on the major four products of household electric appliances, according to "Kogyo Zairyo (Industrial Material)" (Nikkankogyo Shinbun Co., February, 1997), power consumption accounts for 93% in refrigerators, 67% in air conditioners, 73% in high-definition televisions, and 48% in fully automatic washing machines. For both the daily running cost and the LCA as an environmental issue, suppressing the power consumption is quite important in creating attractive products.

Further, the reason that the (iv) circuit block commonization/sharing is selected as an evaluation item is as follows. The designed circuit is a piece of software that fulfills the functions when incorporated into hardware. Software's value is determined by a frequency of repetitions of use. For an implementation of more efficient design task and lower assembly cost as well as for stabler quality, it is an essential task to commonize circuits.

Figure 13:
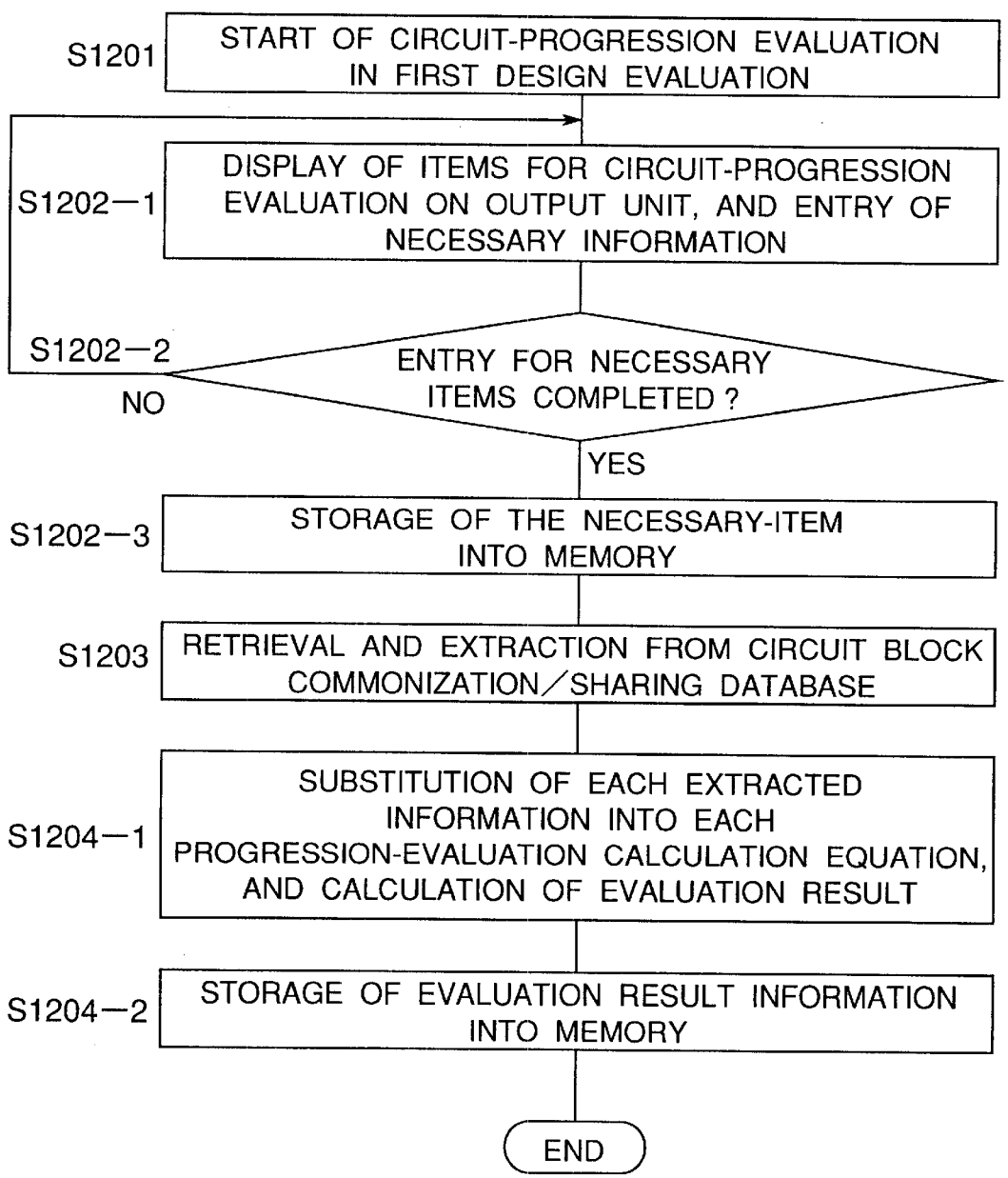
FIG. 13 is a flow chart for a process wherein circuit progression in the first design evaluation is executed in the design evaluating method which is the embodiment of the present invention.

The (1) evaluation of circuit progression as shown above is executed at steps 1201 to 1204 shown in FIG. 8. At the step 1201, the evaluation of circuit progression is started. At the step 1202, as in the operation at the step 1102, the evaluation executing unit 101 displays on the output unit 401 at least one question for the evaluation of circuit progression according to the first design evaluation program 121, and responsive to this, the evaluator enters information from the input unit 301 to the evaluating apparatus 1001. It is noted that the step 1202 comprises steps 1202-1 to 1202-3 as shown in FIG. 13. The reason that information input is implemented in an interactive form like this is the same as in the aforementioned calculation of assembly cost. More specifically, with respect to information that is necessary for the evaluation of circuit progression but unentered at the stage of the step 103, the evaluator is made to enter information presumed by the evaluator to the evaluating apparatus 1001 in a form of answering question(s), so that the evaluation of circuit progression is enabled at the stage of the step 103 based on a calculation equation for the (i) number of electronic components, a calculation equation for the (ii) number of capacitors, a calculation equation for the (iii) power consumption and a calculation equation for the (iv) circuit block commonization/sharing, which have been created in this embodiment and will be detailed later. By adopting the form that the evaluator enters information in response to the questions like this, it becomes possible to make equal level and equal type of information entered without permitting different evaluators to enter information having different types of contents, as described above, while it also becomes possible to enter all of necessary information. In addition, in the internal memory 111 of the evaluation executing unit 101, the questions are stored as the first-design-evaluation question information 127 and the calculation equations for the (i) to (iv) are stored as the first evaluation information 123, respectively. Also, in this embodiment, actual questions for the evaluation of circuit progression are, as shown in the field of "circuit progression" of FIG. 12, the number of electronic components provided in a conventional circuit equivalent to the circuit of the present design, the number of unnecessary capacitors that have been deleted after the design, the number of unnecessary capacitors that are targeted for deletion, the power consumption after the design, conventional power consumption, and a name of a common circuit used.

At the step 1202-1, at least one question is displayed on the output unit 401, and the evaluator enters numerical values by presumption of the evaluator in a form of answering the question(s). At the step 1202-2, it is decided whether or not the presumed values have been entered for all the questions necessary for the evaluation of circuit progression. At the step 1202-3, the entered presumed values are stored in the internal memory 111.

At the step 1203, as shown in FIG. 13, according to the first design evaluation program 121 as well as in the case of the calculation of assembly cost, the evaluation executing unit 101 reads the electric circuit information via the retrieval unit 601, and retrieves and extracts information necessary for the later-detailed calculation equations for the above (i) to (iv).

At the step 1203, with respect to the selected electronic components, information as to the electronic components commonized and shared in the circuit block is retrieved and extracted from the circuit block commonization/sharing database 522.

Next, at step 1204, which comprises step 1204-1 and step 1204-2 as shown in FIG. 13, the evaluation of circuit progression is carried out. At the step 1204-1, the following operation is executed. That is, according to the first design evaluation program 121, the evaluation executing unit 101 extracts the calculation equations for the (i) to (iv) from the first evaluation information 123, and substitutes the extracted information extracted at the step 1203 into the calculation equations, by which numerical values involved in the circuit design and components selection are calculated. Further, the evaluation executing unit 101 reads the target-circuit-design information and target-components-selection information 122 stored in the internal memory 111, and numerically evaluates any difference between the calculated values in the circuit design and components selection and the target-circuit-design information and target-components-selection information 122. At the step 1204-2, evaluation results are stored in the storage unit 701.

Hereinbelow, the calculation equations for the above (i) to (iv) as well as numerically evaluating method for the above difference are explained individually.

In evaluation method for the (i) number of electronic components, as is constructed in the circuit block commonization/sharing database 522 shown in FIGS. 63 and 64, functional unit blocks to be targeted for evaluation, such as inverter and CPU, are set with respect to the circuit of the present design. And then values in the circuit design and components selection are calculated by a following calculation equation with respect to a circuit block to be evaluated:

"the number of electronic components" (%)=100×(total number of electronic components after design)/(total number of electronic components in a circuit block to be compared).

In this case, the information of quantity of electronic components included in the electric circuit information read at the step 1003 corresponds to the above "total number of electronic components after design", and the information of "the number of electronic components provided in a conventional circuit" entered by the evaluator at step 1202 is substituted into the "total number of electronic components in a comparison-target circuit block".

Based on a result calculated by the above calculation equation, the evaluation executing unit 101 performs evaluation as shown in FIG. 14. That is, in the internal memory 111, "graded rank" information corresponding to score information has been stored for each of the (i) to (iv) evaluations, as the target-circuit-design information and target-components-selection information 122, as shown in FIG. 14. Accordingly, the evaluation executing unit 101 determines the graded rank based on the calculated value. Also in the internal memory 111, "score" information has been stored in each of the graded ranks, for each of the (i) to (iv) evaluations as shown in FIG. 14, as the target-circuit-design information and target-components-selection information 122. Accordingly, the evaluation executing unit 101 determines the score corresponding to the above-determined graded rank, as an evaluation result. The information of evaluation result determined in this way is stored in the storage unit 701.

Next, in evaluation method for the (ii) number of capacitors, unnecessary capacitors are defined prior to design, and then the "number of unnecessary capacitors targeted for deletion" is determined with respect to the circuit to be designed this time, and then evaluation as shown in FIG. 14 is performed based on a calculated value calculated by the following equation:

"the number of capacitors" (%)=100×(the number of unnecessary capacitors deleted after design)/(the number of unnecessary capacitors targeted for deletion).

In this case, information as to the number of unnecessary capacitors deleted after design and information as to the number of unnecessary capacitors targeted for deletion entered by the evaluator at the step 1202 are substituted into the "number of unnecessary capacitors deleted after design" and the "number of unnecessary capacitors targeted for deletion" as shown above, respectively.

The evaluation method is carried out in the same way as the aforementioned method for evaluating the number of electronic components. That is, the evaluation executing unit 101 determines the graded rank based on a result calculated by the above calculation equation, and determines the score information based on the determined graded rank. The evaluation result information determined in this way is stored in the storage unit 701.

Next, in evaluation method for the (iii) power consumption, system block unit(s) that allows power consumption to be evaluated is defined, and with a target circuit block determined, evaluation is performed based on a result calculated by the following equation as shown in FIG. 14. It is noted that the system block unit refers to a unit including at least one aforementioned circuit block and having one function, for example, a unit that allows the power consumption to be measured:

"power consumption" (%)=100×(power consumption calculated value after design)/(power consumption actual value in a comparison target).

In this case, a power consumption actual value of a conventional circuit block equivalent to the above circuit block under evaluation corresponds to the above "power consumption actual value in a comparison target". Accordingly, the conventional power consumption value and the power consumption value after design entered by the evaluator at step 1202 are substituted into the above "power consumption actual value in a comparison target" and the above "power consumption calculated value after design", respectively.

The evaluation method is carried out in the same way as the aforementioned evaluation methods. That is, the evaluation executing unit 101 determines the graded rank based on a result calculated by the above calculation equation, and determines the score information based on the determined graded rank. The evaluation result information determined in this way is stored in the storage unit 701.

Next, in evaluation method for the (iv) circuit block commonization/sharing, circuit to be commonized and shared is set as a block for each functional unit, and constituent electronic components in the circuit block are determined. Then the evaluation method for the (iv) is executed as shown in FIG. 14 based on a result calculated by the following equation. It is noted here that the functional unit refers to the aforementioned circuit block having one function:

"commonization and sharing of circuit block" (%)=100×(the number of electronic components in a commonized,shared section)/(total number of electronic components).

In this case, information as to "the number of electronic components" in the evaluation-target circuit block extracted from the circuit block commonization/sharing database 522 at the step 1203 corresponds to the above "the number of electronic components in a commonized,shared section". Also, the information of the quantity of the electronic component included in the electric circuit information read at the step 1003 corresponds to the above "total number of electronic components".

The evaluation method is carried out in the same way as the above evaluation methods for (i) to (iii). That is, the evaluation executing unit 101 determines the graded rank based on a result calculated by the calculation equation, and determines the score information based on the determined graded rank. The evaluation result information determined in this way is stored in the storage unit 701.

Figure 16:
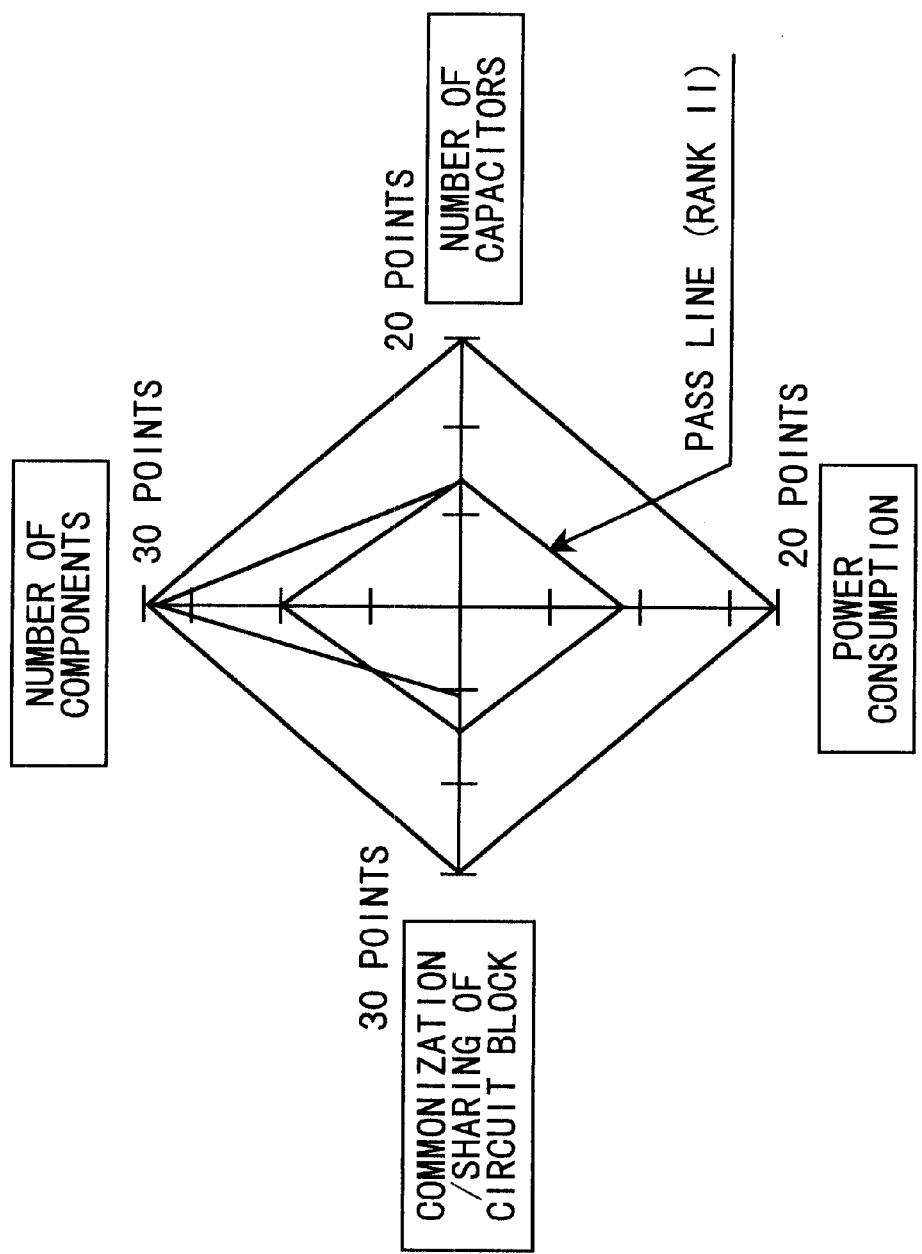
FIG. 16 is a view graphically showing the actual evaluation results of the circuit progression.

Based on these evaluation results on the number of components, number of capacitors, power consumption and circuit block commonization, the difference from the target score can be verified. An example of concrete evaluation results is shown in FIG. 15. Further, the evaluation executing unit 101 visibly displays the evaluation results on the output unit 401 as shown in FIG. 16.

By executing the (1) evaluation of circuit progression as shown above, it is enabled to decide whether or not the designer is appropriately accomplishing the designer's essential task of designing better circuits at all times than the conventional counterpart. Further: compaction of circuits can be achieved based on, for example, a reduction in the number of electronic components; circuit characteristic enhancement can be achieved based on a reduction in the power consumption or the like; and cost reduction can be achieved based on evaluations of the number of capacitors and the commonized/shared circuit block.

Next, the (2) evaluation of compliance with wiring board design criteria is explained. The wiring board design criteria specification is a set of rules that have been obtained by accumulating experiences in the circuit board design and the pattern design for many years and by standardizing know-how of those designs and further generalizing and logically converting the know-how into numerical values. To observe those rules is the basic principle of design, and to check abidance of the rules by the evaluator, for example, the designer himself or herself is of importance. Thus, to observe the design criteria specification, which should be said to be the constitution of the circuit board design and the pattern design, makes it possible to secure quality of the circuit board design and to reduce the assembly cost. Thus, the evaluation of compliance with the wiring board design criteria is carried out in the following way. As items described in the wiring board design criteria specification are all to be strictly observed, these criterion items are classified into ranks A to D and, in this embodiment, the compliance with the wiring board design criteria is evaluated based on the number of items evaluated as the ranks C, D among the items to be evaluated. The number of items associated with the evaluation of compliance with the wiring board design criteria is 65, among which 9 items are targeted for the first design evaluation. In addition, 56 items are targeted for the later-described second design evaluation. Besides, this evaluation of compliance with the wiring board design criteria requires periodical maintenance, and additions and deletions or content changes of the items may be required depending on the circumstances.

The (2) evaluation of compliance with wiring board design criteria as shown above is executed at steps 1211 to 1213 as shown in FIG. 8. At the step 1211, the evaluation of compliance with wiring board design criteria is started. At the step 1212, as in the operations of the steps 1102 and 1202 stated before, the evaluation executing unit 101 displays on the output unit 401 at least one question for evaluating the compliance with the wiring board design criteria according to the first design evaluation program 121. Responsive to this, the evaluator enters information from the input unit 301 to the evaluating apparatus 1001.

Figure 17:
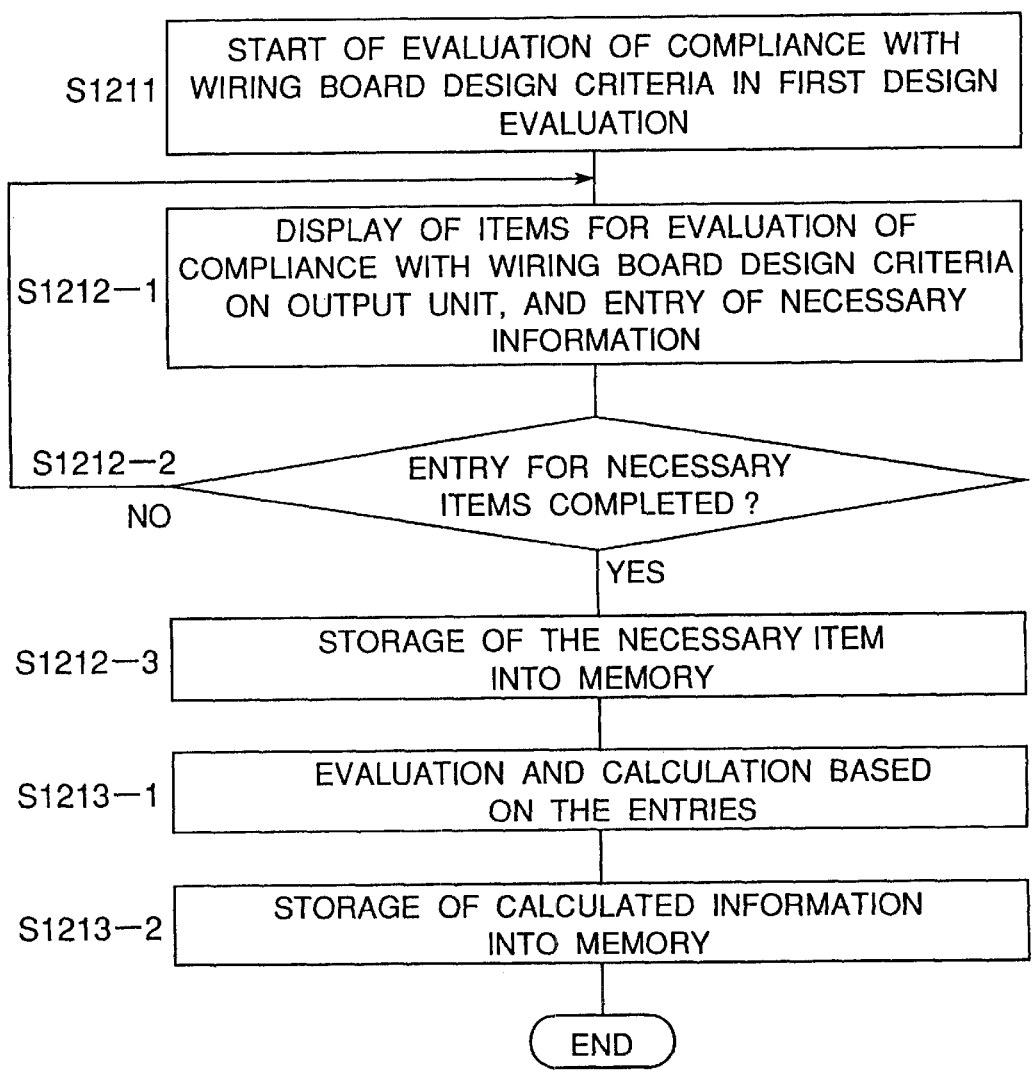
FIG. 17 is a flow chart for a process wherein evaluation of compliance with design criteria in the first design evaluation is executed in a circuit-board-assembly aid design evaluating method which is an embodiment of the present invention.

The step 1212 comprises steps 1212-1 to 1212-3 as shown in FIG. 17. At the step 1212-1, the evaluation executing unit 101 reads out the design criteria evaluation database 529 from within the standard database 511 via the retrieval unit 601. Then, based on the design criteria evaluation database 529 read out and shown in FIGS. 73 to 76, the evaluation executing unit 101 displays on the output unit 401 contents of "items" of Nos. 1, 2, 5, corresponding to "evaluation 1" out of the "evaluation categories" of the design criteria evaluation database 529, in the "evaluation items" contained in the database 529. Necessary information is entered from the input unit 301 to the evaluating apparatus 1001 in a form that the evaluator answers to the displayed contents. The information entered by the evaluator in this case is presumed information by the evaluator in the stage of this. first design evaluation as explained for the evaluation operations. In this case, information among the information entered by the evaluator at step 1102 for the aforementioned assembly cost calculation, such as outer dimensions information of the No. 1 and board thickness information of the No. 2, etc., may be reused, if possible, without additionally entering information.

At the step 1212-2, it is decided whether or not all of the items necessary for the evaluation of compliance with the wiring board design criteria have been entered. At the step 1212-3, the entered presumed information is stored in the internal memory 111.

The step 1213, which comprises step 1213-1 and step 1213-2 as shown in FIG. 17, is to perform the evaluation of compliance with the wiring board design criteria and the storage of evaluation results. At the step 1213-1, the following operation is executed. That is, the design criteria evaluation database 529 has "evaluation criteria" provided for each "item" written above as shown in FIGS. 74 and 76, and ranking of A to D in correspondence to score information is executed based on the presumed information supplied. It is noted that the ranks A, B correspond to scores requiring no design change, the rank C corresponds to scores requiring an approval by authorized personnel, and the rank D corresponds to scores requiring redesign. Therefore, the items ranked C or D are judged as not complying with the wiring board design criteria. Therefore, at the step 1213-1, based on the ranks determined in correspondence to the input of the presumed information entered by the evaluator, the evaluation executing unit 101 counts the number of items ranked C or D according to the first design evaluation program 121. Further, the evaluation executing unit 101 reads out information as to score distribution and grading method shown in FIG. 18 from the target-circuit-design information and target-components-selection information 122 stored in the internal memory 111, allocates a previously set "score" in correspondence to the number of items ranked C or D and numerically evaluates any difference between the circuit design and components selection, and the target-circuit-design information and target-components-selection information 122. An example of the evaluation results is shown in FIG. 19. Referring to FIG. 19, "PART I" corresponds to the evaluation of compliance with the wiring board design criteria in the first design evaluation. Otherwise, as shown in FIG. 51, it may be arranged that, as to the items ranked C or D which are targeted for evaluation in this embodiment, their contents are displayed, or preferably, those together with the description items of the contents in the wiring board design criteria specification may be displayed. Displaying the item contents departing from the wiring board design criteria in this way urges the evaluator, for example, the designer to give attention.

Also, since the degree of satisfaction of the wiring board design criteria is ranked in this embodiment as described above, the selection of any one rank allows the degree of satisfaction of the wiring board design criteria to be recognized.

At the step 1213-2, evaluation results are stored in the storage unit 701.

In this embodiment, as described above, it has been arranged that the number of items ranked C or D is counted. However, without being limited to this, it is also possible, for example, to execute the counting for all the ranks A to D and perform the evaluation for each of the ranks.

By executing the (2) evaluation of compliance with wiring board design criteria in this way, it becomes possible to achieve a design that strictly complies with the design criteria, and to obviate quality defects.

Next, the (3) evaluation of compliance with know-how items in assembly process is explained. Wisdom and contrivance that are created from a shop floor, a spot and the actuality are precious resources of manufacture. They should be utilized for design tasks with great regards and attention even if their contents are not universal or logical.

Therefore, by observing a variety of know-how items that is created from the shop floor where the assembly process of mounting electronic components onto the circuit board is actually executed, it becomes possible to secure assembly quality and to reduce assembly cost. This is the reason that the rate of abidance of the know-how items is evaluated. It is noted that the know-how items in the assembly process, when they are standardized, generalized, derived and taken numerical form, should be recompiled as the wiring board design criteria specification as described above, and changed in its treatment.

As an actual evaluation method, first, items necessary to comply with are picked up in advance from among the know-how items in the assembly process. The items picked up in this way have been classified into ranks A to D, respectively, and, in this embodiment, the rate of compliance with the know-how items is evaluated by the number of items ranked C, D among the items to be evaluated. The number of items is 25 in all, among which 14 items are targeted for the first design evaluation and 11 items are targeted for the later-described second design evaluation. In addition, these evaluation items require to reappraise periodical by, and additions, deletions or content changes of the items as well as changes in the description of the criteria specification may be required depending on the circumstances.

The (3) evaluation of compliance with the know-how items as shown above is executed at steps 1221 to 1223 as shown in FIG. 8. At the step 1221, the evaluation of compliance with the know-how items is started. At the step 1222, as well as in the operations of the steps 1102, 1202 and 1212 stated before, the evaluation executing unit 101 displays on the output unit 401 at least one question for evaluating the compliance with the know-how items according to the first design evaluation program 121. Responsive to this, the evaluator enters information from the input unit 301 to the evaluating apparatus 1001.

Figure 20:
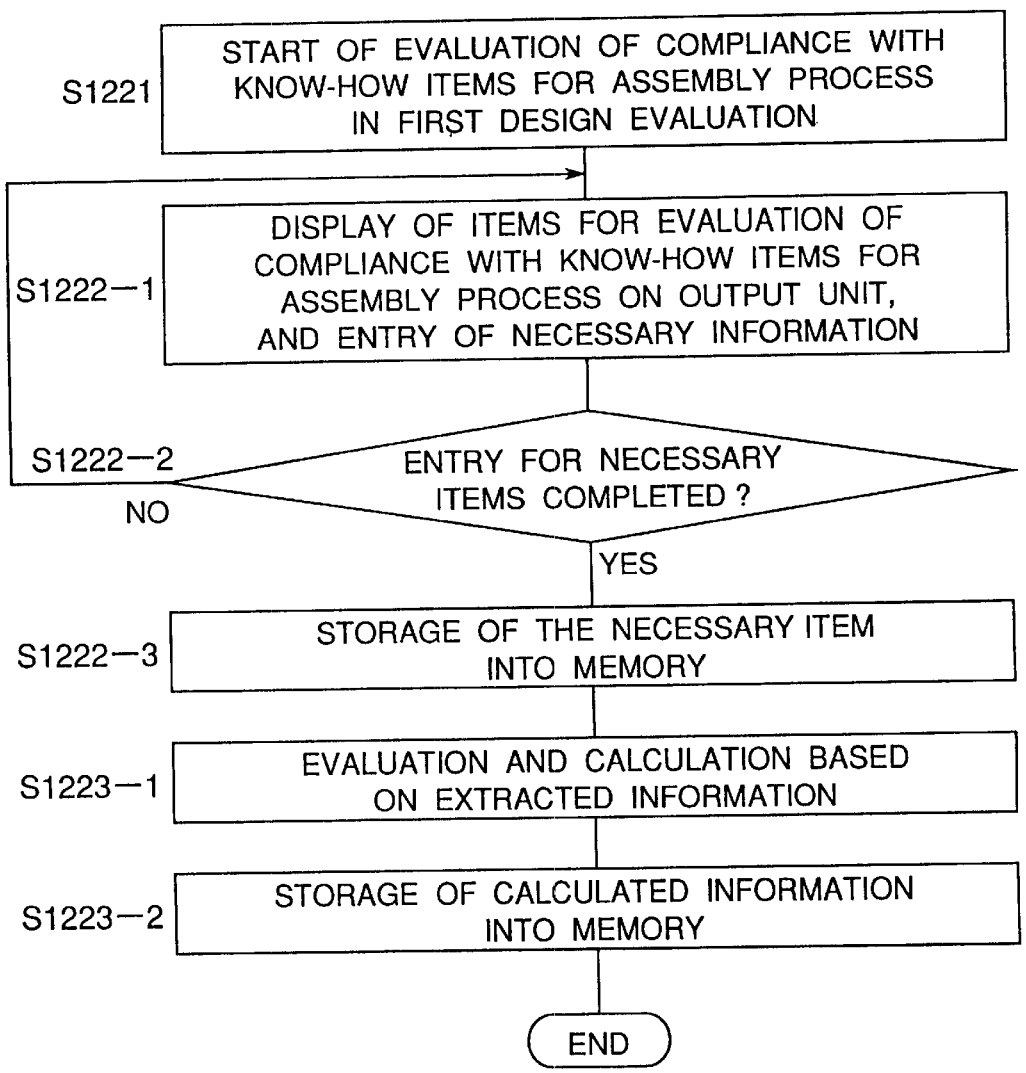
FIG. 20 is a flow chart of a process wherein evaluation of compliance with know-how items in the first design evaluation is executed in the design evaluating method which is the embodiment of the present invention.

The step 1222 comprises steps 1222-1 to 1222-3 as shown in FIG. 20. At the step 1222-1, the evaluation executing unit 101 reads out the know-how item evaluation database 530 from within the standard database 511 via the retrieval unit 601. Then, based on the know-how item evaluation database 530 read out and shown in FIGS. 78 and 79, the evaluation executing unit 101 displays on the output unit 401 contents of "items" of Nos. 5 to 7, corresponding to "evaluation 1" out of "evaluation categories" of the know-how item evaluation database 530, in "evaluation items" contained in the database 530. Necessary information is entered from the input unit 301 to the evaluating apparatus 1001 in a form that the evaluator answers to the displayed contents. The information entered by the evaluator in this case is presumed information by the evaluator in the stage of this first design evaluation as explained for the above evaluation operations. In this case, reusable information among the information entered by the evaluator at step 1102 for the aforementioned assembly cost calculation may be used without additionally entering information.

At the step 1222-2, it is decided whether or not all of the items necessary for the evaluation of compliance with the know-how items have been entered. At the step 1222-3, the entered presumed information is stored in the internal memory 111.

The step 1223, which comprises step 1223-1 and step 1223-2 as shown in FIG. 20, is to perform the evaluation of compliance with the know-how items and the storage of evaluation results. At the step 1223-1, the following operation is executed. That is, the know-how item evaluation database 530 has "evaluation criteria" provided for each of the "items" as shown in FIG. 79, and the ranking of A to D is executed for each of the "items" based on the presumed information supplied, as well as in the evaluation of the wiring board design criteria. Then, the items ranked C or D are judged as not complying with the know-how items. Therefore, at the step 1223-1, based on the ranks given in correspondence to the input of the presumed information entered by the evaluator, the evaluation executing unit 101 counts the number of items ranked C or D according to the first design evaluation program 121. Further, the evaluation executing unit 101 reads out information as to score distribution and grading method shown in FIG. 21 from the target-circuit-design information and target-components-selection information 122 stored in the internal memory 111, allocates a previously set "score" in correspondence to the number of items ranked C or D and numerically evaluates any difference between the circuit design-and-components selection and the target-circuit-design information and target-components-selection information 122. An example of evaluation results is shown in FIG. 22. Referring to FIG. 22, "PART I" corresponds to the evaluation of compliance with the know-how items in the first design evaluation. Otherwise, as shown in FIG. 52, it may be arranged that, as to the items ranked C or D to be evaluated in this embodiment, their contents are displayed, or preferably, those together with the description items of the above their contents in the criteria specification of know-how items are displayed. Displaying the item contents departing from the know-how items in this way urges the evaluator, for example, the designer to pay attention.

Also, since a degree of satisfaction of the know-how items is ranked in this embodiment as described above, the selection of any one rank allows the degree of satisfaction of the know-how items to be recognized.

At the step 1223-2, evaluation results are stored in the storage unit 701.

In this embodiment, as described above, it has been arranged that the number of items ranked C or D is counted. However, without being limited to this, it is also possible, for example, to execute a counting for all the ranks A to D and perform evaluation for each of the ranks.

By executing the evaluation on the (3) compliance with the know-how items in the assembly process as shown above, the evaluator, for example, the designer is able to know the know-how items possessed by the assembly process side, so-called production side, thus making it possible to realize such a design that the circuit can be prevented from occurrence of defects and failures before the start of an actual assembly of the circuit, and that the circuit is easy to assemble and smooth in progression of the assembly operations without difficulties. As a result, it becomes possible to achieve an enhancement in the circuit quality, a reduction in cost and a reduction in the assembly time, as compared with the conventional counterpart.

Next, the (III) evaluation of circuit design and components selection design as viewed from the assembly process side where electronic components are actually mounted onto the board is explained.

As actual items for the (III) evaluation of circuit design and components selection design as viewed from the assembly process side, discussed in this embodiment are: (1) evaluation of assembly easiness of the circuit without considerations to technique and equipment for electronic component mounting possessed by the assembly process field where the electronic components are mounted onto the board, and (2) evaluation of goodnesses of fit to easy-to-assemble standard structure and standard process that are created from the aforementioned technique and equipment that can be possessed by the assembly field. Of course, these actual items are not limited to these examples, and selected appropriately depending on an objective system to be designed, business places and the like.

The (1) evaluation of the assembly easiness without considerations to the assembly technique and equipment possessed by the assembly process field is explained.

The more steps a process includes, the more difficult the process becomes. Even for the manufacture of articles in the shop floor of assembly process, it is a primary principle to be plain and simple in manufacturing, which makes a base for all the work. It is important to prepare ideal, fundamental conditions and thereby simplify the matters before managing by making use of advanced equipment, techniques and systems by reason of complexities of matters. Therefore, evaluation is performed by evaluating factors in an assembly process determined by the completion of a circuit design, from a viewpoint of seeking ideal conditions that make the manufacture of articles easier, whatever the target is, without adhering to techniques and equipment possessed by the shop floor of assembly process. As actual evaluation items for such evaluation of assembly easiness, in this embodiment, seven items of (i) the number of electronic-component mounting surfaces (one side or double side), (ii) the number of solder-bonding surfaces (one side or double side), (iii) type of soldering technique (DIP, reflow, soldering with hand (hand-soldering), composite), (iv) the number of electronic-component types, (v) style of packing of electronic components, (vi) similarity in outer dimensions of electronic components (whether uniform in size or not) and (vii) technique for mounting electronic component (rate of use of automatically mounted components) are considered. However, the actual evaluation items are not limited to these, and may be selected appropriately depending on a target-system, business places and the like.

The actual evaluation items are explained below, respectively.

Evaluation of the above (i) the number of component-mounting surfaces is explained. Simply, a circuit board with one-side mounting of electronic components is easier to manufacture than a circuit board with double-side mounting. With the same circuit and the same function, the circuit board with one-side mounting is smaller in assembly cost and stabler in assembly quality than the other. Accordingly, the method for the evaluation of the number of electronic-component mounting surfaces is based on whether the component mounting is one-side mounting or double-side mounting.

Evaluation of the above (ii) the number of solder-bonding surfaces is explained. Simply, a circuit board with one-side bonding of electronic components onto the board is easier to manufacture than a circuit board with double-side bonding. With the same circuit and the same function, the circuit board with one-side bonding is smaller in assembly cost and stabler in assembly quality than the other. Accordingly, the method for the evaluation of the number of solder-bonding surfaces is based on whether the component bonding is one-side soldering or double-side soldering.

Evaluation of the (iii) type of soldering technique is explained. As to the soldering technique, factories where the assembly process is carried out have unique skills and techniques, respectively. Therefore, although it cannot be said determinately which technique is correct, using one type of bonding technique for the assembly, whichever it is the DIP soldering, reflow soldering, soldering with hand or the bonding by electrically conductive adhesive, more contributes to a stabilization of assembly quality and a reduction in assembly cost. Thus, in this embodiment, soldering techniques are classified into four types, ① DIP soldering of discrete components, ② DIP soldering of surface-assembled components, ③ reflow soldering of surface-assembled components, and ④ hand-soldering of hand-inserted components, and the evaluation is performed based on the number of combinations of these types of techniques. That is, the evaluation is ranked high when only one type is used, and the evaluation ranking decreases with increasing the number of types used.

Evaluation of the (v) style of packing of electronic components is explained. For electronic components, it is a fundamental rule of management to pack and supply the electronic components in a uniform size and shape in constant quantities, and the uniformity and control of their style of packing contributes to a prevention of a supply error of electronic components and to a stabilization of equipment operation as well as a maintenance of assembly quality. It contributes also to a reduction in the man-hours for the supply and setup of the electronic components. It is important to enable the manufacture of articles with any smaller number of types of style of packing. Thus, with respect to the style of packing of electronic components, in this embodiment, the electronic components are classified into five kinds of ① taping, ② tray, ③ stick type, ④ bulk cassette type and ⑤ non-package type, in which arrangement the evaluation is performed based on the number of types used.

Evaluation of the (vi) similarity in outer dimensions of electronic components is explained. A board has electronic components of various sizes, large and small, mounted thereon. This is a result of selecting necessary functions and characteristics, but those differences in size among the electronic components largely affect the manufacture of articles as viewed from one aspect of the manufacturing field. With attention paid particularly to assembly quality, circuit boards assembled with only electronic components similar in size to one another are better, as a rule of thumb, than circuit boards assembled with electronic components of large and small sizes mixed. The more the electronic components to be mounted are close in size to one another, the more the electronic components are easier to handle, and so it is important to equalize the size of the electronic components as much as possible. It is necessary to approach a problem that the amount of quality loss may surpass the amount of cost reduction achievement because of a preference given only to the reduction in direct materials cost.

Thus, as to the evaluation of the similarity in outer dimensions of electronic components, in this embodiment, "mean-size components" are defined and the evaluation is performed based on a calculation result of the following calculation equation:

"similarity in outer dimensions of electronic components" (%)= 100×(the number of mean-size components)/(total number of components).

Next, evaluation of the (vii) technique for electronic component mounting is explained. In today's mechanized shop floor, mounting components by automatic machines is lower in cost and easier in manufacture than by manually doing the same. Selecting automatically mounted components is preferable to manually mounting the components onto the board. Thus, as to the evaluation of assembly technique is performed based on a calculation result by the following calculation equation:

"electronic-component mounting technique" (rate of use of automatically mounted components) (%)=100×(the number of automatically mounted components)/(total number of components).

Operations in the (1) evaluation of assembly easiness having the above (i) to (vii) evaluations are described in more detail below.

Figure 23:
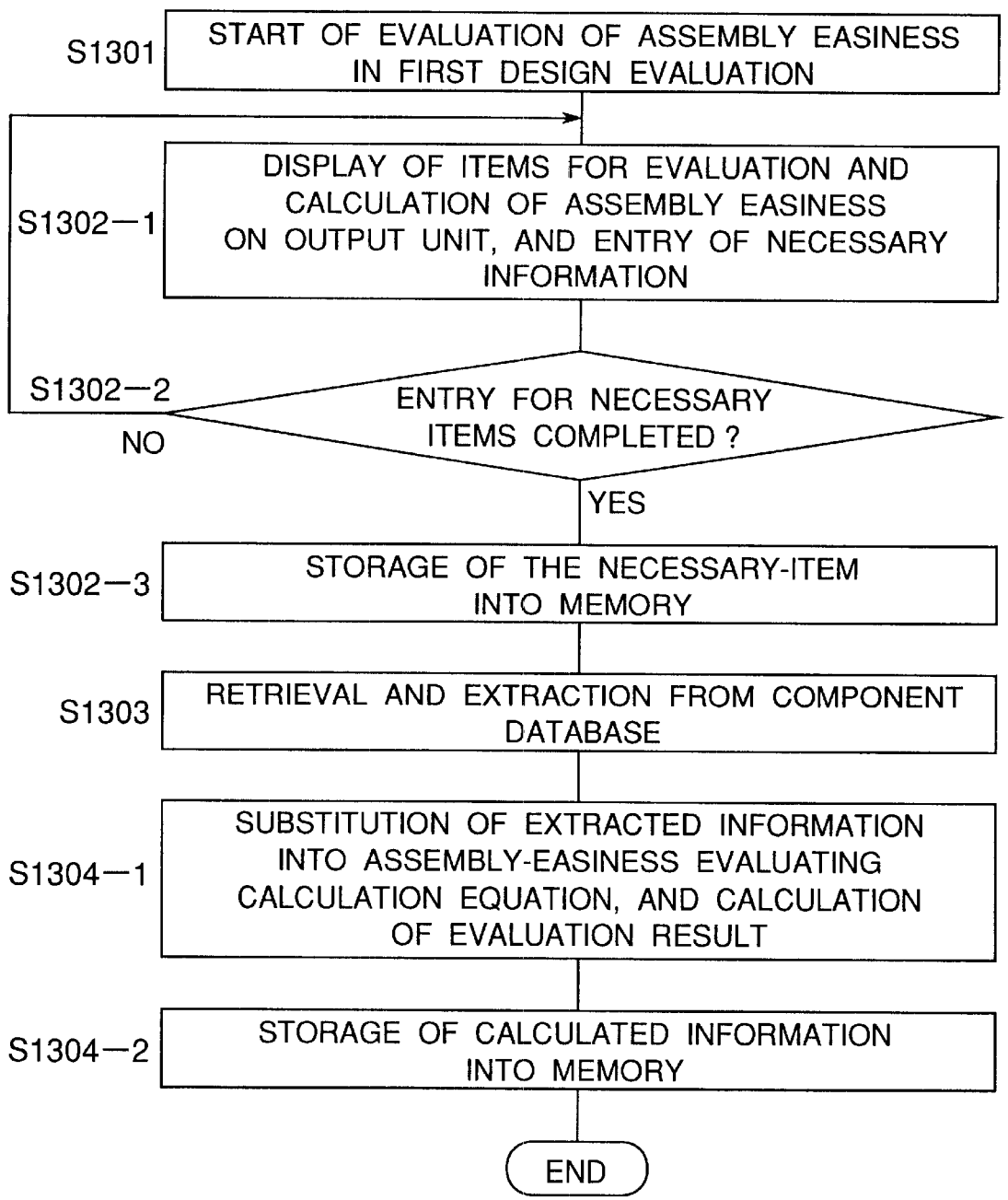
FIG. 23 is a flow chart for a process wherein evaluation of assembly easiness in the first design evaluation is executed in the design evaluating method which is the embodiment of the present invention.

The (1) evaluation of assembly easiness is executed at steps 1301 to 1304 shown in FIG. 8. At the step 1301, the evaluation of assembly easiness is started. At the step 1302, as in the operations at the steps 1102, 1202 and the like, the evaluation executing unit 101 displays on the output unit 401 at least one question for the evaluation of assembly easiness according to the first design evaluation program 121, and responsive to this, the evaluator enters information from the input unit 301 to the evaluating apparatus 1001. It is noted that the step 1302 comprises steps 1302-1 to 1302-3 as shown in FIG. 23. The reason that information input is implemented in the interactive form like this is the same as in the aforementioned calculation of assembly cost. That is, with respect to information that is necessary for the evaluation of assembly easiness but unentered at the stage of the step 103, the evaluator is made to enter information presumed by the evaluator to the evaluating apparatus 1001 in the form of answering questions, so that the evaluation of assembly easiness is enabled at the stage of the step 103 with respect to the (i) to (vii) evaluations described above and originally created in this embodiment. In addition, the question items are stored as the first-design-evaluation question information 127 in the internal memory 111 of the evaluation executing unit 101. Also, the calculation equations for the evaluations of the (iv), (vi) and (vii) are stored as the first evaluation information 123 in the internal memory 111 of the evaluation executing unit 101. Further, in this embodiment, actual questions for the evaluation of assembly easiness are, as shown in FIG. 12, the number of surfaces on which electronic components are mounted, the number of electronic-component types in a conventional circuit to be compared with the circuit of the present design, and the number of types of electronic components in the circuit of the present design.

At the step 1302-1, at least one question is displayed on the output unit 401, and the evaluator enters numerical values by presumption in the form of answering the question(s). At the step 1302-2, it is decided whether or not presumed numerical values have been entered to all the questions necessary for the evaluation of assembly easiness. At the step 1302-3, the entered presumed numerical values are stored in the internal memory 111.

At the step 1303, as shown in FIG. 23, with respect to the selected electronic components, information necessary for the above (iii), (v) to (vii) evaluations are retrieved and extracted from the component database 521 of the standard database 511.

Next, at the step 1304, which comprises step 1304-1 and step 1304-2 as shown in FIG. 23, the evaluation executing unit 101 performs the evaluation of assembly easiness and the storage of evaluation results according to the first design evaluation program 121. At the step 1304-1, the evaluation executing unit 101 executes the following operation. That is, the evaluation executing unit 101 reads out information as to score distribution and grading method shown in FIGS. 24 and 25 and contained in the target-circuit-design information and target-components-selection information 122 and the first evaluation information 123 stored in the internal memory 111. In the score distribution and grading method information, "graded ranks" equivalent to score information has been determined in correspondence to each "evaluation method" in the above (i) to (vii) evaluations, and further "score information" has been determined in correspondence to the above "graded ranks". In addition, in this embodiment, information equivalent to the "evaluation method" and "graded ranks" is included in the first evaluation information 123, and information equivalent to the "score" is included in the target-circuit-design information and target-components-selection information 122. Therefore, the evaluation executing unit 101 evaluates numerically any difference between numerical value of the present design obtained based on the information entered by the evaluator at the step 1302-1 and the information extracted from the component database 521 at the step 1303, and the above "score" information.

At step 1304-2, evaluation results are stored in the storage unit 701.

Below, with respect to the above (i) to (vii) evaluations, operations associated with the step 1304-1 are explained in detail.

First, evaluation of the above (i) the number of component-mounting surfaces is described. As to whether the circuit board is of the one-side mounting or the double-side mounting, which constitutes the method for evaluating the number of component-mounting surfaces, the evaluation executing unit 101 makes a decision based on the information as to the "number of component-mounting surfaces" entered by the evaluator at the step 1302-1. Then, based on this decision, the evaluation executing unit 101 determines a "graded rank" of I or II for the "number of electronic-component mounting surfaces" of FIG. 24, and determines the score information based on the determined graded rank.

Next, evaluation of the above (ii) the number of solder-bonding surfaces is explained. As to whether the circuit board is of one-side soldering or double-side soldering, which constitutes the method for evaluating the number of solder-bonding surfaces, the evaluation executing unit 101 extracts from the internal memory 111 the "number of solder-bonding surfaces" information already entered by the evaluator at the step 1102 for the calculation of assembly cost, and determines whether the circuit board is of the one-side soldering or the double-side soldering, based on the information as to the number of solder-bonding surfaces. Then, based on this decision, the evaluation executing unit 101 determines a "graded rank" of I or II for the "number of solder-bonding surfaces" of FIG. 24, and determines the score information based on the determined graded rank.

Evaluation of the (iii) type of soldering technique is explained. For this evaluation, with respect to the selected electronic components, the evaluation executing unit 101 extracts information as to "chip components" and "discrete components" contained in the component database 521 and shown in FIG. 57 at the step 1303. Based on the extracted information, the evaluation executing unit 101 decides which of (1) to (4) shown in "evaluation method" in the "type of soldering technique" of FIG. 24 the selected electronic components correspond to, and further based on the decision, determines a "graded rank" out of I to IV for the "type of soldering technique". Then, based on the graded rank determined in this way, the evaluation executing unit 101 determines the score.

Evaluation of the above (iv) the number of component types is explained. For this evaluation, the evaluation executing unit 101 extracts the calculation equation for this (iv) evaluation from the first evaluation information 123 stored in the internal memory 111. The information as to the number of component types after design and the information as to the conventional the number of component types in a comparison target, both of which have been entered by the evaluator at the step 1302, are substituted correspondingly into the "number of component types after design" and the "number of component types in a comparison target" in the calculation equation, respectively. Further, based on a rate of the number of component types determined in this way, the evaluation executing unit 101 determines a "graded rank" out of I to IV for the "number of electronic-component types", and determines the score information based on the determined graded rank.

Evaluation of the (v) style of packing of electronic components is explained. For this evaluation, with respect to the selected electronic components, at step 1303, the evaluation executing unit 101 extracts information as to "style of packing of SMD components" and "style of packing of discrete components" contained in the component database 521 and shown in FIGS. 58 and 59. Based on the extracted information, the evaluation executing unit 101 decides which the selected electronic components correspond to, out of (1) to (5) shown in the "evaluation method" for the "style of packing of electronic components" of FIG. 25, and based on this decision, determines "graded rank" of I to IV for the "style of packing of electronic components". Based on the determined graded rank, the evaluation executing unit 101 determines the score.

Evaluation of the (vi) similarity in outer dimensions of electronic components is explained. For this evaluation, the evaluation executing unit 101 extracts the calculation equation for the (vi) evaluation from the first evaluation information 123 stored in the internal memory 111. The "mean-size components" in the calculation equation refer to the following components:

Assuming that height (thickness)=Have., length=Aave. and width=Bave. for the dimensions of "mean-size components", and that height (thickness)=H, length=A, and width=B for each of the electronic components, components satisfying that $$H \leq k_1 \times Have., \text{ and } (A+B) \leq k_2 \times (Aave.+Bave.)$$

are referred to as the "mean-size components", where $k_1$ and $k_2$ are coefficients.

In addition, it is noted that Have.=$(1/n) \times \Sigma H$, Aave.=$(1/n) \times \Sigma A$, and Bave.=$(1/n) \times \Sigma B$.

As to the length (A) and the width (B) of each of the electronic components, with these electronic components mounted on the circuit board, the length refers to a size corresponding to the "length" of the circuit board, and the width refers to a size corresponding to the "width" of the circuit board.

Also, in this embodiment, the coefficients $k_1$=3/2 and $k_2$=3/2 are applied. The values of these coefficients, in actual use, may be changed in their settings depending on the type of wiring boards or the level of work.

Also, in order to determine the "number of mean-size components", the evaluation executing unit 101, with respect to the selected electronic components, extracts information as to "body outer dimensions" contained in the component database 521 shown in FIG. 55, decides based on the extracted body outer dimensions, whether or not each of the selected electronic components falls under the mean-size components, and then determines the number of components falling under the mean-size components. In addition, in the "body outer dimensions" information, "X" corresponds to the length (A), "Y" corresponds to the width (B) and "Z" corresponds to the height (H).

Meanwhile, as the "total number of components" in the calculation equation, the evaluation executing unit 101 extracts and uses the "quantity-of-use" information contained in the electric circuit information read at the step 1003.

The evaluation executing unit 101 determines the value showing the similarity in outer dimensions of electronic components by substituting into the calculation equation the "number of mean-size components" information and the "total number of components" information determined as shown above. Further, based on the value showing the similarity determined in this way, the evaluation executing unit 101 determines "graded rank" of I to IV for the "similarity in outer dimensions of the electronic component", and determines the score information based on the determined graded rank.

Evaluation of the (vii) technique for electronic component mounting is explained. For this evaluation, the evaluation executing unit 101 extracts the calculation equation for the (vii) evaluation from the first evaluation information 123 stored in the internal memory 111. In order to determine the "number of automatically mounted components" in the calculation equation, the evaluation executing unit 101, with respect to the selected electronic components, extracts information as to "relevant equipment" contained in the component database 521 and shown in FIG. 55 at step 1303, and counts the number of automatically mountable components based on the relevant equipment information. Also, as "total number of components" in the calculation equation, the evaluation executing unit 101 extracts and uses the "quantity of use" information contained in the electric circuit information read at the step 1003. The evaluation executing unit 101 determines value showing the technique for electronic component mounting by substituting into the calculation equation the "number of automatically mounted components" information and "total number of components" information determined as shown above. Further, based on the value showing the technique for electronic component mounting determined in this way, the evaluation executing unit 101 determines "graded rank" of I to IV for the "technique for electronic component mounting", and determines the score information based on the determined graded rank.

Figure 27:
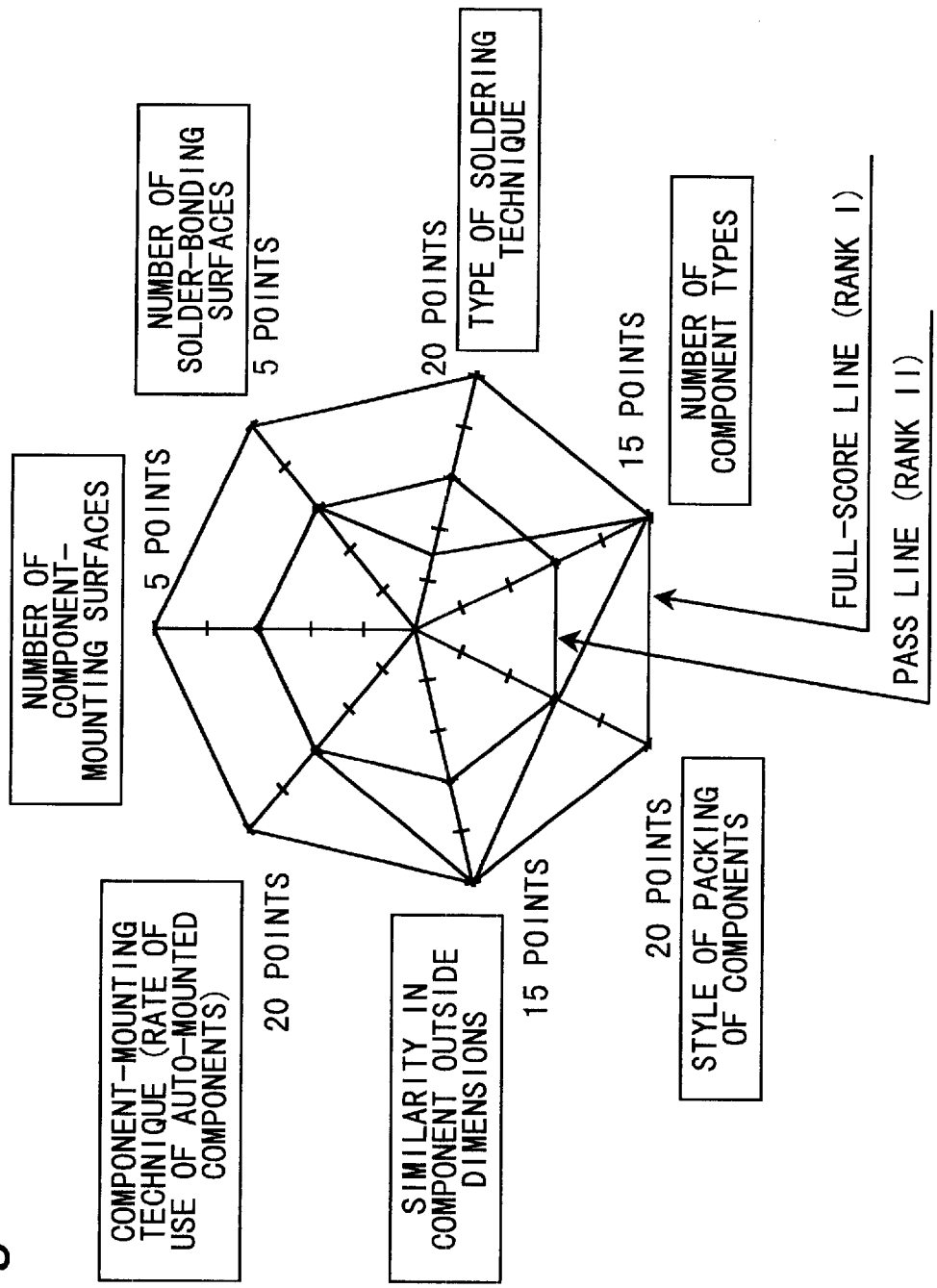
FIG. 27 is a view graphically showing the actual evaluation results of the evaluation of assembly easiness.

With respect to each of the number of electronic-component-mounting surfaces, the number of solder-bonding surfaces, the type of soldering technique, the number of electronic-component types, the style of packing of electronic components, the similarity in outer dimensions of electronic components and the technique for electronic component mounting as described above, examples of concrete evaluation results are shown in FIG. 26. Further, the evaluation executing unit 101 visibly displays evaluation results on the output unit 401 as shown in FIG. 27.

As described above, performing the (1) evaluation of assembly easiness of electronic components allows the designed circuit to be simple in assembly, which in turn allows the manufacturing cost, particularly, the labor cost to be reduced.

The (2) evaluation of goodnesses of fit to easy-to-assemble standard structure and standard process from the viewpoint of the techniques and equipment possessed by the assembly shop floor is explained.

The above-described method for the (1) evaluation of assembly easiness of electronic components has been evaluation method viewed from the so-called ideal conditions with no considerations given to the techniques and equipment possessed by the shop floor. However, evaluation here discussed is evaluation from, as it were, a constraint condition side against the ideal conditions. More specifically, the constraint conditions due to the technique and equipment can be converged into two aspects, a structural aspect as to whether or not a designed circuit is manufacturable, and a flow aspect as to whether or not the assembly operation in the process of assembling the circuit flows smoothly. With the aim of making the best use of techniques and equipment that are possessed, or will be possessed in the future, by the assembly shop floor, easy-to-assemble structure of circuit boards and manufacturing processes in a company's own standard version are decided within existing techniques and equipments, and then compliance or noncompliance with the standard is evaluated. Specifically, (i) the process and equipment are standardized for each product type, i.e., each structure of circuit boards, and compliance with the standard circuit-board structure is evaluated, and (ii) the assembling process including the number of electronic components, the number of electronic-component types, the style of packing of electronic components and the use or non-use of manual assembly and manual soldering is standardized, and compliance with the standard process is evaluated. It is noted that the manufacturing process here explained is of course other than the aforementioned manufacturing process for engineering-trial manufacture of the electronic-component-mounted-circuit boards.

The (i) evaluation of compliance with the standard circuit-board structure is described. Diverse circuit-board structures means that enough engineering techniques and equipment to cope with all of those structures must be possessed. Some factories are seeking for an assembly process system based on that concept, whereas it is also important to standardize a circuit board structure so that full use of limited techniques and equipment can be made.

From such the point of view, for example, as shown in the board structure database 527 shown in FIG. 71, standard circuit board structures of, for example, types A to F classified depending on the type and production lot size of circuits are previously set, and then congruity of a designed circuit with the standard circuit board structure is evaluated according to score distribution and grading method shown in FIG. 28.

Figure 29:
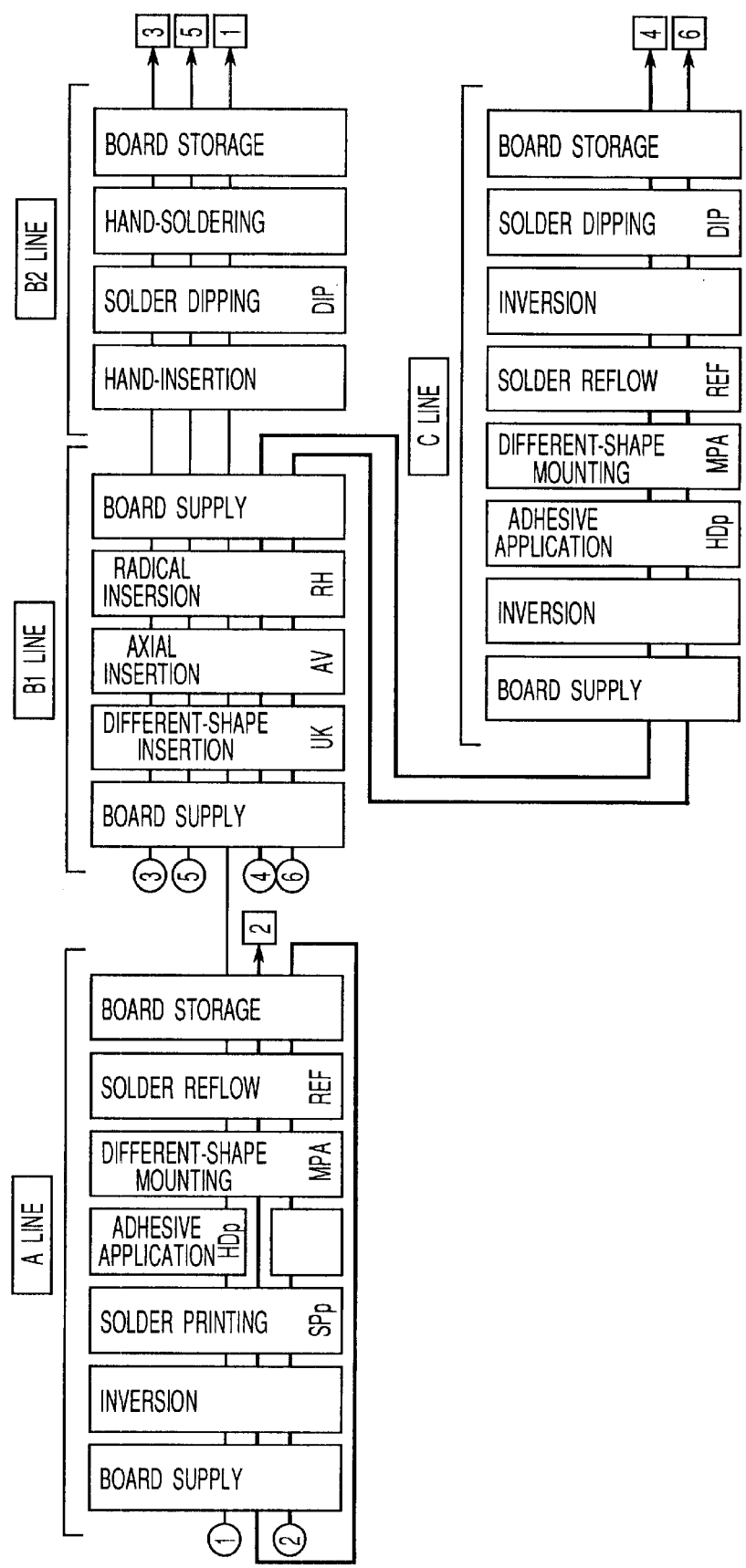
FIG. 29 is a view showing the standard process.

The (ii) evaluation of compliance with the standard process is explained. Whereas flow of articles in the assembly process shop floor represents characteristics of the shop floor very well, readjustment and simplification of the flow has a great effect on elicitation of issues and solution of problems. Thus, taking into consideration the present equipment or future equipment investment plans, "standard structures of line equipment and process" as shown in FIGS. 29 and 49 are prepared in advance, and based on this, the smoothness of the flow of a targeted circuit board is evaluated according to score distribution and grading method shown in FIG. 28.

Operations in the (2) evaluation of goodnesses of fit to standard structure and standard process having the above (i), (ii) evaluations are described in detail below.

Figure 30:
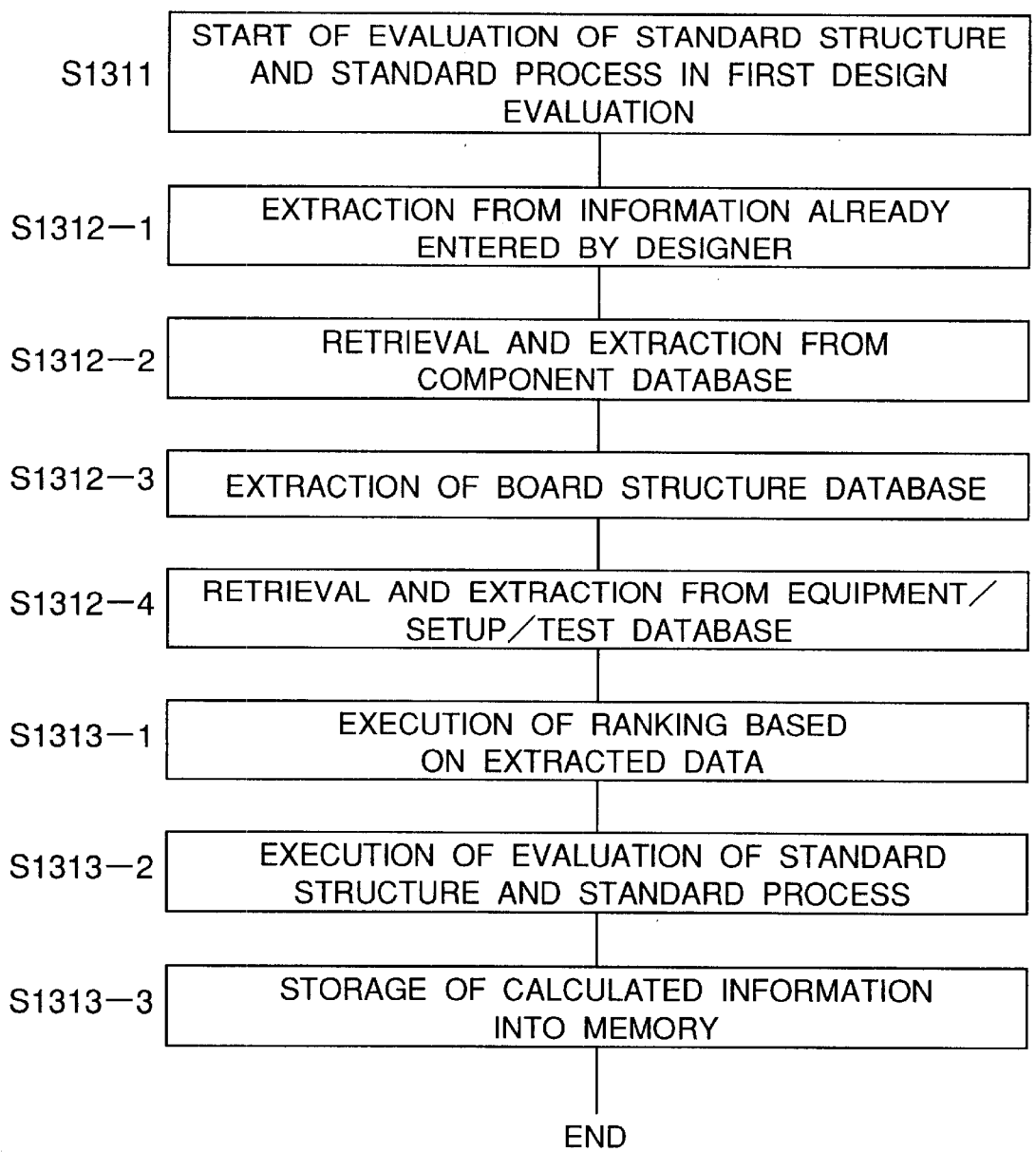
FIG. 30 is a flow chart for a process of executing the evaluation of the standard structure and the standard process.

The (2) evaluation of goodnesses of fit to the standard structure and standard process is executed at steps 1311 to 1313 shown in FIG. 8. At the step 1311, the evaluation of the goodnesses of fit to the standard structure and standard process, respectively, is started. The step 1312 comprises steps 1312-1 to 1312-4 as shown in FIG. 30. At the step 1312-1, information as to circuit type such as power system and logic system already entered by the evaluator at the step 1002, information as to the number of wiring layers, the number of solder-bonding surfaces and the production quantity already entered by the evaluator at the step 1101, and information as to the number of component-mounting surfaces already entered by the evaluator at the step 1301 are read from the internal memory 111. At the step 1312-2, as to the selected electronic components, information as to "chip components", "discrete components" and "relevant equipment" shown in FIG. 57 are retrieved and extracted from the component database 521 of the standard database 511. Further, at step 1312-3, the board structure database 527 shown in FIG. 71 is extracted from the standard database 511. Further, at step 1312-4, as to the selected electronic components, information as to the "number of mounted components" is retrieved and extracted from the equipment/setup/test database 523 of the standard database 511.

In the succeeding step 1313, which comprises steps 1313-1 to 1313-3 as shown in FIG. 30, the evaluation executing unit 101 performs the evaluation of goodnesses of fit to the standard structure and standard process, respectively, as well as the storage of evaluation results according to the first design evaluation program 121. At the step 1313-1, the evaluation executing unit 101 executes the following operation. That is, the evaluation executing unit 101 reads out information as to score distribution and grading method shown in FIG. 28 and contained in the target-circuit-design information and target-components-selection information 122 and the first evaluation information 123 stored in the internal memory 111. In the score distribution and grading method, "graded ranks" corresponding to score information are defined for each of the "evaluation methods" for the (i) and (ii) evaluations, and besides, "score" information is defined in correspondence to the "graded ranks". In addition, in this embodiment, information equivalent to the "evaluation method" and "graded ranks" are contained in the first evaluation information 123, and information equivalent to the "score" is contained in the target-circuit-design information and target-components-selection information 122. Accordingly, the evaluation executing unit 101 determines the graded rank for each evaluation based on each piece of information extracted at the step 1312. Then, at the step 1313-2, the evaluation executing unit 101 numerically evaluates any difference between the numerical value of the present design obtained in correspondence to the graded rank and the score information.

At step 1313-3, evaluation results are stored in the storage unit 701.

For each of the (i) and (ii) evaluations, operations associated with the step 1313-1 and step 1313-2 are explained in detail below.

First, the (i) evaluation of goodness of fit to the standard circuit board structure is described. For this evaluation, at the step 1313-1, the evaluation executing unit 101 determines the graded rank based on each piece of the information extracted at the steps 1312-1 to 1312-3. More specifically, based on the information as to the number of wiring layers, the number of soldering surfaces, the production quantity and the number of component-mounting surfaces, as well as on the information as to the "chip components" and the "discrete components" shown in FIG. 57, mounting structures of electronic components onto the circuit board can previously be classified into six types, as shown by "A" to "F" according to the combination of information items on a type of the solder-bonding surface, a type of the electronic component mounting surface, presence or absence of lead-equipped (discrete) components and presence or absence of chip (SMT) components, as shown in FIG. 31. In addition, the "A" to "F" six types of mounting structures can be determined depending on the combination of the information items as to the number of soldering surfaces, the "chip components" and the "discrete components", and can be done so without any input of specific information from the evaluator to these information items. Accordingly, the "A" to "F" six types of mounting structures have previously been contained in the board structure database 527 as shown in FIG. 71. In addition, which one of these "A" to "F" six types of mounting structures is selected is determined depending on the input information by the evaluator.

The combination of the number of soldering surfaces, the "chip components", the "discrete components" and other information may be not only the combination shown in FIG. 31 but also another combination shown in FIG. 32. However, the mounting structure by the combination shown in FIG. 32 is a non-existing structure or a structure forcedly made by hand-soldering or a structure falling outside the companies' specified standard structures. For example, a one-side reflow circuit board of one-side SMT mounting is not standardized in this embodiment, and so excluded from the above six types. Therefore, the mounting structures are not limited to the above six types, and would naturally be contained in the board structure database, for example, if the "one-side reflow circuit board of one-side SMT mounting" has been standardized. Like this, the mounting structures contained in the board structure database are set according to standard circuit board structures specified by the individual companies.

At the step 1313-1, based on the above-described board structure database 527 as well as the information as to the number of wiring layers, the number of soldering surfaces and the number of component-mounting surfaces already entered by the evaluator, the evaluation executing unit 101 selects one out of the "A" to "F" six types of mounting structures. Further, taking into consideration the information as to the circuit type such as power system and logic system as well as the information as to production quantity entered by the evaluator as described above, the evaluation executing unit 101 determines the graded rank of I to IV for the "compliance with the standard board structure" of FIG. 28. Then, at the succeeding the step 313-2, the evaluation executing unit 101 determines the core information based on the graded rank.

In addition, an example of the evaluation results is shown at No. 1 of FIG. 33.

Next, the (ii) evaluation of compliance with the standard process is described. As in the case of the (i) evaluation of compliance with the standard circuit board structure, for the (ii) evaluation, at step 1313-1, the evaluation executing unit 101 determines the graded rank based on each piece of information extracted at the steps 1312-1 to 1312-4. That is, in this embodiment, the four of "A line", "B1 line", "B2 line" and "C line" are set as standard lines, as shown in FIG. 29. In addition, such standard lines are not limited to those shown in FIG. 29, and standard lines in each company that actually performs the circuit design evaluation are set. Further, with circuit type and lot size, i.e., quantity of production taken as classification items, six process flows as shown in FIG. 49 are previously set as standard process flows. Also, standard numbers of processes are set in correspondence to the standard process flows, respectively. In addition, with respect to the individual processes shown in a section of "equipment/process flow" corresponding to "No." shown in FIG. 49, in the case of "No. 1", a process from "supply" to "REF" corresponds to the "A line" shown in FIG. 29 and a process from "UK" to "storage" corresponds to the "B1 line" and "B2 line", and in the case of "No. 4", a process from "supply" to "storage" corresponds to the "B1 line" and a process from "inversion" to "storage"

corresponds to the "C line", and in the case of "No. 6", a process from "supply" to "storage" corresponds to the "B1 line" and a process from "inversion" to "storage" corresponds to the "C line". In FIG. 49 like this, for example, assuming that the circuit according to the present design is a logic circuit and that its quantity of production is less than 20 s/M, then the circuit board structure is of the type C as shown at the "No. 1", in which case the process flow for assembling the circuit is, most preferably, the A line, the B1 line and the B2 line, where the standard number of processes is 12. In addition, the information on the process flow shown in FIG. 49 is contained in the target-circuit-design information and target-components-selection information 122.

Meanwhile, based on the above information as to actual circuit type of the circuit according to the present design, the information as to the number of wiring layers, the number of soldering surfaces, the quantity of production and the number of component-mounting surfaces, the information as to "chip components" and "discrete components" shown in FIG. 57, and further with respect to the selected electronic components, based on the information as to the "relevant equipment" contained in the component database 521 and the information as to the "number of mounted components" contained in the equipment/setup/test database 523, the evaluation executing unit 101 determines an actual process flow for the circuit of the present design according to the first evaluation information 123.

The way of determining the actual process flow is explained in more detail. The determination of the combination among the A, B1, B2 and C lines for makeup of a circuit according to the present design is executed based on the information as to the A to F types of the circuit board structure, the information as to whether or not equipment, i.e., a so-called mounting machine is used to mount the selected electronic components on the circuit board, the information as to the type of the equipment when it is used, and the information as to the capacity to which electronic components are stored in the equipment. In addition, the information as to whether or not equipment is required to mount electronic components onto the circuit board, and the information as to the type of equipment used are determined from the information as to the "relevant equipment". Also, the information as to the storage capacity of the equipment is determined from the "number of components to be mounted" information.

The combination among the lines is determined by the following conditions. It is the case of the C, D, E, F types that the A line is used. Also, the B line is used in the case of the A, C, F types that the B line is used, where electronic components are mounted onto the circuit board by using the equipment, and where the types of equipment are the UK, AV, and RH shown in the B1 line. The B2 line is used in the case where component mounting onto the circuit board by using the equipment may be impossible, that is, electronic components may be manually mounted by the worker. The C line is used in the case where no manual mounting by the worker is done and where the circuit board structure is of the B, D, E types. Also, it is the case where the circuit board structure is the E type that the A line is iterated two times. Further, the same lines are iterated a plurality of times when the number of electronic components to be mounted onto the circuit board exceeds the storage capacity of the equipment. It is noted that the information as to the number of electronic components to be mounted onto the circuit board is obtained from the electric circuit information derived from the electric circuit CAD 831 as described before.

The number of processes is determined by the following conditions. That is, the processes of the "supply" and the "storage" are necessarily involved. The conditions also include the information as to the presence or absence of the hand-mounting by the worker, and the type of equipment used for each selected electronic component and the storage capacity of the equipment.

At the step 1313-1, the evaluation executing unit 101 determines the process flow and the number of processes for the circuit of the present design based on the conditions as shown above. Then, the evaluation executing unit 101 makes a comparison of the standard equipment, process flow and number of processes shown in FIG. 49 to the assembly process and number of processes of the circuit of the present design, and then determines "graded rank" of I to IV for the "compliance with the standard process" of FIG. 28. Then, at the succeeding step 1313-2, the evaluation executing unit 101 determines score information based on the graded rank.

In addition, an example of the evaluation results is shown at No. 2 of FIG. 33.

By executing the (2) evaluation of goodnesses of fit to the standard structure and standard process as described above, the efficiency of circuit production can be enhanced and the labor cost can be reduced. That is, when the mounting structure does not comply with the standard structure, there are some cases where the circuit board becomes impossible to assemble, or the equipment becomes unusable, so that manual work is increased. As a result, the circuit board becomes high cost with high labor cost. Also, when the "flow" does not comply with the standard flow, operations deviated from the standard flow are necessitated, giving rise to the transfer, storage, residence and the like of the board, so that excessive space and excessive labor cost are required. As a result, the assembly time is prolonged, leading to an increase in cost. Executing the (2) evaluation of goodnesses of fit to the standard structure and standard process makes it possible to prevent these problems.

Figure 44:
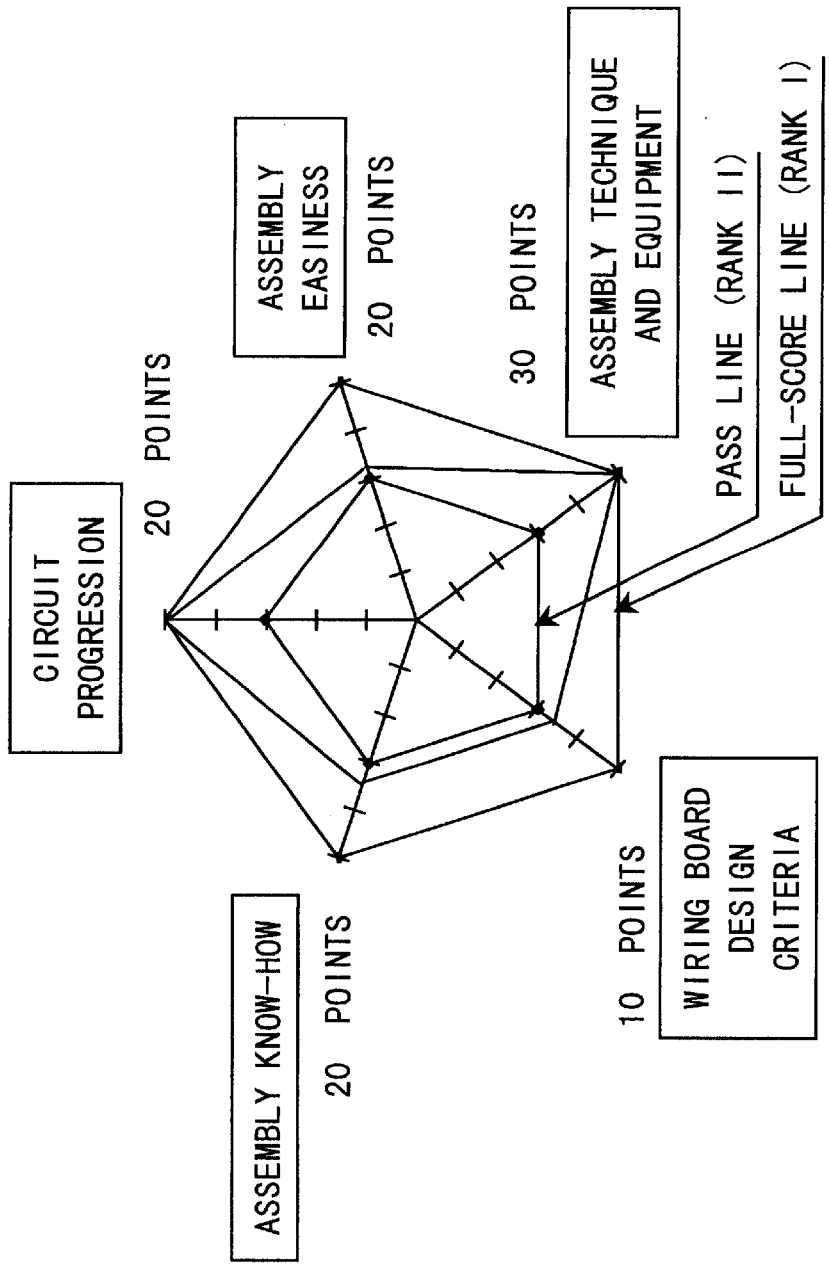
FIG. 44 is a view graphically showing results of the first design evaluation.

At the time point when evaluation results are completely calculated as to the evaluation items in the first design evaluation as described above, at step 3001 shown in FIG. 8, the evaluation executing unit 101 performs a grading as shown in FIG. 43 for the whole first design evaluation according to a score distribution as shown in FIG. 34, and visibly displays results of the evaluation on the output unit 401 as shown in FIG. 44. In addition, the scores shown in FIGS. 43 and 44 are by way of example.

By executing the first design evaluation as described above, problems that occur due to the circuit design and the components selection during the production of the circuit board, can be extracted and solved prior to the engineering-trial manufacture of the circuit board. Accordingly, it becomes possible to eliminate the need of redesign of the circuit board after the engineering-trial manufacture, making it possible to reduce the development lead time and to reduce the redesign cost. Thus, enhancement of the product quality as well as cost reduction for the circuit board in mass production can be implemented.

Also, as described in, for example, the foregoing "(3) compliance with know-how items in assembly process" in the "(II) evaluation of circuit design and the electronic components selection for themselves" as well as the "(III) evaluation of circuit design and components selection design as viewed from the assembly process side", the evaluation of circuit design and components selection design is performed in view of even the circumferences on the assembly process side in this first design evaluation. Therefore, the assemblability of circuit boards can be quantitatively evaluated comprehensively on a scale common to the three divisions of the design, the production technology and the manufacture.

Next, the second design evaluation is explained.

Figure 9:
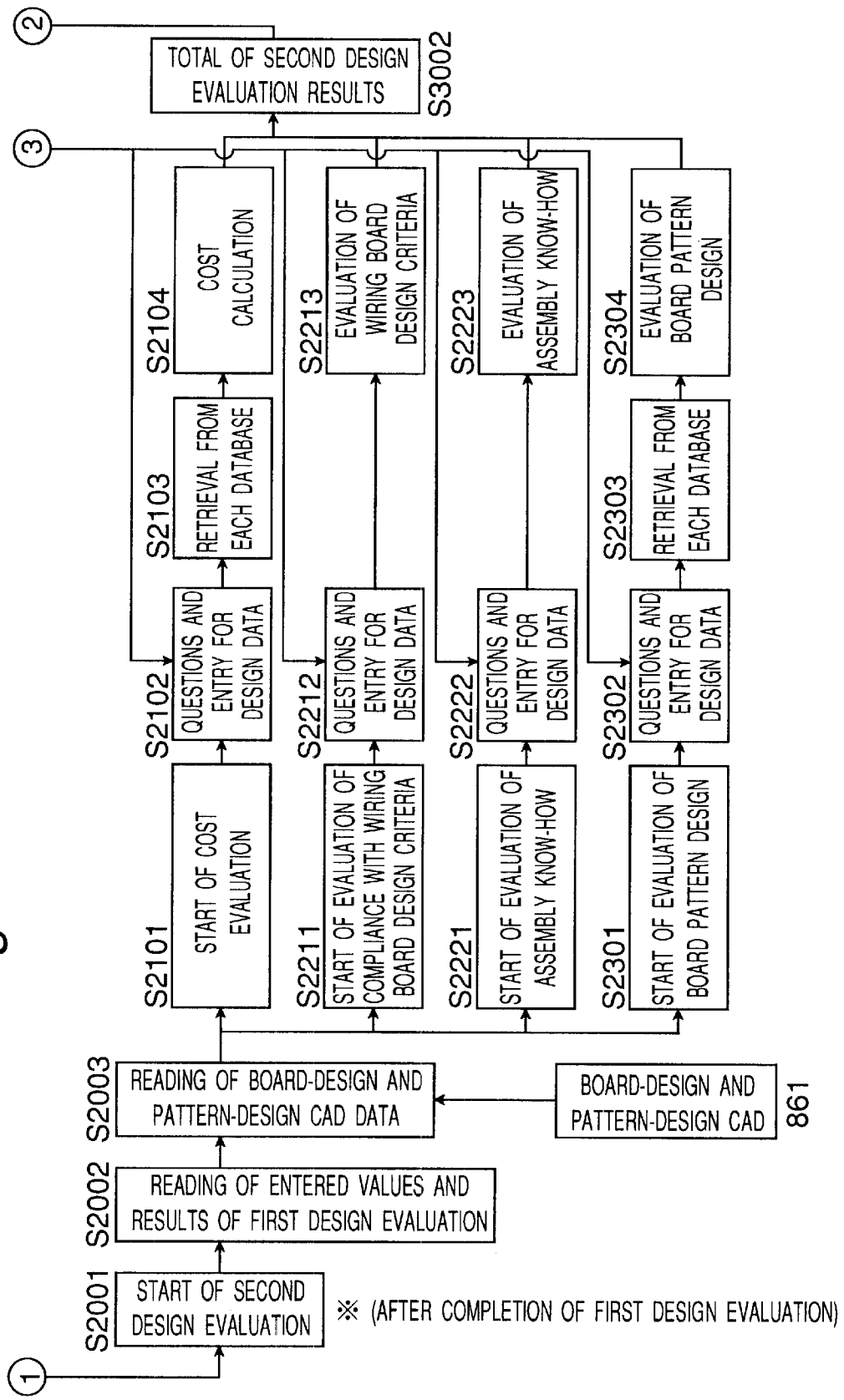
FIG. 9 is a flow chart showing actual operations in the design evaluating method shown in FIG. 6.

The second design evaluation can be converged roughly into (I) re-calculation of the assembly cost, (II) evaluation of board design and pattern design as viewed from the assembly process side. As preceding processes for these (I) re-calculation of the assembly cost and (II) evaluation of board design and pattern design as viewed from the assembly process side, operations of steps 2001 to 2003 are executed with control by the evaluation executing unit 101 as shown in FIG. 9. At the step 2001, the second design evaluation is started. At the step 2002, the evaluation executing unit 101 reads from the storage unit 701 all the information entered by the evaluator in response to the questions in the above-described first design evaluation, as well as all the result information of the calculation results, the evaluation results, the grading results, and the output results onto the output unit 401 such as the display, the printer and the like. Even if the second design evaluation is started, the information stored in the design evaluation database 501 including the internal memory 111 in the evaluation executing unit 101 remains as it is without being deleted. Accordingly, in the second design evaluation, the information stored in the design evaluation database 501 is extracted and used as it is required. In this step 2002, more specifically, the following information is read. That is, input information responsive to the questions shown in FIG. 12, as well as result information shown in FIGS. 15, 16, 19, 22, 26, 27, 33, 43, 44, 51, 52, 74, 76 and 79 are read. It is noted here that the result information includes not only numerical values but also image information such as tables and graphics. Accordingly, all the information, for example, as shown in FIG. 15, etc. is read. Also, the result information includes the result information of assembly cost calculation shown in FIG. 85.

At the succeeding step 2003, the board pattern information according to the present design is read from the board-design and pattern-design CAD 861 to the design evaluation database 501 via the information reading unit 201, constituting the board and pattern information database 513. It is noted that the board pattern information is the electronic-component mounting position information or the like as described before.

As shown in FIG. 9, after the operation of the step 2003, the operations of the (I) and (II) are executed. In this case, as shown in FIG. 9, the operation for the (I) calculation of assembly cost is executed at steps 2101 to 2104, and the operation for the (II) evaluation of board design and pattern design as viewed from the assembly process side is executed at steps 2211 to 2213, steps 2221 to 2223 and steps 2301 to 2304. In addition, the (I), (II) operations may be started with any one of them without limitations on the order in which the operations are carried out.

First, the (I) calculation of assembly cost is described. The assembly cost calculating operation to be executed here is generally similar to the assembly cost calculating operation described at the steps 1101 to 1104 in the first design evaluation. Accordingly, differences from the operation of the first design evaluation are mainly explained in brief.

At the step 2101, the assembly cost calculating operation is started. At the step 2102, input operation by the evaluator to questions is enabled. That is, since input information by the evaluator in the first design evaluation is read at the step 2002 as described above, the read information is used, in principle, for the calculation of assembly cost in the second design evaluation. At the step 2003, on the other hand, because the evaluator is enabled to obtain the output information of the board-design and pattern-design CAD 861 as described above, the evaluator is enabled to enter more definite and almost established information as the information as to each item of the "PCB assembly cost" shown in FIG. 12, in contrast to presumed information entered by presumption in the first design evaluation. Therefore, at the step 2102, with respect to the information on each item of the "PCB assembly cost" shown in FIG. 12, if any change has occurred to the presumed information entered in the first design evaluation, the evaluator enters information from the input unit 301 to the evaluating apparatus 1001 in response to questions provided for the assembly-cost calculation displayed on the output unit 401 by the evaluation executing unit 101 according to the second design evaluation program 124, as in the case of the step 1102 in the first design evaluation. If no change has occurred to the presumed information, the presumed information is used as it is. The reason that the information entry is performed in an interactive form with the evaluator like this is also the same as in the first design evaluation, enabling the calculation of assembly cost at the stage prior to the engineering-trial manufacture of the component-mounted-circuit board. Further, the questions are stored as the second-evaluation questions 128, and the calculation equations for the assembly cost calculation are stored as the second evaluation information 126, respectively, in the internal memory 111 of the evaluation executing unit 101. In addition, the cost calculation equations contained in the second evaluation information 126 are the same as the calculation equations contained in the first evaluation information 123 and used at the step 1104 in the first design evaluation, and therefore, those calculation equations are preferably extracted from the first evaluation information 123 without being contained in the second evaluation information 126.

As shown above, a point in which the operation of the step 2102 largely differs from the operation of the step 1102 in the first design evaluation is that the accuracy of the information to be entered by the evaluator in response to the questions is improved as compared with the case of the first design evaluation. For example, whereas the size of the circuit board has been presumed as 100 mm×100 mm and the number of wiring layers thereof as 4 layers in the first design evaluation, it is established based on the above board pattern information that the size of the circuit board is 120 mm×120 mm and that the number of wiring layers is 6 layers. Accordingly, for example, the circuit board size to be entered by the evaluator in the second design evaluation is 120 mm×120 mm, hence an improved accuracy.

Since accuracy of information to be used in the second design evaluation is improved as shown above, for example, the cost calculation can be improved in accuracy in the second design evaluation than in the first design evaluation.

Also, when the presumed information entered in the first design evaluation is used, as it is, in the operation of the second design evaluation, the evaluator can be unburdened of the labor of entering the same information once again, and occurrence of mis-entries can be prevented.

Also, when the presumed information in the first design evaluation is changed with respect to the information as to the assembly cost as described above, information is entered by the evaluator at the step 2102 in this embodiment. However, without being limited to this, it is also possible to directly read output information of the board-design and pattern-design CAD 861. With such a constitution, circuit-board size information and information as to the number of through holes and the like are automatically read at the step 2003, eliminating the need of the entry work by the evaluator at the step 2102.

The reading of information from the electric circuit CAD 831 and the standard database 511 at the step 2103 as well as the calculation of assembly cost at the step 2104 are the same as the operations at the step 1103 and the step 1104, respectively, described in the first design evaluation, and thus so omitted here.

Further, when the information as to the number of through holes and the like is automatically read at the step 2003, the direct materials cost is counted based on the unit-price information as to the selected electronic components, and the calculated materials cost determined by using the automatically read board pattern information.

In the second design evaluation, as shown above, because the assembly cost is calculated by using the board pattern information, the assembly cost can be calculated with higher accuracy than in the first design evaluation.

Next, the (II) evaluation of board design and pattern design as viewed from the assembly process side is described. As concrete items for this evaluation, discussed in this embodiment are: (1) evaluation of compliance with wiring board design criteria; (2) evaluation of compliance with know-how items in the assembly process; and (3) evaluation of board design and pattern design. In addition, the concrete items are of course not limited to these ones, and may be selected appropriately depending on a system to be designed, business places and the like.

The (1) evaluation of compliance with wiring board design criteria is described. This evaluation of compliance with wiring board design criteria is executed based on the same concept as that for the evaluation of compliance with wiring board design criteria in the first design evaluation described before. That is, items of the wiring board design criteria are classified into ranks A to D, and evaluation is performed according to the number of items falling under the rank C or D shown in FIG. 51 in this embodiment. The number of items for the wiring board design criteria is 65 in all, among which 56 items that should be evaluated are evaluated in the evaluation of the compliance with wiring board design criteria. This evaluation of compliance with wiring board design criteria needs periodical maintenance, that is, additions, deletions or content changes of items may also be required from time to time.

The (1) evaluation of compliance with wiring board design criteria like this is executed at steps 2211 to 2213 as shown in FIG. 9. At the step 2211, the evaluation of compliance with wiring board design criteria is started. At the step 2212, as in the operation at the step 1212 of the first design evaluation, the evaluation executing unit 101 displays onto the output unit 401 at least one question for executing the evaluation of the compliance with wiring board design criteria according to the second design evaluation program 124, and responsive to this, the evaluator enters information from the input unit 301 to the evaluating apparatus 1001. As described above, the operation at the step 2212 is basically the same as the operation described in detail at the step 1212, and so its detailed description is omitted here. It is noted that the contents of items to be displayed on the output unit 401 by the evaluation executing unit 101 to lead the evaluator to enter information are contents of "items" of Nos. 3, 4, 6 to 13 within "evaluation items" contained in the design criteria evaluation database 529 and corresponding to "evaluation 2" in "evaluation categories" of the design criteria evaluation database 529.

Operation at the step 2213 is also the same as the operation at the step 1213 in the first design evaluation. That is, with respect to the input information for each of the 56 items, the evaluation executing unit 101 counts the number of items ranked to rank C or D based on the ranking according to the "evaluation criteria" provided in the design criteria evaluation database 529, and further numerically evaluates any difference between the present circuit design, and the target-board-design information and target-pattern-design information 125 based on information as to score distribution and grading method shown in FIG. 35 and contained in the target-board-design information and target-pattern-design information 125 stored in the internal memory 111. In addition, in FIG. 35, "PART II" corresponds to the evaluation of the compliance with wiring board design criteria in the second design evaluation. An example of evaluation results is shown in FIG. 19. In FIG. 19, the "PART II" corresponds to the evaluation of compliance with wiring board design criteria in the second design evaluation.

In this embodiment, the number of items ranked to the rank C or D is counted as described above. However, without being limited to this, it is also possible to count, for example, all of the ranks A to D, and perform the evaluation for each rank.

By executing the (1) evaluation of compliance with wiring board design criteria as shown above, it becomes possible to achieve a design strictly complying with the design criteria, so that quality defects can be prevented in advance. Further, even with unskillfulness in circuit design, problematic points of a designed circuit can be discovered.

Next, the (2) evaluation of compliance with know-how items in assembly process is described. This evaluation of compliance with know-how items in assembly process is executed basically also based on the same concept as that for the evaluation of compliance with know-how items in the first design evaluation described before. That is, items picked up from among the assembly-process know-how item evaluation database 530 are classified into ranks A to D corresponding to score information, and rate of compliance with the know-how items is evaluated by the number of items falling under the rank C or D. The number of items is 25 in all as described above, among which 11 items are targeted in the second design evaluation. This evaluation of compliance with know-how items in the assembly process needs periodical maintenance, that is, additions, deletions or content changes of items may also be required from time to time.

The (2) evaluation of compliance with know-how items like this is executed at steps 2221 to 2223 as shown in FIG. 9. At the step 2221, the evaluation of compliance with know-how items is started. At the step 2222, as in the operation at the step 1222 of the first design evaluation, the evaluation executing unit 101 displays onto the output unit 401 at least one question for executing the evaluation of the compliance with know-how items according to the second design evaluation program 124, and responsive to this, the evaluator enters information from the input unit 301 to the evaluating apparatus 1001. As described above, the operation at the step 2222 is basically the same as the operation described in detail at the step 1222, and so its detailed description is omitted here. It is noted that the contents of items to be displayed on the output unit 401 by the evaluation executing unit 101 to lead the evaluator to enter information are contents of "items" of Nos. 1 to 4 within the "evaluation items" contained in the know-how item Evaluation database 530 and corresponding to "evaluation 2" in the "evaluation categories" of the know-how item evaluation database 530.

Operation at the step 2223 is also the same as the operation at the step 1223 in the first design evaluation. That is, with respect to the input information for each of the 11 items, the evaluation executing unit 101 counts the number of items ranked to rank C or D based on the ranking according to the "evaluation criteria" provided in the know-how item evaluation database 530, and further numerically evaluates any difference between the present circuit design, and the target-board-design information and target-pattern-design information 125 based on the information as to score distribution and grading method shown in FIG. 36 and contained in the target-board-design information and target-pattern-design information 125 stored in the internal memory 111. An example of evaluation results is shown in FIG. 22. In addition, in FIG. 22, "PART II " corresponds to the evaluation of compliance with know-how items in the second design evaluation.

In this embodiment, the number of items ranked to the rank C or D is counted in this embodiment. However, without being limited to this, it is also possible to count, for example, all of the ranks A to D, and perform the evaluation for each rank.

By executing the (2) evaluation of compliance with know-how items in assembly process as shown above, it becomes possible to make known the know-how items possessed on the assembly process side, or so-called production side, to the evaluator, for example, the designer. Therefore, occurrence of defects or failures can be prevented before the circuit assembly is actually started, and a design that is easy to assemble and that allows a smooth progression in assembling operation can be achieved. In other words, it becomes possible to perform the evaluation of the assemblability of the designed circuit comprehensively on a scale common to the three divisions of the design, the production technology and the manufacture.

As a result of this, an improvement in circuit quality, a reduction in cost and a reduction in assembling time as compared with the conventional counterpart can be realized.

Next, the (3) evaluation of board design and pattern design is described. For board design and pattern design, it is important to observe rules and criteria and to pursue the rationality of design. The latter means the skill of design or lack thereof. As design skill increases, the design becomes more simple and more compact. The design skill is largely affected by differences in skill and experience, and a good design can be recognized at a glance. Therefore, it is necessary to pursue the rationality of the board design and pattern design, and achieve a simple, compact design without uselessness or unreasonableness. Thus, in this embodiment, evaluation is performed on actual evaluation items of(i) total wiring length, (ii) the number of wiring layers, (iii) the number of through holes and via holes (except for one-sided wiring boards), (iv) the number of pattern branches and branch length, (v) electronic-component projecting area+pattern portion area occupying in the circuit board, and (vi) degree of dispersion of electronic-component placement (to be nearly uniform without maldistribution). The actual evaluation items are not limited to these, and may be selected appropriately depending on a system to be evaluated, business places and the like. For example, evaluation may be done also for uniformity of mounting direction of polar components, heat generation distribution of boards, unnecessary radiation generation distribution or the like.

Each of the above (i) to (vi) items is explained.

Evaluation of the (i) total wiring length is described. The routing of the wiring that connects electrodes to one another in electronic components should be as short as possible, except for cases in which impedance matching is necessary. This is because otherwise there would arise disadvantages in the delay of signal propagation in digital circuits, the size of loop as well as the noise proof property and power consumption property in power circuits, and the like. Therefore, it is crucial to design the wiring length as short as possible. From such a point of view, in this embodiment, with respect to "L" and "K" shown in the following equation, the total wiring length is evaluated based on "evaluation method" as shown at "No. 1" of FIG. 37:

$L$=total wiring length/the number of components, $K$=$L$ value of standard circuit.

The evaluation of (ii) the number of wiring layers is described. Given the same circuit, it can be said more skillful to design with smaller numbers of layers. From such a point of view, the number of wiring layers is classified into ranks I to IV corresponding to score information according to the number of wiring layers vs. mounting density table 528 shown in FIG. 72, and evaluated based on grading method as shown at "No. 2" of FIG. 37. In addition, contents of the number of wiring layers vs. mounting density table 528 are set appropriately depending on a system to be designed, business places or the like.

Next, the evaluation of (iii) the number of through holes and via holes is described. In the case of double-sided wiring or multilayer wiring, it is often the case that even though the wiring of only one side can be accomplished without any problems, there are difficulties in the interconnections between the two sides or between the layers. A good design has fewer connection holes, low impedance and low noise. It is necessary to always seek for a pattern design in which excessive through holes and via holes have been eliminated. From such a point of view, as to value of "the number of via holes and the number of through holes" per unit area shown in FIG. 84 is K, and the number of holes H of a target board, the K and H are evaluated based on a comparison shown at "No. 3" of FIG. 37.

In addition, the through hole refers to a hole that is pierced through all the layers, while the via hole refers to a hole that is pierced through one layer.

Figure 41:
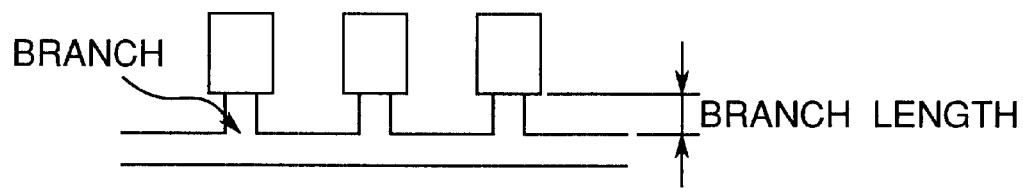
FIG. 41 is a view showing branches in the evaluation of board design and pattern design.

The evaluation of the above (iv) the number of pattern branches and branch length is described. The routing of pattern wiring is basically done by a one-stroke drawing method, that is, by a pattern without branches, and such branches as shown in FIG. 41 should be avoided as much as possible because the wiring length is lengthened, some extra wiring space is required, and besides the resistance value is increased. Except for necessities in terms of circuit characteristics such as impedance matching as well as special problems in terms of manufacture, attempts to reduce the branches are necessary. In addition, in this embodiment, this evaluation is applied to only single lines that are easy to evaluate with.

It is noted here that, with respect to a branch portion diverged from a main stream of the wiring as shown in FIG. 41, the term "branch length" refers to a length from a branching position to a terminating position of the branch portion.

From the point of view as described above, the number of branches and the branch length are given points, respectively, as shown at "No. 4" of FIG. 37, and evaluated based on a total point of those.

The evaluation of (v) component projecting area and pattern portion area occupying in the circuit board is described. A technique of placing components and patterns in a limited board area largely affects the workmanship of design. That is, an idea that "a large product may involve a large board" would result in wastefully increased size of the board. Accordingly, it is necessary to always seek for a design that makes effective use of the board space by eliminating wasteful spaces. From such a point of view, the evaluation is performed as shown at "No. 5" of FIG. 38 based on a calculation result by the following equation:

"component projecting area+pattern portion area occupying in the circuit board" (%)=100×(component projecting area+pattern portion area)/(board area×the number of surface wiring layers)

where the "component projecting area" refers to the sum of projecting areas of all the components to the board, i.e., the sum of areas of outlines of the components, while the "pattern portion area" refers to the sum of actual areas extending along the overall length of pattern etched part.

In addition, the above (component projecting area+pattern portion area) does not include any overlapping portion. Also, the number of surface wiring layers is assumed to be 1 for one-sided wiring, 2 for double-sided wiring and 2 for multilayer wiring.

The evaluation of (vi) degree of dispersion of component placement is described. The workmanship of board design and pattern design depends ultimately on how orderly components are placed on the board. From such a point of view, this embodiment is based on an assumption that, with regions defined in a matrix form at a fixed size over the whole board surface, when electronic components are mounted in nearly equal numbers in each of the regions, it can be judged that the electronic components are placed orderly over the whole board surface, hence a good design. Thus, in this embodiment, with a region mean dimension "Mmid." defined relative to a mean mounting density "Nave." of the electronic components in the region, the evaluation is performed as shown at "No. 6" of FIG. 38 based on a calculation result by the following equation. It is noted that the size of the region is assumed to be $g_1 \times A$ in length and $g_2 \times B$ in width, where the minimum component dimension is A-sized in length and B-sized in width. The above $g_1$ and $g_2$ are coefficients, this embodiment adopts values of $g_1=10$ and $g_2=20$:

"Degree of dispersion of component placement" (%)=(the number of *Mmid.*)/*M*.

where M denotes the number of regions in all, and Mmid. is a value of not less than $k_1 \times$Nave. and not more than $k_2 \times$Nave. These $k_1$ and $k_2$ are coefficients, this embodiment adopts values of $k_1=0.5$ and $k_2=1.5$. Also, Nave. shows a value of (1/M)×total number of components.

Figure 39:
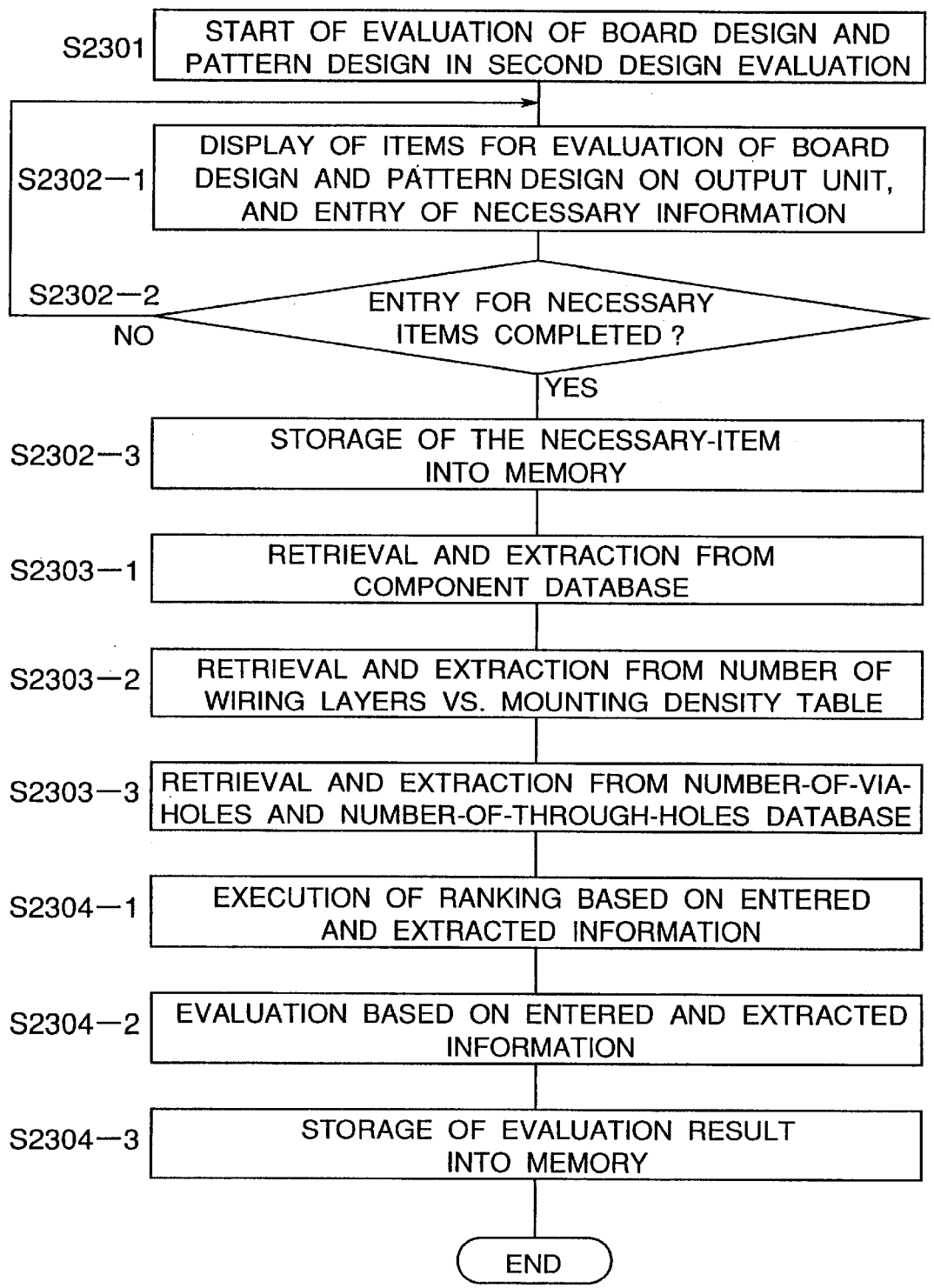
FIG. 39 is a flow chart for a process of executing the evaluation of board design and pattern design.

The evaluation of (3) board design and pattern design like this is executed at steps 2301 to 2304 shown in FIG. 9. At the step 2301, the evaluation of board design and pattern design is started. At the step 2302, the evaluation executing unit 101 displays onto the output unit 401 at least one question for the evaluation of board design and pattern design according to the second design evaluation program 124, and responsive to this, the evaluator enters information from the input unit 301 to the evaluating apparatus 1001. It is noted that the step 2302 comprises steps 2302-1 to 2302-3 as shown in FIG. 39.

The above questions have been stored as the second-design-evaluation question information 128, and the information for each of the (i) to (vi) evaluations has been stored as the second evaluation information 126, respectively, in the internal memory 111 of the evaluation executing unit 101. Also, in this embodiment, the concrete questions for the evaluation of board design and pattern design are, as shown in an item "board design and pattern design" of FIG. 40, total wiring length, the number of pattern branches, pattern branch length, the number of through holes and via holes, electronic-component projecting area, and pattern projecting area.

At the step 2302-1, at least one question is displayed on the output unit 401, where the evaluator enters numerical values one by one in a form of answering the question(s). At the step 2302-2, it is decided whether or not the above numerical values have been entered for all the questions necessary for the evaluation of board design and pattern design. At the step 2302-3, the entered numerical values are stored in the internal memory 111.

In addition, as described above, the information as to the number of pattern branches and the like to be entered at the step 2302-1 may also be automatically supplied from the board-design and pattern-design CAD 861. With such a constitution of automatic supply, the operations at the steps 2302-1 and 2302-2 are no longer necessary.

The step 2303 comprises steps 2303-1 to 2303-3 as shown in FIG. 39. In these steps, also, according to the second design evaluation program 124, the evaluation executing unit 101 performs the reading of the electric circuit information via the retrieval unit 601, and the retrieval and extraction of information necessary for the (i) to (vi) evaluations from the standard database 511. It is noted that the steps 2303-1 to 2303-3 are not limitative in the order of execution.

At the step 2303-1, "body outer dimensions" information shown in FIG. 55 is extracted with respect to the selected electronic components from the component database 521. At the step 2303-2, the number of wiring layers vs. mounting density table 528 is read out. At the step 2303-3, information that depends on the "number of wiring layers" information and the "circuit block" information is extracted from the number-of-via-hole and number-of-through-hole database 534 shown in FIG. 84.

Next, the step 2304 comprises steps 2304-1 to 2304-3 as shown in FIG. 39, where the evaluation of board design and pattern design as well as the storage of evaluation results are executed based on the information entered and extracted at the steps 2302 and 2303. At the step 2304-1, the following operation is executed. That is, according to the second design evaluation program 124, the evaluation executing unit 101 reads out the second evaluation information 126, as well as information as to score information and grading method shown in FIGS. 37 and 38 and contained in the target-board-design information and target-pattern-design information 125, stored in the internal memory 111. In the information as to score information and grading method, "graded ranks" equivalent to the score information are defined in correspondence to the "evaluation methods" of the (i) to (vi) evaluations. In addition, in this embodiment, information equivalent to the "evaluation method" and "graded rank" is contained in the second evaluation information 126, and information equivalent to the "score" is contained in the target-board-design information and target-pattern-design information 125. Accordingly, the evaluation executing unit 101 determines a graded rank for each evaluation based on the information entered and extracted at the steps 2302 and 2303. Then, at the step 2304-2, the evaluation executing unit 101 evaluates any differences between numerical values associated with the present design obtained responsive to the graded ranks, and the above score information.

At the step 2304-3, evaluation results are stored in the storage unit 701.

With respect to each of the (i) to (vi) evaluations, operations associated with the step 2304-1 and the step 2304-2 are explained concretely. In addition, the (i) to (vi) evaluations may be started with any one of them without limitations on the order in which the evaluations are carried out.

First, the evaluation of (i) total wiring length is described. For executing this evaluation, the evaluation executing unit 101 performs the following operation at the step 2304-1. In the first place, a calculation equation for calculating the "L" as well as a "K" value previously set in correspondence to the power-system circuit and the logic-system circuit are extracted from the second evaluation information 126. In the calculation equation for the L value, the "total wiring length" information is given by the total wiring length information entered at the step 2302, and the "number of components" information is given by the information as to the number of components contained in the electric circuit information read at the step 1003. Also, the circuit type is determined by the circuit-type information entered by the evaluator as the initial input information, by which the "K" value is determined. Further, based on the K value and the determined L value, the evaluation executing unit 101 determines the graded rank of I to IV for "total wiring length" of FIG. 37 as to the circuit of the present design. Then, at the succeeding step 2304-2, the evaluation executing unit 101 determines the score information of the circuit according to the present design based on the determined graded rank.

In addition, an example of evaluation results is shown at No. 1 of FIG. 42.

Next, the evaluation of (ii) the number of wiring layers is described. For executing this evaluation, the evaluation executing unit 101 performs the following operation at step 2304-1. First, "mounting density" and "number of wiring layers" in the number of wiring layers vs. mounting density table 528 extracted at the step 2303-2 are determined. In this case, the mounting density is a value determined by (the number of electronic components)/(circuit board size), where the number of electronic components is a value extracted from the electric circuit information and where the circuit board size and the number of wiring layers are obtained from the information entered at the step 1102 or the step 2102. Information as to the number of wiring layers and the component mounting density of the circuit according to the present design is determined in this way, and by using these pieces of information, the "graded rank" out of I to IV for "number of wiring layers" shown in FIG. 37 is determined based on the number of wiring layers vs. mounting density table 528. Then, at the succeeding step 2304-2, the evaluation executing unit 101 determines the score information of the circuit according to the present design based on the determined graded rank.

In addition, an example of evaluation results is shown at No. 2 of FIG. 42.

Next, the evaluation of (iii) the number of through holes and via holes is described. For executing this evaluation, the evaluation executing unit 101 performs the following operation at step 2304-1. First, information as to "number of wiring layers" and "circuit block" in the number-of-via-hole and number-of-through-hole database 534 extracted at the step 2303-3 is determined. In this case, the number-of-wiring-layers information is obtained from the information entered at the step 1102 or the step 2102, and the circuit-block information corresponds to the "circuit type" information of the initial information entered by the evaluator at the step 1002. Information as to the number of wiring layers and the circuit block of the circuit according to the present design is determined in this way, and the values of "K" and "H" are determined. In this case, the value of "K" is a total value of the information as to the number of via holes and the number of through holes contained in the number-of-via-hole and number-of-through-hole database 534 shown in FIG. 84, and the value of "H" is a total value of the number of 0.5 mm dia. holes and the number of 0.7 mm dia. holes entered at the step 1102 or the step 2102. By using the information of the determined "K" and "H", the "graded rank" out of I to IV for "number of via holes and through holes" shown in FIG. 37 is determined based on the number-of-via-hole and number-of-through-hole database 534. Then, at the succeeding step 2304-2, the evaluation executing unit 101 determines the score information of the circuit according to the present design based on the determined graded rank.

In addition, an example of evaluation results is shown at No. 3 of FIG. 42.

Next, the evaluation of (iv) the number of pattern branches and branch length is described. For executing this evaluation, the evaluation executing unit 101 performs the following operation at step 2304-1. That is, based on the "number of pattern branches" information and the "pattern branch length" information entered by the evaluator at the step 2302, points are given according to the information as to the number of branches and the branch length of the circuit of the present design as described in "evaluation method" in "number of pattern branches and branch length" shown in FIG. 37, and then by the resulting total point, the "graded rank" out of I to IV for "number of pattern branches and branch length" shown in FIG. 37 is determined. Then, at the succeeding step 2304-2, the evaluation executing unit 101 determines the score information of the circuit according to the present design based on the determined graded rank.

In addition, an example of evaluation results is shown at No. 4 of FIG. 42.

Next, the evaluation of (v) component projecting area and pattern portion area occupying in the circuit board is described. For executing this evaluation, the evaluation executing unit 101 performs the following operation at the step 2304-1. First, the calculation equation for calculating the ratio at which the component projecting area and pattern portion area occupies in the circuit board is extracted from the second evaluation information 126. In this calculation equation, information as to each of the "component projecting area" and the "pattern projecting area" is given by the component projecting area information and the pattern projecting area information entered by the evaluator at the step 2302, and information as to each of the "board area" and the "number of surface wiring layers" is given by the board outer size information and the number of wiring layers extracted from the board pattern information supplied at the steps 1102, 2102 or the step 2303. By substituting these pieces of information into the calculation equation, the ratio at which the component projecting area and pattern portion area occupies in the circuit board with respect to the circuit of the present design is calculated. Then, based on this calculation result, the "graded rank" out of I to IV for the "component projecting area+pattern portion area occupying in the circuit board" shown in FIG. 38 is determined.

Then, at the succeeding step 2304-2, the evaluation executing unit 101 determines the score information of the circuit according to the present design based on the determined graded rank.

In addition, an example of evaluation results is shown at No. 5 of FIG. 42.

Next, the evaluation of (vi) degree of dispersion of component placement is described. For executing this evaluation, at the step 2304-1, the evaluation executing unit 101 performs the following operation based on the aforementioned evaluation method for the degree of dispersion of component placement contained in the second evaluation information 126. First, dimensions for determining the region are determined based on the minimum component size, and the number of electronic components contained in the region is counted. Next, the mean number of regions, Mmid., is determined. Then, the ratio of the value of M, which is the number of regions, to the value of Mmid., i.e., the degree of dispersion of electronic-component placement in the circuit of the present design is calculated.

In this case, for the electronic components of the circuit according to the present design, i.e., as the minimum component size of the selected electronic components, a minimum value is selected based on the "body outer dimensions" in the component database 521 extracted at the step 2303-1. Based on the selected minimum component size, the dimensions of the region are determined. For example, if the minimum component size is A×B, then the size of the region is set to 10A×20B in this embodiment. Accordingly, based on information as to component coordinate positions of the selected electronic components on the circuit board contained in the board pattern information read at the step 2303, the number of electronic components to be placed within one aforementioned region having the aforementioned size is counted. Further, based on the circuit board size information contained in the board pattern information, the M value, which is the total number of the regions having the size in the circuit board is determined, and the mean number of components per the one region, Nave., is determined based on the resulting M value and the N value, which is information as to the quantity of use of electronic components in the circuit of the present design contained in the electric circuit information. Further, as shown in the item of "evaluation method" for the "degree of dispersion of component placement" in FIG. 38, based on the resulting Nave., the value of Mmid. is determined as a range of ±50% around the Nave. Then, the number of regions such that the number of electronic components contained in the one region having the size falls within the range of Mmid. is counted. Then, the counted value is divided by the M value, by which the degree of dispersion in the circuit of the present design is determined. Further, based on this calculation result, the "graded rank" out of I to IV for the "degree of dispersion of component placement" shown in FIG. 38 is determined. In addition, the numerical values of "0.7", "0.5" or the like for determining the graded rank are values set for this embodiment, and not limited to this.

For example, if the M value, which is the total number of regions, is 9, and if the value of the Nave. is 3.2, then the value of the Mmid. results in 1.6 to 4.8. Besides, if the number of regions such that the number of electronic components contained in the one region falls with the range of Mmid. has been determined to be 3 based on each the number of electronic components contained in the individual regions, then the degree of dispersion results in 3/9. Thus, depending on which graded rank out of I to IV the value of 3/9 falls upon, the graded rank is determined, where in this case, because (3/9)=0.33, the graded rank results in rank III.

Then, at the succeeding step 2304-2, the evaluation executing unit 101 determines the score information of the circuit according to the present design based on the determined graded rank.

In addition, an example of evaluation results is shown at No. 6 of FIG. 42.

In this way, scores for the (i) to (vi) items in the (3) evaluation of board design and pattern design are calculated, respectively, as shown in the total field of FIG. 38.

Also, by executing the (3) evaluation of board design and pattern design as described above, the workmanship of board design and pattern design can be evaluated, allowing an improvement in circuit characteristics, a reduction in the circuit board size and a reduction in cost to be realized. Further, even with unskillfulness in circuit design, problematic points of board design and pattern design can be easily discovered.

Figure 46:
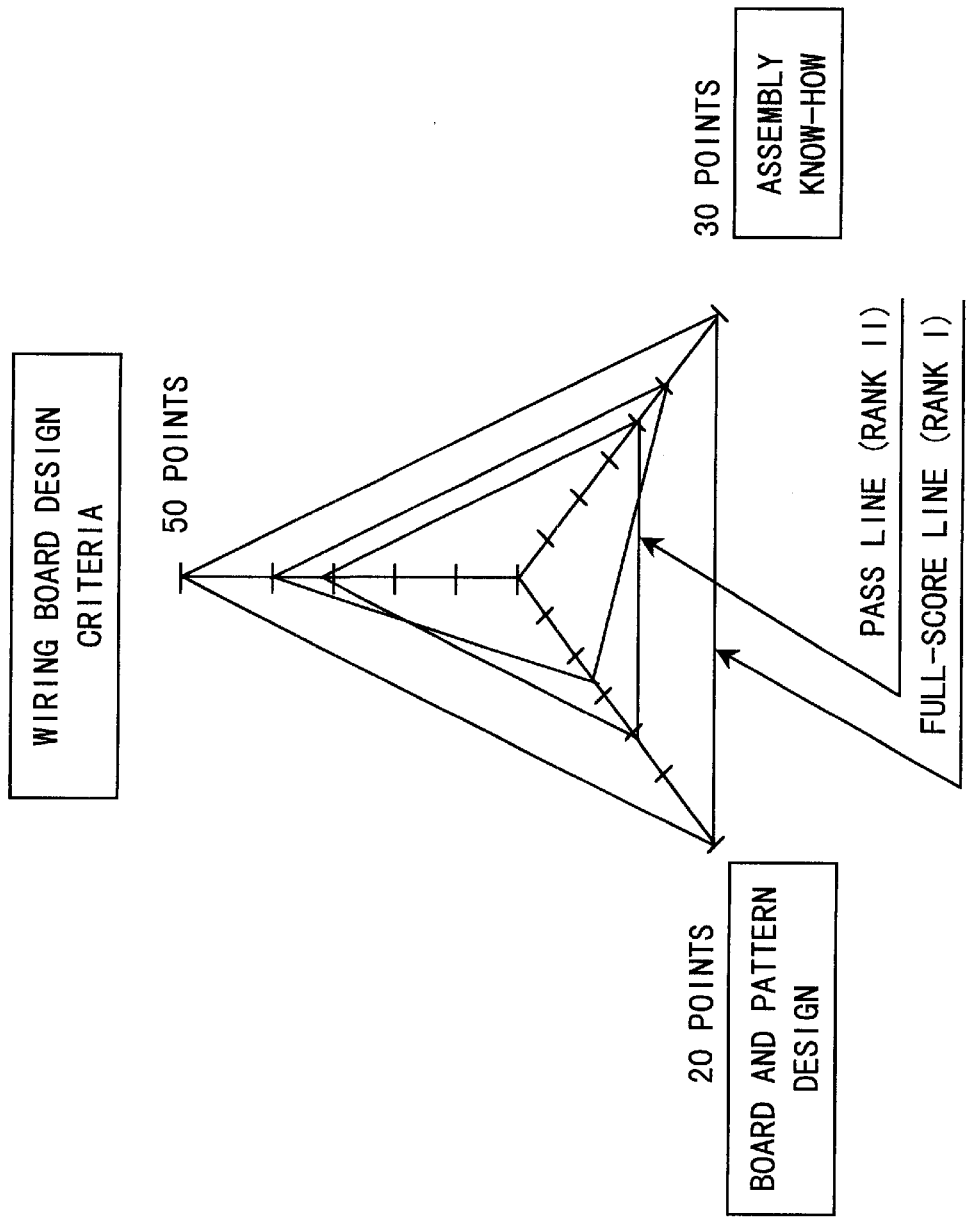
FIG. 46 is a view graphically showing results of the second design evaluation.

With respect to the (II) evaluation of board design and pattern design as viewed from the assembly process side in the second design evaluation as described above, at step 3002 shown in FIG. 9, the evaluation executing unit 101 totals the scores of the individual items in the second design evaluation according to such a score distribution as shown in FIG. 34, and performs a grading as shown in FIG. 45. It is noted that the score shown in FIG. 45 is by way of example. Also, the evaluation executing unit 101 prepares a graph as shown in FIG. 46, and outputs the graph via the output unit 401.

By executing the second design evaluation as described above, problems that would occur due to the board design and pattern design during the production of a circuit board can be extracted and, besides solved, prior to the engineering-trial manufacture of the circuit board. Accordingly, it becomes possible to eliminate the need of redesign of the circuit board after the engineering-trial manufacture, and therefore to reduce the development lead time and reduce the redesign cost. Thus, an improvement in circuit board quality as well as a reduction in cost in the production can be realized.

Figure 48:
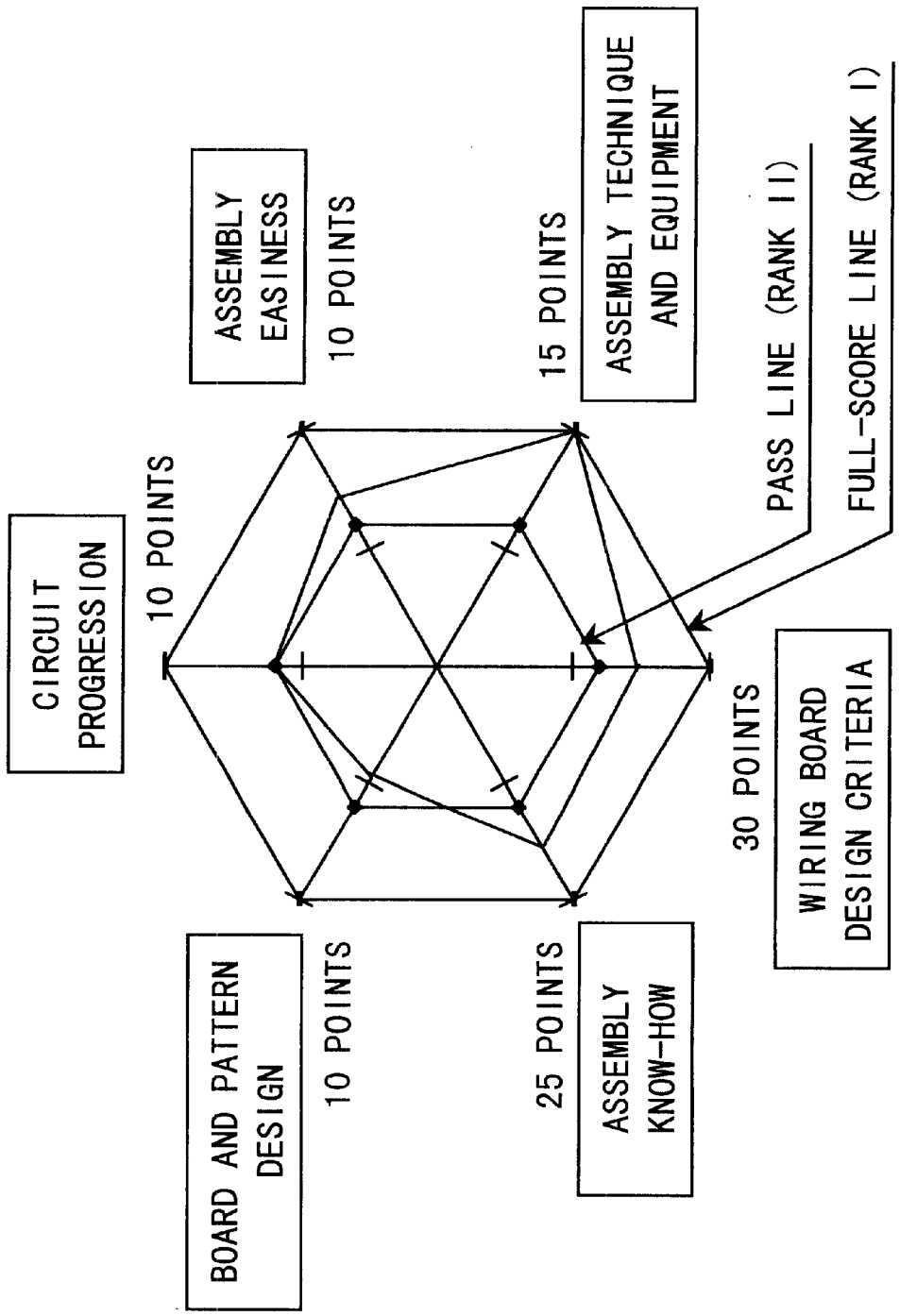
FIG. 48 is a view graphically showing results of totaling the first design evaluation and the second design evaluation.
Figure 50:
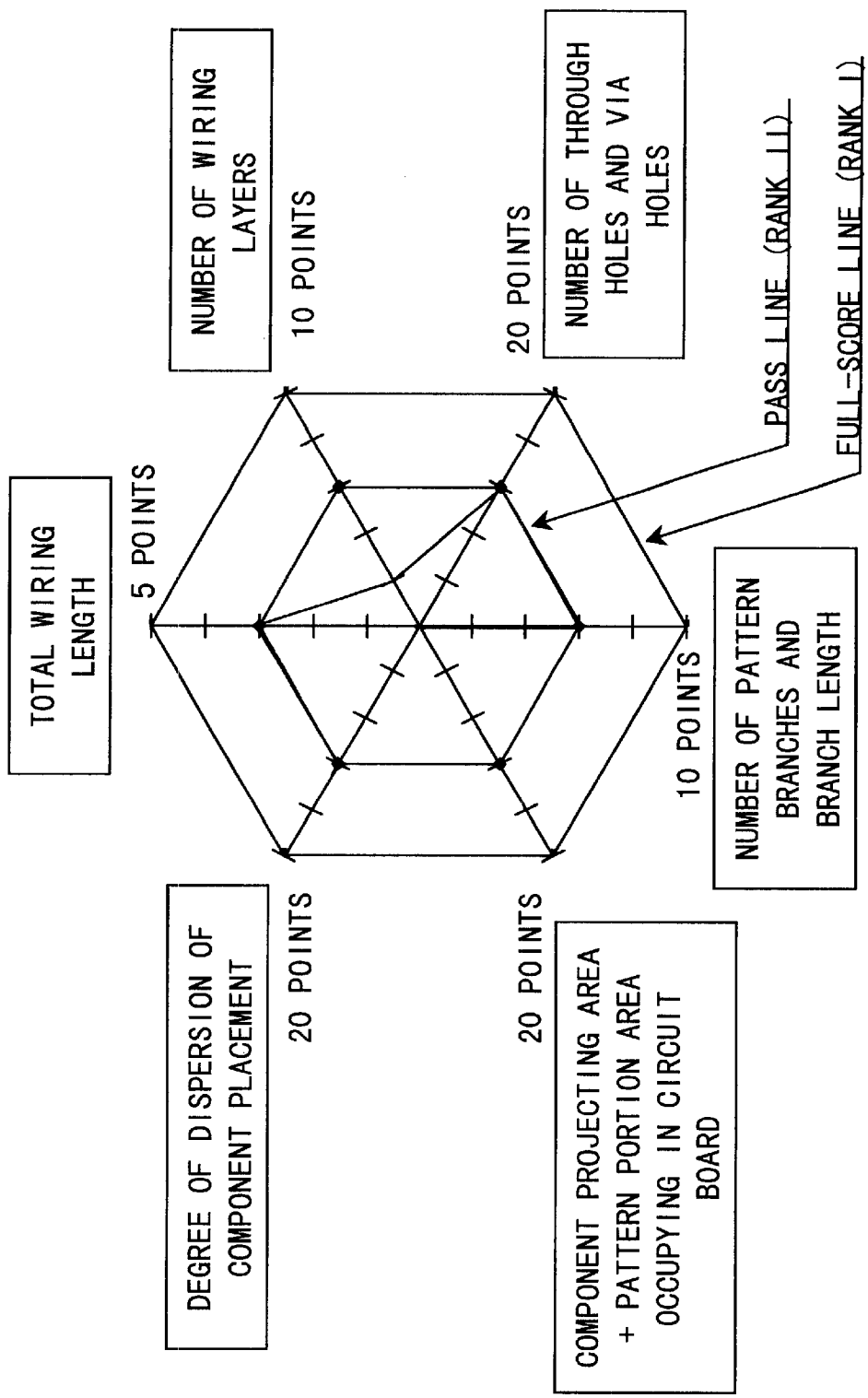
FIG. 50 is a view graphically showing results of the evaluation of board design and pattern design.

Further, after the completion of both the first design evaluation and the second design evaluation, at step 3003 shown in FIG. 8, the evaluation executing unit 101 performs a grading as shown in FIG. 47 by comprehensively evaluating all the major items in the first design evaluation and the second design evaluation. Also, the evaluation executing unit 101 prepares a graph as shown in FIG. 48 and outputs the graph via the output unit 401.

As described above, according to the circuit-board-assembly assist evaluating method of this embodiment as well as the circuit-board-assembly assist evaluating apparatus for executing the evaluation method, the following effects can be achieved by executing the circuit-board-assembly assist design evaluating method. In the first place, the evaluator, for example, the circuit designer is enabled to evaluate his or her own design by himself or herself. Further, because the evaluation of the circuit design is enabled before the engineering-trial manufacture of a circuit board, for example, at the time point when the circuit design-and-electronic components selection has been completed, problematic points in assembly cost and assembly process can be grasped before the engineering-trial manufacture of the circuit board. In particular, as in this embodiment described above, by executing the first design evaluation upon the completion of the circuit board design and the electronic-components selection, it becomes possible to execute, for example, the calculation of assembly cost, which has conventionally been impossible at this time point, so that the present design can be reviewed before the board design and pattern design, which in turn allows the reduction in development lead time and the like to be achieved.

Also, in the execution of the second design evaluation, because information or the like entered for the execution of the first design evaluation is used, it becomes possible to relieve the labor of information entry and reduce the input time. Besides, by taking, for example, an old model of the company's own as the comparison target against the designed circuit, it becomes possible to relatively compare between the presently designed circuit and the old model in terms of the workmanship of design, circuit progression and the like.

Further, because the evaluation is performed about the know-how items, the design criteria, assembly process and the like, the designer is enabled to recognize the so-called know-how items and the like of the shop floor, which has conventionally been difficult for the designer to know, so that problems in assemblability can be discussed on a scale common to the three divisions of the circuit design, the production technology and the assembly. Therefore, since the design is carried out with considerations given even to, for example, matters related to assembly know-how at the stage of design, the assembly of electronic-component-mounted-circuit boards can be made easier to achieve than it has conventionally.

Based on these effects, the following specific effects can be achieved. That is, the design development lead time can be reduced. The number of times of trial manufacture as well as the time for trial manufacture can be reduced. Losses due to changes in product model can be reduced. The degree of completion of design can be improved and the market and factory qualities can be improved. Also, since it can be easily confirmed whether or not the present circuit design complies with the design criteria specification, board quality can be checked. Also, it can be easily confirmed whether or not assembly know-how items have been incorporated into the present circuit design, so that the assembly know-how items can be fed back to the circuit design earlier. By checking for the design criteria specification as well as checking for the assembly know-how items, it becomes possible to reduce losses in the assembly shop floor, and to improve productivity and respondability. Also, the assembly easiness can be checked. Also, the assembly structure as well as the flow of assembly process in the shop floor can be simplified. Besides, at the stage when the circuit design and components selection has been completed, or when the board design and pattern design has been completed, the assembly cost can be calculated so that the assembly cost can be controlled in advance prior to the engineering-trial manufacture.

Furthermore, according to the recording medium on which evaluation assist programs for executing the circuit-board-assembly assist design evaluating method by computer are recorded, by equipping, for example, a portable personal computer with the recording medium and by loading the programs onto the computer, the evaluation of circuit board assemblability can be executed at any place, anytime, and by a plurality of computers.

Furthermore, among the above-described evaluations, in the case where the contents of evaluation are classified into ranks, values serving as the criteria for the ranking, for example, values of "not more than 85%" of the rank I or "more than 85% and not more than 95%" of the rank II as shown at No. 1 of FIG. 14 are not fixed values and may be set appropriately depending on the circumstances. Therefore, it is also possible to set different values among individual design divisions, or to make the values varied according to the design level of the evaluator, for example, the designer.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A design evaluating method for assisting circuit-board-assembly for a design and assembly operation which includes designing a circuit for a desired function, designing a pattern on a circuit board to form the circuit, and then performing engineering-trial manufacture of a component-mounted-circuit board by mounting components on the circuit board, the method comprising:

performing a first design evaluation or a second design evaluation with considerations given to both sides of design and assembly processes, the design process side where the circuit design and the pattern design are involved and the assembly process side where electronic components are mounted onto the circuit board before the engineering-trial manufacture of the component-mounted-circuit, wherein the first design evaluation with respect to the circuit design and electronic components selection evaluates differences between an actually performed circuit design and a target circuit design, and differences between components selection and target components selection, wherein, in the first design evaluation, the target circuit design and the target components selection being targeted for quality improvement in an assembly operation in the assembly process of mounting the electronic components onto the circuit board, and wherein the second design evaluation with respect to design of the circuit board and the pattern design of the circuit board, evaluates differences between an actually performed circuit board design and a target board design, and differences between a pattern design and a target pattern design, and wherein, in the second design evaluation, the target board design and the target pattern design are targeted for the quality improvement in the assembly operation.

2. The design evaluating method for assisting circuit-board-assembly according to claim 1, wherein the first design evaluation is executed at the stage prior to the engineering-trial manufacture of the component-mounted-circuit board, after a stage of the circuit design-and-electronic components selection and before a stage of the circuit board design-and-board pattern design.

3. The design evaluating method for assisting circuit-board-assembly according to claim 1, wherein the second design evaluation is executed at the stage prior to the engineering-trial manufacture of the component-mounted-circuit board, after a stage of the circuit board design-and-board pattern design.

4. The design evaluating method for assisting circuit-board-assembly according to claim 1, wherein the first design evaluation evaluates, with use of selected-electronic-component information as to selected electronic components selected by the circuit design, any difference between the target circuit design and the actually performed circuit design as well as any difference between the target components selection and the actually performed components selection.

5. The design evaluating method for assisting circuit-board-assembly according to claim 1, wherein the first design evaluation comprises at least calculating assembly cost for the assembly operation and, with respect to evaluation of the circuit design and the electronic components selection as well as evaluation of the circuit design and the electronic components selection as viewed from the assembly process side where the electronic components are mounted onto the circuit board, evaluating any difference between the target circuit design and the actually performed circuit design as well as any difference between the target components selection and the actually performed components selection.

6. The design evaluating method for assisting circuit-board-assembly according to claim 5, wherein the. evaluation of the circuit design and the electronic components selection comprises evaluation as to whether the circuit design-and-electronic components selection of a circuit to be designed has progressed with respect to a comparison target.

7. The design evaluating method for assisting circuit-board-assembly according to claim 6, wherein the evaluation of the circuit design and the electronic components selection further comprises at least evaluation of compliance with design criteria for quality improvement with respect to the circuit design-and-electronic components selection, and evaluation of compliance with know-how items in the assembly process for the quality improvement with respect to the circuit design-and-electronic components selection.

8. The design evaluating method for assisting circuit-board-assembly according to claim 7, wherein the evaluation of progression is evaluation for individual items of the number of electronic components provided in a circuit on which the circuit design-and-electronic components selection have been performed, the number of capacitors provided in the circuit, power consumption of the circuit, and commonization/sharing of a circuit block which is a unit that fulfills specified function in the circuit, the evaluation of the progression being achieved by numerically evaluating any difference between each score information set for the individual items in the target circuit design and the target electronic components selection, and each score information on the individual items calculated in the actually performed circuit design-and-electronic components selection.

9. The design evaluating method for assisting circuit-board-assembly according to claim 8, wherein according to a rule that performances equal to or higher than performances targeted in the circuit be achieved with a minimum number of components, the evaluation of the number of electronic components is achieved by numerically evaluating the difference between each set score information and each score information calculated, which in turn is achieved by calculating, with respect to a comparison-target circuit block, the score information based on a calculation result of the following expression:

(the number of components designed in the actually performed circuit design-and-electronic components selection in the circuit block)/(the number of components in the comparison-target circuit block), wherein the actually designed number of components is derived from the selected-electronic-component information, and the comparison-target number of components is supplied through a response to a previously set question corresponding to the rule that performances equivalent to or higher than the targeted performances are achieved with the minimum number of components.

10. The design evaluating method for assisting circuit-board-assembly according to claim 8, wherein according to a rule that a capacitor on a circuit that is fundamentally unnecessary be deleted, the evaluation of the number of capacitors is achieved by numerically evaluating the difference, which in turn is achieved by calculating the score information based on a calculation result of the following expression:

(the number of actually deleted capacitors)/(the number of fundamentally unnecessary capacitors)), wherein the number of deleted capacitors and the number of fundamentally unnecessary capacitors are supplied through responses to previously set questions corresponding to a rule that a fundamentally unnecessary capacitor be deleted.

11. The design evaluating method for assisting circuit-board-assembly according to claim 8, wherein according to a rule that power consumption be reduced, the evaluation of the power consumption is achieved by numerically evaluating the difference, which in turn is achieved by calculating, with respect to the circuit block to be evaluated for the power consumption, the score information based on a calculation result of the following expression:

(calculated value of power consumption after design)/(actual value of power consumption in the comparison-target circuit), wherein the calculated value of the power consumption and the actual value of the power consumption are supplied through responses to previously set questions corresponding to the rule that the power consumption be reduced.

12. The design evaluating method for assisting circuit-board-assembly according to claim 10, wherein while circuits to be commonized and shared in each functional unit within the circuit are set as a block and constituent electronic components within the circuit block are determined, the evaluation of commonization and sharing of the circuit block is achieved by numerically evaluating the difference, which in turn is achieved by calculating the score information based on a calculation result of the following expression:

(the number of components in the block)/(total number of components)

wherein the number of components in the commonized/shared section and the total number of components are determined from the selected-electronic-component information.

13. The design evaluating method for assisting circuit-board-assembly according to claim 8, wherein the evaluation of compliance with the design criteria is achieved by numerically evaluating the difference based on a result obtained by calculating a ratio of the number of items having resulted in noncompliance with the design criteria, to the number of items to be evaluated listed as the design criteria, wherein the number of items having resulted in noncompliance with the design criteria is counted based on a response to a preset question corresponding to content of the item of the design criteria with respect to the circuit of the present design.

14. The design evaluating method for assisting circuit-board-assembly according to claim 13, wherein the evaluation of compliance with the design criteria comprises ranking according to the ratio of the number of items having resulted in noncompliance with the design criteria, and modifying necessity or unnecessity of redesign as well as degree of redesign with respect to the present circuit design and the electronic components selection according to the determined rank.

15. The design evaluating method for assisting circuit-board-assembly according to claim 8, wherein the evaluation of compliance with the know-how items in the assembly process is achieved by numerically evaluating the difference, which in turn is achieved by calculating the score information based on a result obtained by calculating a ratio of the number of items having resulted in noncompliance, to the number of items to be evaluated listed as the know-how items in the assembly process, wherein the number of items having resulted in noncompliance with the know-how items is counted based on a response to a preset question corresponding to content of an item of the know-how items with respect to the circuit of the present design.

16. The design evaluating method for assisting circuit-board-assembly according to claim 15, wherein the evaluation of compliance with the know-how items comprises ranking according to the ratio of the number of items having resulted in noncompliance with the know-how items, and modifying necessity or unnecessity of redesign as well as degree of the redesign with respect to the present circuit design and the electronic components selection according to the determined rank.

17. The design evaluating method for assisting circuit-board-assembly according to claim 5, wherein the evaluation of the circuit design and the components selection as viewed from the assembly process side comprises at least either one of evaluating assembly easiness without taking into consideration assembly technique and equipment possessed by an assembly shop floor where the electronic components are mounted onto the circuit board, or comparing goodness of fit of circuit structure or assembly process of the circuit of the present design to the standard structure or standard process after preparing an easy-to-assemble standard structure or standard process from the assembly technique and equipment that can be possessed by the assembly shop floor.

18. The design evaluating method for assisting circuit-board-assembly according to claim 17, wherein the evaluation of the assembly easiness is evaluation of at least one among the number of electronic-component mounting surfaces of the circuit board, the number of electronic-component solder-bonding surfaces in the circuit board, type of soldering technique, the number of electronic-component types, style of packing of electronic components supplied so as to be mounted onto the circuit board, similarity in outer dimensions of electronic components, and electronic-component mounting technique, and wherein the evaluation evaluates any difference between score information calculated in the actually performed circuit design and electronic components selection, and score information set in the target circuit design and the target electronic components selection.

19. The design evaluating method for assisting circuit-board-assembly according to claim 18, wherein the evaluation of the number of electronic-component mounting surfaces of the circuit board is achieved by numerical evaluation performed based on information as to whether the electronic-component mounting onto the circuit board is done on a one-side surface or double-side surfaces of the circuit board, the information being supplied through a response to a previously set question based on the assembly easiness with respect to the circuit of the present design, as well as based on the score information set in the target circuit design and the target electronic components selection.

20. The design evaluating method for assisting circuit-board-assembly according to claim 18, wherein the evaluation of the number of electronic-component solder-bonding surfaces in the circuit board is achieved by numerical evaluation performed based on score information obtained with use of information as to whether the electronic-component mounting is done on a one-side surface or double-side surfaces of the circuit board, as well as based on score information set in the target circuit design and the target electronic components selection.

21. The design evaluating method for assisting circuit-board-assembly according to claim 18, wherein according to a rule that the smaller the number of soldering techniques used, the larger the contribution to quality improvement in assembly and reduction in assembly cost results, the evaluation of the type of soldering technique is achieved by numerical evaluation performed based on score information determined according to types of soldering techniques used for the selected electronic components, as well as based on score information set in the target circuit design and the target electronic components selection.

22. The design evaluating method for assisting circuit-board-assembly according to claim 18, wherein according to a rule that the smaller the number of component types, the larger the contribution to reduction in man-hours results, the evaluation of the number of electronic-component types is achieved by numerical evaluation performed based on score information calculated according to a value resulting from dividing the number of component types of the selected electronic components by the number of component types of a comparison-target circuit, as well as based on score information set in the target circuit design and electronic components selection, wherein the number of component types of the selected electronic components and the number of component types of the comparison-target circuit are supplied through responses to previously set questions based on the assembly easiness with respect to the circuit of the present design.

23. The design evaluating method for assisting circuit-board-assembly according to claim 18, wherein according to a rule that unification of style of packing of electronic components contributes at least to reduction in supply errors in a process of mounting the electronic components onto the circuit board, the evaluation of the style of packing of the electronic components is achieved by numerical evaluation performed based on score information obtained by the number of style-of-packing types of the selected electronic components, as well as based on score information set in the target circuit design and the target electronic components selection.

24. The design evaluating method for assisting circuit-board-assembly according to claim 18, wherein the evaluation of the similarity in outer dimensions of electronic components is achieved by numerical evaluation performed based on score information calculated according to a value resulting from dividing the number of mean-size electronic components by the number of all the electronic components, as well as based on score information set in the target circuit design and the target electronic components selection.

25. The design evaluating method for assisting circuit-board-assembly according to claim 24, wherein the mean-size electronic components are electronic components each of which has a thickness not more than a value resulting from multiplying a first coefficient by a mean thickness obtained based on thicknesses of all the selected electronic components, and which, with respect to a sum value of longitudinal length and lateral width, has a value not more than a value resulting from multiplying a second coefficient by a mean length and width value that is a result of adding together a mean length value obtained based on lengths of all the selected electronic components and a mean width value obtained based on widths of all the selected electronic components.

26. The design evaluating method for assisting circuit-board-assembly according to claim 18, wherein the evaluation of the electronic-component mounting technique is achieved by numerical evaluation performed based on score information calculated according to a value resulting from dividing the number of electronic components that can be automatically machine-mounted onto the board, by the number of all the electronic components, as well as based on score information set in the target circuit design and the target electronic components selection.

27. The design evaluating method for assisting circuit-board-assembly according to claim 17, wherein the evaluation of the goodness of fit to standard structure is achieved by numerical evaluation performed based on a comparison between a standard circuit board structure and a circuit board structure of the designed circuit.

28. The design evaluating method for assisting circuit-board-assembly according to claim 27, wherein the standard circuit board is set from among combinations of the number of wiring layers, mounting methods and soldering techniques of the electronic components onto the circuit board, and circuit types, and wherein the circuit board structure of the present circuit is determined based on information as to the number of wiring layers and the circuit type obtained through responses to questions with respect to the circuit board structure, as well as based on information as to the mounting method and the soldering technique of the electronic components onto the circuit board extracted from the selected-electronic-component information.

29. The design evaluating method for assisting circuit-board-assembly according to claim 17, wherein the evaluation of the goodness of fit to the standard process is achieved by numerical evaluation performed based on a comparison between the standard process and the assembly process of the designed circuit.

30. The design evaluating method for assisting circuit-board-assembly according to claim 29, wherein the standard process is set based on information as to assembly line equipment and the circuit type and information as to production quantity, and wherein the assembly process of the present circuit is determined based on information as to whether mounting equipment is usable for mounting of the electronic components onto the circuit board, information as to type of the mounting equipment to be used for the individual electronic components when the mounting equipment is usable, storage capacity of the electronic components for the mounting equipment, and circuit board structure of the designed circuit.

31. The design evaluating method for assisting circuit-board-assembly according to claim 5, wherein the calculation of assembly cost is achieved by totaling at least a direct materials cost and a labor cost in the assembly process, wherein the direct materials cost is calculated based on unit-price information and number-of articles information as to the selected electronic components and the circuit board as well as based on presumed information supplied by an evaluator's presumption for calculating the assembly cost at the stage of the circuit design and electronic components selection, and wherein the labor cost is calculated based on component-mounting cost information relating to the selected-electronic-component information, as well as based on machining/assembly/setup cost information which is cost information as to the electronic components and circuit board extracted by using the selected-electronic-component information and which is obtained according to the presumed information for calculating the labor cost at the stage of the circuit design and electronic components selection.

32. The design evaluating method for assisting circuit-board-assembly according to claim 1, wherein the second design evaluation comprises evaluating any difference between the target board design and the actually performed circuit board design as well as any difference between the target pattern design and the actually performed pattern design by using selected-electronic-component information as to selected electronic components selected in the circuit design as well as circuit-board and pattern information as to design of the circuit board and pattern design of the circuit board in the circuit of the present design.

33. The design evaluating method for assisting circuit-board-assembly according to claim 32, wherein the second design evaluation comprises at least calculating assembly cost of the circuit and, with respect to evaluation of pattern design as viewed from the assembly process side where the electronic components are mounted onto the circuit board, evaluating any difference between the actually performed board design and pattern design, and the target board design and the target pattern design.

34. The design evaluating method for assisting circuit-board-assembly according to claim 33, wherein the evaluation of the board design and pattern design comprises at least evaluation of the circuit board design and the pattern design, evaluation of compliance with design criteria for quality improvement with respect to the circuit board design and the pattern design, and evaluation of compliance with know-how items in the assembly process of mounting the electronic components onto the circuit board provided for quality improvement with respect to the circuit board design and the pattern design.

35. The design evaluating method for assisting circuit-board-assembly according to claim 34, wherein the evaluation of the circuit board design and pattern design is evaluation of, at least, total wiring length formed by the pattern design, the number of wiring layers of the circuit board, the number of through holes and via holes of the circuit board, the number of pattern branches and branch length in wiring formed by the pattern design, sum value of electronic-component projecting area and pattern portion area occupying in the circuit board, and degree of dispersion of electronic-component placement, and wherein the evaluation is achieved by numerically evaluating any difference between score information calculated on the actually performed circuit board design-and-pattern design, and score information set in the target circuit board design and the target pattern design.

36. The design evaluating method for assisting circuit-board-assembly according to claim 35, wherein the evaluation of the total wiring length is achieved by comparing L and K with each other, where L=(total wiring length formed by the pattern design)/(the number of electronic components in the circuit board design) and a previously set K value, which is equal to the L value of a standard circuit, and wherein the total wiring length in the L value is determined from a response to a question with respect to the circuit board design and the pattern design or from the circuit board and pattern information, and wherein the number of electronic components is counted based on the selected-electronic-component information.

37. The design evaluating method for assisting circuit-board-assembly according to claim 35, wherein the evaluation of the number of wiring layers is achieved by numerical evaluation performed based on score information obtained according to a relationship between the number of wiring layers and electronic-component mounting density as well as based on score information set in the target circuit board design and the target pattern design, wherein the number of wiring layers is determined from a response to a question with respect to the circuit board design and the pattern design or from the circuit board and pattern information, and wherein the electronic-component mounting density is determined by dividing the number of electronic components of the circuit of the present design by an area of the circuit board.

38. The design evaluating method for assisting circuit-board-assembly according to claim 35, wherein the evaluation of the number of through holes and via holes is achieved by numerical evaluation performed based on score information obtained according to a value of the number of through holes and via holes per unit area of the circuit board, score information obtained according to the number of holes in the circuit board of the present design, and score information set in the target circuit board design and the target pattern design.

39. The design evaluating method for assisting circuit-board-assembly according to claim 35, wherein the evaluation of the number of pattern branches and branch length is achieved by numerical evaluation performed based on score information obtained according to the number of branches and the branch length entered according to responses to questions with respect to the circuit board design and the pattern design or to the circuit board and pattern information, as well as based on score information set in the target circuit board design and the target pattern design.

40. The design evaluating method for assisting circuit-board-assembly according to claim 35, wherein the evaluation of the sum value of electronic-component projecting area and pattern portion area is achieved by numerical evaluation performed based on score information set in the target circuit board design and the target pattern design as well as based on score information obtained according to a calculation result of the following expression:

(the electronic-component projecting area+the pattern portion area)/(board area×the number of surface wiring layers).

41. The design evaluating method for assisting circuit-board-assembly according to claim 35, wherein the evaluation of the degree of dispersion of electronic-component placement is achieved by numerical evaluation performed based on score information set in the target circuit board design and the target pattern design, as well as based on score information obtained according to a calculation result of the following expression:

(the number of Mmid.)/$M$ wherein M is the number of fixed-size regions resulting from dividing the whole circuit-board surface, wherein Mmid. is a value which is not less than k1×Nave. and not more than k2×Nave., wherein Nave.=(1/M)×total number of electronic components, and wherein the size of the region is g1×A in length and g2×B in width, where k1, k2, g1 and g2 are coefficients, when the minimum size of electronic components on the board is in length A and in width B.

42. A design evaluating method for assisting circuit-board-assembly for a design and assembly operation which includes designing a circuit for a desired function, designing a pattern on a circuit board to form the circuit, and then performing engineering-trial manufacture of a component-mounted-circuit board mounting components on the circuit board, the method comprising:

performing a first design evaluation and a second design evaluation with considerations given to both sides of design and assembly processes prior to the engineering-trial manufacture of the component-mounted-circuit board, the design process side where the circuit design and the pattern design are involved and the assembly process side where electronic components are mounted onto the circuit board, wherein the first design evaluation with respect to the circuit design and electronic components selection, evaluates differences between an actually performed circuit design and a target circuit design, and differences between components selection and target components selection, the target circuit design and the target components selection being targeted for quality improvement in an assembly operation in the assembly process of mounting the electronic components onto the circuit board, and wherein the second design evaluation with respect to design of the circuit board and the pattern design of the circuit board, evaluates differences between an actually performed circuit board design and a target board design, and differences between a pattern design and a target pattern design, and wherein in the second design evaluation, the target board design and the target pattern design are targeted the quality improvement in the assembly operation.

43. The design evaluating method for assisting circuit-board-assembly according to claim 42, wherein the second design evaluation is executed by using information as to circuit board specifications and information as to the number of component-mounting surfaces used in the first design evaluation.

44. A computer-readable recording medium having recorded thereon programs for making the computer execute design evaluating processing for assisting circuit-board-assembly for a design and assembly operation which processing includes designing a circuit for a desired function, designing a pattern on a circuit board to form the circuit, and then performing engineering-trial manufacture of a component-mounted-circuit board by mounting components on the circuit board, recording design evaluation processing programs for assisting circuit-board-assembly before the engineering-trial manufacture of the component-mounted-circuit board, wherein the programs include instructions for making the computer execute a first design evaluation process or a second design evaluation process with considerations given to both sides of design and assembly, the design side where the circuit design and the pattern design are involved and the assembly side where electronic components are mounted onto the circuit board, wherein the first design evaluation process with respect to the circuit design and electronic components selection evaluates differences between an actually performed circuit design and a target circuit design, and between components selection and target components selection, wherein the target circuit design and the target components selection are targeted for quality improvement in an assembly operation, in the assembly process, of mounting the electronic components onto the circuit board, and wherein the second design evaluation process with respect to design of the circuit board and a pattern design of the circuit board evaluates differences between an actually performed circuit board design and a target board design, and between a pattern design and a target pattern design.

45. The computer-readable recording medium according to claim 44, wherein the first design evaluation program includes instructions for making the computer execute, at least, a process of calculating assembly cost for the assembly operation and a process of, with respect to evaluation of the circuit design and the electronic components selection as well as evaluation of the circuit design and the electronic components selection as viewed from the assembly process side where the electronic components are mounted onto the circuit board, evaluating any difference between the target circuit design and the actually performed circuit design as well as any difference between the target components selection and the actually performed components selection.

46. The computer-readable recording medium according to claim 45, wherein the evaluation of the circuit design and the electronic components selection comprises evaluation as to whether the circuit design and electronic components selection of a circuit to be designed has progressed with respect to a comparison target.

47. The computer-readable recording medium according to claim 46, wherein the evaluation of the circuit design and the electronic components selection further comprises at least evaluation of compliance with design criteria for quality improvement with respect to the circuit design and electronic components selection, and evaluation of compliance with know-how items in the assembly process for the quality improvement with respect to the circuit design and electronic components selection.

48. A design evaluating apparatus for assisting circuit-board-assembly, the apparatus for executing design evaluation for assisting circuit-board-assembly for a design and assembly operation which includes designing a circuit for a desired function, designing a pattern on a circuit board to form the circuit, and then performing engineering-trial manufacture of a component-mounted-circuit board by mounting components on the circuit board, the apparatus comprising:

a reading unit for reading a computer-readable recording medium having recorded thereon programs for making the computer execute design evaluating processing for assisting circuit-board-assembly for a design and assembly operation which processing includes designing a circuit for a desired function, designing a pattern on a circuit board to form the circuit, and then performing engineering-trial manufacture of a component-mounted-circuit board by mounting components on the circuit board and recording design evaluation processing programs for assisting circuit-board-assembly before the engineering-trial manufacture of the component-mounted-circuit board; and an evaluation executing unit for executing a first design evaluation or a second design evaluation with considerations given to both sides of design and assembly processes, the design process side where the circuit design and the pattern design are involved and the assembly process side where electronic components are mounted onto the circuit board, based on the read program before the engineering-trial manufacture of the component-mounted-circuit board, wherein the programs include instructions for making the computer execute a first design evaluation process or a second design evaluation process with considerations given to both sides of design and assembly, the design side where the circuit design and the pattern design are involved and the assembly side where electronic components are mounted onto the circuit board, wherein the first design evaluation process with respect to the circuit design and electronic components selection evaluates differences between an actually performed circuit design and a target circuit design, and between components selection and target components selection, wherein the target circuit design and the target components selection are targeted for quality improvement in an assembly operation, in the assembly process, of mounting the electronic components onto the circuit board, and wherein the second design evaluation process with respect to design of the circuit board and a pattern design of the circuit board evaluates differences between an actually performed circuit board design and a target board design, and between a pattern design and a target pattern design.

49. A design evaluating apparatus for assisting circuit-board-assembly, the apparatus executing design evaluation for assisting circuit-board-assembly for a design and assembly operation which includes designing a circuit for a desired function, designing a pattern on a circuit board to form the circuit, and then performing engineering-trial manufacture of a component-mounted-circuit board by mounting components on the circuit board, the apparatus comprising:

an evaluation executing unit for executing a first design evaluation and a second design evaluation with considerations given to both sides of design and assembly processes, the design process side where the circuit design and the pattern design are involved and the assembly process side where electronic components are mounted onto the circuit board before the engineering-trial manufacture of the component-mounted-circuit board, wherein the first design evaluation with respect to the circuit design and electronic components selection, evaluates differences between an actually performed circuit design and a target circuit design, and between components selection and target components selection, wherein the target circuit design and the target components selection are targeted for quality improvement in the assembly operation, in the assembly process, of mounting the electronic components onto the circuit board, and wherein the second design evaluation with respect to design of the circuit board and pattern design of the circuit board evaluates differences between an actually performed circuit board design and a target board design, and between a pattern design and a target pattern design.

50. The design evaluating apparatus for assisting circuit-board-assembly according to claim 49, wherein the first design evaluation comprises at least calculating assembly cost for the assembly operation and, with respect to an evaluation of the circuit design and the electronic components selection as well as an evaluation of the circuit design and the electronic components selection as viewed from an assembly process side where the electronic components are mounted onto the circuit board, evaluating any difference between the target. circuit design and the actually performed circuit design as well as any difference between the target components selection and the actually performed components selection.

51. The design evaluating apparatus for assisting circuit-board-assembly according to claim 50, wherein the evaluation of the circuit design and the electronic components selection comprises an evaluation as to whether the circuit design and electronic components selection of a circuit to be designed has progressed with respect to a comparison target.

52. The design evaluating apparatus for assisting circuit-board-assembly according to claim 51, wherein the evaluation of the circuit design and the electronic components selection further comprises at least an evaluation of compliance with design criteria for quality improvement with respect to the circuit design and electronic components selection, and an evaluation of compliance with know-how items in the assembly process for the quality improvement with respect to the circuit design and electronic components selection.

* * * * *